(12) United States Patent
Mohan

(10) Patent No.: US 12,299,360 B2
(45) Date of Patent: May 13, 2025

(54) TWO-LEVEL PARALLELIZTION OF GOODNESS-OF-FIT TESTS FOR SPATIAL PROCESS MODELS

(71) Applicant: SAS Institute Inc., Cary, NC (US)

(72) Inventor: Pradeep Mohan, Cary, NC (US)

(73) Assignee: SAS Institute Inc., Cary, NC (US)

( * ) Notice: Subject to any disclaimer, the term of this patent is extended or adjusted under 35 U.S.C. 154(b) by 673 days.

(21) Appl. No.: 17/535,745

(22) Filed: Nov. 26, 2021

(65) Prior Publication Data

US 2022/0083709 A1 Mar. 17, 2022
US 2022/0414288 A9 Dec. 29, 2022

Related U.S. Application Data

(60) Provisional application No. 63/118,188, filed on Nov. 25, 2020, provisional application No. 62/128,834, filed on Dec. 21, 2020.

(51) Int. Cl.
*G06F 30/20* (2020.01)
*G06F 9/50* (2006.01)
*G06Q 10/04* (2012.01)

(52) U.S. Cl.
CPC ............ *G06F 30/20* (2020.01); *G06F 9/5005* (2013.01); *G06Q 10/04* (2013.01)

(58) Field of Classification Search
None
See application file for complete search history.

(56) References Cited

U.S. PATENT DOCUMENTS

2016/0003792 A1* 1/2016 Owens ................... G01N 33/24
702/5

OTHER PUBLICATIONS

Mohan et al., "Analyzing Spatial Point Patterns Using the New SPP Procedure", 2015, SAS Institute, pp. 1-20. (Year: 2015).*
Guan, "A goodness-of-fit test for inhomogeneous spatial Poisson processes", 2008, Biometrika, pp. 831-845. (Year: 2008).*
Mohan, Pradeep., "Nested 2-Level Parallel Blocking based Goodness of Fit tests for Spatial Process of Models on SMP Architectures" Presentation—SAS dated Nov. 25, 2020, 9 pages.

* cited by examiner

*Primary Examiner* — Qing Yuan Wu
(74) *Attorney, Agent, or Firm* — KDW FIRM PLLC

(57) ABSTRACT

An apparatus includes processor(s) to: receive a request to test goodness-of-fit of a spatial process model; generate a KD tree from observed spatial point dataset including locations within a region at which instances of an event occurred; derive, from the observed spatial point dataset, multiple quadrats into which the region is divided; receive, from multiple processors, current levels of availability of processing resources including quantities of currently available execution threads; select, based on the quantity of currently available execution threads, a subset of the multiple processors to perform multiple iterations of a portion of the test in parallel; provide, to each processor of the subset, the KD tree, the spatial process model, and the multiple quadrats; receive, from each processor of the subset, per-quadrat data portions indicative of results of an iteration; derive a goodness-of-fit statistic from the per-quadrat data portions; and transmit an indication of goodness-of-fit to another device.

30 Claims, 27 Drawing Sheets

TWO-LEVEL PARALLELIZTION OF GOODNESS-OF-FIT TESTS FOR SPATIAL PROCESS MODELS

CROSS-REFERENCE TO RELATED APPLICATION

This application claims the benefit of priority under 35 U.S.C. § 119(e) to U.S. Provisional Application Ser. No. 63/118,188 filed Nov. 25, 2020, and to U.S. Provisional Application Ser. No. 63/128,834 filed Dec. 21, 2020, both of which are incorporated herein by reference in their respective entireties for all purposes.

BACKGROUND

It has become increasingly commonplace to use spatial process models as a tool to analyze and/or make effective use of spatial point data that describes numerous instances of a particular type of event that have occurred throughout a particular defined region. Such spatial point data often represents a correlation between one or more particular conditions that may facilitate the occurrence of a particular type of event, and locations at which the particular condition(s) may have been present such that instances of the particular type of event occurred. As part of analyzing such spatial point data to identify such particular condition(s), to identify aspects of how or why such particular condition(s) lead to instances of the particular type of event, and/or to identify aspects of how or why such particular condition(s) occur, attempts may be made to fit one or more spatial process models to the spatial point data. Thus, there may be a need to analyze the goodness-of-fit of such spatial process model(s) to such spatial point data to confirm whether each such spatial process model fits well enough to be relied upon for performing such analyses. Unfortunately, such goodness-of-fit tests may entail the generation of large amounts of simulated spatial point data, and/or entail the use of such large amounts of data in analytical operations that consume considerable processing resources, such as nearest neighbor processing operations.

As will be familiar to those skilled in the art, a spatial point dataset includes coordinates (or other type of descriptor) of locations at which instances of a particular type of event have been observed as having occurred. A spatial point dataset may also include covariate values associated with each of such locations. For each such location, such covariate values may describe aspect(s) of the location, and/or aspect(s) of the instance of the particular type of event that occurred there. Thus, the spatial point data may describe a spatial point pattern that has been observed. This observed spatial point pattern may be regarded as a single realization of the spatial point process that caused those observed instances of the particular type of event to occur at those locations.

A spatial point dataset usually includes data specifying locations and covariate values of instances of a particular type of event that have been observed to have occurred within a particular defined region. Such a region may be of any arbitrary shape and size. Where it is known that the spatial point process occurs both within and outside of such a region, then the spatial point pattern may be regarded as a sampled point pattern. However, where it is known that the spatial point process occurs entirely within such a region (or at least is not known to occur outside such a region), then the spatial point pattern may be regarded as a fully mapped point pattern.

Among the analyses that may be performed on a spatial point dataset may be derivation of first-order properties. Among the first-order properties may be the first-order intensity or mean of the spatial point pattern described by the spatial point dataset. This may be regarded as the quantity of instances of the particular type of event that have occurred per unit of area or volume. It should be noted that region that the spatial point dataset is defined as covering may be divided into multiple equal-sized subsets, and the equal size of those multiple subsets may be used to define the unit of area or volume. The spatial point process that gives rise to the spatial point pattern described by the spatial point dataset may be deemed homogeneous if the first-order intensity is observed to be the same across all of such multiple subsets. However, where the first-order intensity varies among those subsets, the spatial point process may be deemed inhomogeneous.

Also among the analyses that may be performed on a spatial point dataset may be derivation of second-order properties. The second-order properties may account for dependencies between locations, such as second-order conditional intensity in which intensity at one location may be dependent on intensity at another location.

Such analyses of a spatial point dataset may include the fitting of a spatial process model in a manner that accounts for such first-order properties and/or such second-order properties. However, the ability to fit such a model is necessarily limited to the data provided in the spatial point dataset, thereby necessitating the use of goodness-of-fit tests in which numerous simulated spatial point datasets must be generated, each of which may include numerous simulated locations at which simulated instances of the particular type of event occurs.

Further aspects of spatial point datasets and spatial process models are presented in "Analyzing Spatial Point Patterns Using the New SPP Procedure", Pradeep Mohan and Randy Tobias (2015), Paper SAS1332-2015, SAS Institute, Cary, N.C., USA, which is incorporated herein by reference in its entirety for all purposes.

SUMMARY

This summary is not intended to identify only key or essential features of the described subject matter, nor is it intended to be used in isolation to determine the scope of the described subject matter. The subject matter should be understood by reference to appropriate portions of the entire specification of this patent, any or all drawings, and each claim.

An apparatus includes at least one processor and a storage to store instructions that, when executed by the at least one processor, cause the at least one processor to perform operations including: receive, from a requesting device and via a network, a request to perform a test of goodness-of-fit of a spatial process model to an observed spatial point dataset; and retrieve, from at least one data source device, the observed spatial point dataset and a specification of the spatial process model, wherein, the observed spatial point dataset comprises indications of locations within a region at which instances of an event were observed to have occurred, and corresponding covariate values for each location, and the spatial process model is fitted to the observed spatial point dataset to serve as a model of a spatial point process that generated the observed spatial point dataset. The at least one processor is also caused to: generate, from at least the observed spatial point dataset, a KD tree wherein each node of the KD tree comprises one of the indications of a location at which an instance of the event was observed to have occurred and the corresponding covariate values; derive, from at least the observed spatial point dataset, multiple quadrats into which the region is divided; receive, from multiple processors, indications of current levels of availability of processing resources comprising a quantity of currently available execution threads for each processor of the multiple processors; and select, based on at least the quantity of currently available execution threads for each processor of the multiple processors, a subset of the multiple processors to perform multiple iterations of a portion of the test in parallel, wherein each iteration includes generating a simulated spatial point dataset of multiple simulated spatial point datasets, and using the simulated spatial point dataset with the KD tree in multiple performances of nearest neighbor processing across multiple execution threads of a single processor of the subset. The at least one processor is further caused to: provide, to each processor of the subset, the KD tree, the specification of the spatial process model, and an indication of the multiple quadrats to enable each processor of the subset to perform at least one iteration; receive, from each processor of the subset, per-quadrat data portions indicative of results of the performance of at least a single iteration; combine the per-quadrat data portions received from each processor of the subset to derive at least one goodness-of-fit statistic indicative of a level of goodness-of-fit of the spatial process model to the observed spatial point dataset; and transmit an indication of the level of goodness-of-fit to the requesting device.

A computer-program product tangibly embodied in a non-transitory machine-readable storage medium includes instructions operable to cause at least one processor to perform operations including: receive, from a requesting device and via a network, a request to perform a test of goodness-of-fit of a spatial process model to an observed spatial point dataset; and retrieve, from at least one data source device, the observed spatial point dataset and a specification of the spatial process model, wherein, the observed spatial point dataset comprises indications of locations within a region at which instances of an event were observed to have occurred, and corresponding covariate values for each location, and the spatial process model is fitted to the observed spatial point dataset to serve as a model of a spatial point process that generated the observed spatial point dataset. The at least one processor is also caused to: generate, from at least the observed spatial point dataset, a KD tree wherein each node of the KD tree comprises one of the indications of a location at which an instance of the event was observed to have occurred and the corresponding covariate values; derive, from at least the observed spatial point dataset, multiple quadrats into which the region is divided; receive, from multiple processors, indications of current levels of availability of processing resources comprising a quantity of currently available execution threads for each processor of the multiple processors; and select, based on at least the quantity of currently available execution threads for each processor of the multiple processors, a subset of the multiple processors to perform multiple iterations of a portion of the test in parallel, wherein each iteration includes generating a simulated spatial point dataset of multiple simulated spatial point datasets, and using the simulated spatial point dataset with the KD tree in multiple performances of nearest neighbor processing across multiple execution threads of a single processor of the subset. The at least one processor is further caused to: provide, to each processor of the subset, the KD tree, the specification of the spatial process model, and an indication of the multiple quadrats to enable each processor of the subset to perform at least one iteration; receive, from each processor of the subset, per-quadrat data portions indicative of results of the performance of at least a single iteration; combine the per-quadrat data portions received from each processor of the subset to derive at least one goodness-of-fit statistic indicative of a level of goodness-of-fit of the spatial process model to the observed spatial point dataset; and transmit an indication of the level of goodness-of-fit to the requesting device.

Each processor of the subset may be caused to perform operations of an iteration that include: generate, from at least the KD tree and specification of the spatial process model, one of the simulated spatial point datasets of the multiple simulated spatial point datasets, wherein the one of the simulated spatial point datasets comprises indications of simulated locations within the region at which simulated instances of the event occurred, and corresponding simulated covariate values for each simulated location; generate multiple copies of the KD tree; provide a separate copy of the multiple copies of the KD tree to each available execution thread of the processor to prevent competition for access to the KD tree among the available execution threads of the processor; and on each available execution thread of the processor, and in parallel with others of the available execution threads of the processor, perform nearest neighbor processing between a simulated location of the one of the simulated spatial point datasets and the indications of locations of the separate copy of the KD tree provided to the available execution thread.

Each processor of the subset may be caused to generate the per-quadrat data portions indicative of the results of the performance of at least a single iteration.

Each processor of the subset may be caused to retain at least one of the KD tree, the specification of the spatial process model or the indication of multiple quadrats to enable the processor to perform a next iteration without again receiving the at least one of the KD tree, the specification of the spatial process model or the indication of multiple quadrats.

Separate storage space may be allocated to each available execution thread of the processor to separately store each one of the separate copies of the KD tree that is provided to each available execution thread; and each of the separate copies of the KD tree may be retained in the corresponding storage space allocated to one of the available execution threads of the processor to enable use of each of the available execution threads of the processor to perform nearest neighbor processing operations of the next iteration without again being provided with a copy of the KD tree.

The selection of the subset may include prioritizing selecting processors of the multiple processors having a higher quantity of currently available execution threads.

The indications of current levels of availability of processing resources may further include an indication of an amount of separate storage space available to be allocated to each available execution thread for each processor of the multiple processors; and the selection of the subset may be further based on the amount of separate storage space available to be allocated to each available execution thread for each processor of the multiple processors.

The indications of current levels of availability of processing resources may further include at least one of an indication of what instruction set is supported by each processor of the multiple processors, or an indication of what version of an instruction set is supported by each processor of the multiple processors. The at least one processor may be caused, for each processor of the subset, to perform operations including: select a version of a routine that is executable to cause performance of an iteration of the multiple iterations based on at least one of the indication of what instruction set is supported by the processor or an indication of what version of an instruction set is supported by the processor; and provide the processor with the selected version of the routine.

Each processor of the subset may include multiple cores; the reception of a quantity of currently available execution threads for each processor of the multiple processors may include receiving a quantity of currently available execution threads for each core of each processor of the multiple processors; and the selection of the subset to perform the multiple iterations may include a selection of at least one core of the multiple cores of each processor of the subset, wherein each selected core of each processor of the subset is caused to perform a separate iteration in which the multiple performances of nearest neighbor processing for an iteration is performed across the multiple execution threads of a single selected core.

At least one of the observed spatial point dataset or the specification of the spatial process model may include a specification of the region; the specification of the region may include at least one of a specification of a dimension of the region, a specification of a shape of the region, a specification of a location of the region, or a specification of a boundary of the region; and the derivation of the multiple quadrats may be partially based on the specification of the region.

A computer-implemented method includes: receiving, by at least one processor of a processing system, and from a requesting device and via a network, a request to perform a test of goodness-of-fit of a spatial process model to an observed spatial point dataset; and retrieving, from at least one data source device, and via the network, the observed spatial point dataset and a specification of the spatial process model, wherein the observed spatial point dataset comprises indications of locations within a region at which instances of an event were observed to have occurred, and corresponding covariate values for each location, and the spatial process model is fitted to the observed spatial point dataset to serve as a model of a spatial point process that generated the observed spatial point dataset. The method also includes: generating, by the at least one processor, and from at least the observed spatial point dataset, a KD tree wherein each node of the KD tree comprises one of the indications of a location at which an instance of the event was observed to have occurred and the corresponding covariate values; deriving, by the at least one processor, and from at least the observed spatial point dataset, multiple quadrats into which the region is divided; receiving, by the at least one processor, and from multiple processors, indications of current levels of availability of processing resources comprising a quantity of currently available execution threads for each processor of the multiple processors; and selecting, by the at least one processor, and based on at least the quantity of currently available execution threads for each processor of the multiple processors, a subset of the multiple processors to perform multiple iterations of a portion of the test in parallel, wherein each iteration includes generating a simulated spatial point dataset of multiple simulated spatial point datasets, and using the simulated spatial point dataset with the KD tree in multiple performances of nearest neighbor processing across multiple execution threads of a single processor of the subset. The method further includes: providing, from the at least one processor, and to each processor of the subset, the KD tree, the specification of the spatial process model, and an indication of the multiple quadrats to enable each processor of the subset to perform at least one iteration; receiving, by the at least one processor, and from each processor of the subset, per-quadrat data portions indicative of results of the performance of at least a single iteration; combining, by the at least one processor, the per-quadrat data portions received from each processor of the subset to derive at least one goodness-of-fit statistic indicative of a level of goodness-of-fit of the spatial process model to the observed spatial point dataset; and transmitting, from the at least one processor, an indication of the level of goodness-of-fit to the requesting device via the network.

The method may include performing, by each processor of the subset, operations of an iteration including: generating, from at least the KD tree and specification of the spatial process model, one of the simulated spatial point datasets of the multiple simulated spatial point datasets, wherein the one of the simulated spatial point datasets comprises indications of simulated locations within the region at which simulated instances of the event occurred, and corresponding simulated covariate values for each simulated location; generating multiple copies of the KD tree; providing a separate copy of the multiple copies of the KD tree to each available execution thread of the processor to prevent competition for access to the KD tree among the available execution threads of the processor; and on each available execution thread of the processor, and in parallel with others of the available execution threads of the processor, performing nearest neighbor processing between a simulated location of the one of the simulated spatial point datasets and the indications of locations of the separate copy of the KD tree provided to the available execution thread.

The method may include generating, by each processor of the subset, the per-quadrat data portions indicative of the results of the performance of at least a single iteration.

The method may include retaining, by each processor of the subset, at least one of the KD tree, the specification of the spatial process model or the indication of multiple quadrats to enable the processor to perform a next iteration without again receiving the at least one of the KD tree, the specification of the spatial process model or the indication of multiple quadrats.

Separate storage space may be allocated to each available execution thread of the processor to separately store each one of the separate copies of the KD tree that is provided to each available execution thread; and each of the separate copies of the KD tree may be retained in the corresponding storage space allocated to one of the available execution threads of the processor to enable use of each of the available execution threads of the processor to perform nearest neighbor processing operations of the next iteration without again being provided with a copy of the KD tree.

The selection of the subset may include prioritizing selecting processors of the multiple processors having a higher quantity of currently available execution threads.

The indications of current levels of availability of processing resources further comprises an indication of an amount of separate storage space available to be allocated to each available execution thread for each processor of the multiple processors; and the selection of the subset may be further based on the amount of separate storage space available to be allocated to each available execution thread for each processor of the multiple processors.

The indications of current levels of availability of processing resources may further include at least one of an indication of what instruction set is supported by each processor of the multiple processors, or an indication of what version of an instruction set is supported by each processor of the multiple processors. The method may include, for each processor of the subset, performing, by the at least one processor, operations including: selecting a version of a routine that is executable to cause performance of an iteration of the multiple iterations based on at least one of the indication of what instruction set is supported by the processor or an indication of what version of an instruction set is supported by the processor; and providing the processor with the selected version of the routine.

Each processor of the subset may include multiple cores; receiving a quantity of currently available execution threads for each processor of the multiple processors may include receiving a quantity of currently available execution threads for each core of each processor of the multiple processors; and selecting the subset to perform the multiple iterations may include selecting at least one core of the multiple cores of each processor of the subset, wherein each selected core of each processor of the subset is caused to perform a separate iteration in which the multiple performances of nearest neighbor processing for an iteration is performed across the multiple execution threads of a single selected core.

At least one of the observed spatial point dataset or the specification of the spatial process model may include a specification of the region; the specification of the region may include at least one of a specification of a dimension of the region, a specification of a shape of the region, a specification of a location of the region, or a specification of a boundary of the region; and the derivation of the multiple quadrats may be partially based on the specification of the region.

The foregoing, together with other features and embodiments, will become more apparent upon referring to the following specification, claims, and accompanying drawings.

BRIEF DESCRIPTION OF THE DRAWINGS

The present disclosure is described in conjunction with the appended figures.

DETAILED DESCRIPTION

Figure 1:
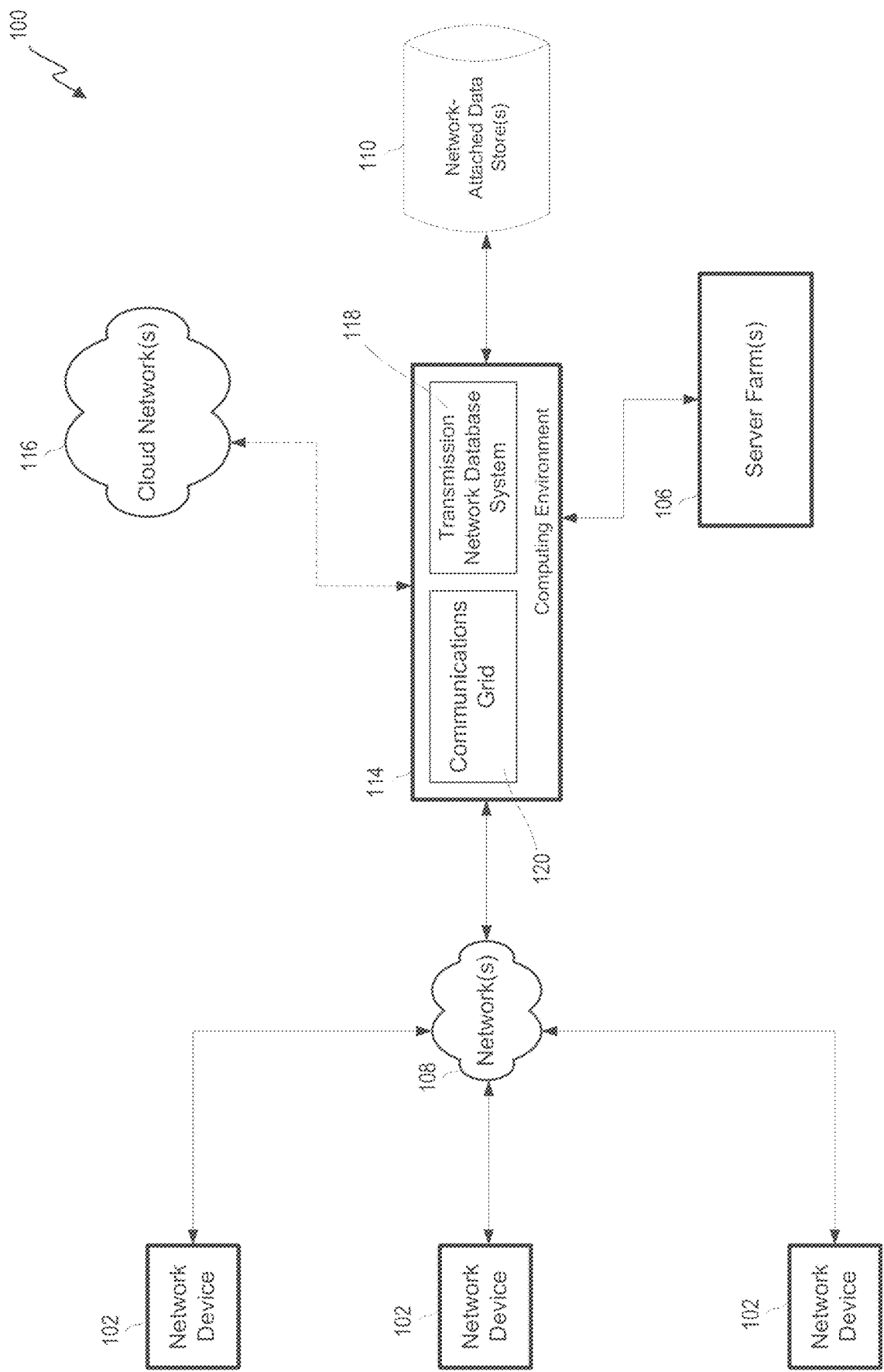
FIG. 1 illustrates a block diagram that provides an illustration of the hardware components of a computing system, according to some embodiments of the present technology.

Various embodiments are generally directed to techniques for performing computationally intensive portions of a goodness-of-fit test for a spatial process model in a manner that employs nested parallelization across multiple processors. More specifically, the goodness-of-fit test may entail multiple iterations of a combination of using the model to generate a simulated spatial point dataset and using that generated simulated dataset to partially test the goodness-of-fit of the model. Within each of these iterations, there may be numerous performances of nearest neighbor processing operations. As part of the nested parallelization, the multiple iterations of both generating and using a simulated spatial point dataset may be distributed among the multiple processors. Also as part of the nested parallelization, for each such iteration, the numerous performances of nearest neighbor processing operations may be distributed among multiple execution threads of the processor to which that iteration has been assigned. As each of the multiple iterations are completed, per-quadrat values may be collected and stored. At the conclusion of the multiple iterations, those stored values may be combined and used to derive residual values from which a determination may be made as to whether the fitted spatial process model has a level of goodness-of-fit that is sufficient to meet a predetermined threshold level of goodness-of-fit.

At an earlier time, a spatial process model may be fitted to an observed spatial point dataset that includes observation data specifying locations within a defined region at which instances of a particular event were observed to have occurred. The observation data of the observed spatial point dataset may also include, for each of the specified locations within the defined region, corresponding covariate values that specify observed aspects of the location and/or observed aspects of the occurrence of the event at the location.

In preparation for the performance of the goodness-of-fit test by the multiple processors, the observation data of the observed spatial point dataset may be re-organized to form a single KD tree, if the observation data is not already so organized. Alternatively or additionally, in preparation for the performance of the goodness-of-fit test by the multiple processors, the observation data of the observed spatial point dataset may be analyzed to derive multiple quadrats into which the defined region may be divided, if such quadrats are not already so defined. As will be familiar to those skilled in the art, the derivation of such quadrats may be based on the relative density of locations throughout the defined region and/or the covariate values associated with each of the locations (it may be deemed desirable to derive equal-sized regions having equal quantities of locations, if possible). Following such generation of the KD tree (if needed) and/or such derivation of quadrats (if needed), copies of the KD tree, a specification of the spatial process model, and/or a specification of the quadrats may be distributed among the multiple processors.

Each one of the multiple iterations of both using the fitted spatial process model to generate a simulated spatial point dataset and using that generated data set to partially test the goodness of fit of the model may be performed entirely by one of the multiple processors. Also, these performances of these multiple iterations may be distributed among the multiple processors in a manner that causes parallel performances thereof using any of a variety of distribution techniques until a predetermined quantity of iterations has been performed. The distribution of separate copies of the KD tree, the specification of the spatial process model, and/or the specification of the quadrats may be done to prevent instances of competition among the multiple processors to access these pieces of information (e.g., the serialization of access to these pieces of information via memory address locking, etc.).

At the start of each iteration performed by one of the processors, the copy of the spatial process model provided to that processor is used generate a simulated spatial point dataset that is to be used for that iteration, and then discarded. There are no dependencies in simulated data between iterations. Thus, a separate simulated spatial point dataset is generated for each iteration entirely independently of the simulated spatial point datasets generated for the other iterations, and is not shared or otherwise exchanged with any of the other iterations, thereby minimizing communications among the multiple processors. Each simulated spatial point dataset includes simulated data that specifies a simulated location for a simulated instance of occurrence of the particular event, and that specifies corresponding simulated covariates.

During each iteration, for each simulated location indicated in the simulated spatial point dataset generated for that iteration, there may be a separate performance (out of numerous performances) of nearest neighbor processing operations to identify a nearest neighbor among the locations indicated among the observation data within the KD tree. In so doing, the processor that performs that iteration may distribute the numerous performances of nearest neighbor processing operations among multiple ones of its execution threads in a manner that causes parallel performances thereof using any of a variety of distribution techniques until such nearest neighbor processing operations have been performed for all of the simulated locations. In preparation for such parallel performances of nearest neighbor processing operations, a separate copy of the KD tree may be distributed to each of the multiple execution threads to prevent instances of competition among the multiple execution threads to access the KD tree.

Also during each iteration, and following the numerous performances of nearest neighbor processing operations for each simulated location of the simulated spatial point dataset generated for that iteration, interpolation of covariates may be performed between each of the simulated locations and the nearest neighbor location identified in the KD tree. Following such interpolation operations, the copy of the specification of the quadrats provided to the processor performing the iteration may be used to derive per-quadrat counts and/or other per-quadrat values. Toward the end of each iteration, such per-quadrat values may be collected and used to derive goodness-of-fit statistics, Pearson residual values, p-values and/or other residual values. Upon completion of the predetermined quantity of iterations, one or more of such residual values may be compared to one or more predetermined threshold values to determine whether the spatial process model has a threshold level of goodness-of-fit that is deemed to be sufficient.

As will be explained in greater detail, the multiple processors may each incorporate multiple processing cores and/or other hardware-based support for multi-threaded execution. Further, the multiple processors may all be incorporated within a single computing device in some embodiments, while the multiple processors may be distributed among multiple computing devices that may be interconnected by a network in other embodiments. As will be familiar to those skilled in the art, widely available processors may incorporate anywhere from as few as 2 cores to as many as 32 cores, and each such core may support a pair of execution threads. However, other less widely available processors may incorporate as many as 64 to 256 cores, and/or each such core may support 4 or more execution threads, such that a single processor may support hundreds of execution threads. Thus, while it is envisioned that, in some embodiments, each processor may be assigned to perform a single iteration of both generating and using a simulated spatial point dataset at a time, other embodiments are possible in which processors supporting such greater quantities of threads may be assigned to perform more than one of such iterations in parallel.

Regardless of whether the multiple processors are incorporated within a single computing device or are distributed among multiple computing devices, in some embodiments, competition for processing resources for other purposes may cause the availability of different ones of the multiple processors to vary over time such that the quantity of iterations of both generating and using a simulated spatial point dataset that are able to be performed in parallel over time may vary. In one approach to accommodating such dynamically changing processing resource availability, each processor that is already engaged in performing an iteration may independently perform a check of whether the predetermined quantity of iterations has yet been performed toward the end of the iteration that it is currently performing, and may request to be assigned the performance of another iteration if that predetermined quantity has not yet been reached, and/or if it continues to have sufficient resources available to continue supporting multiple threads of performances of nearest neighbor processing operations.

Regardless of the exact mechanism by which each of the multiple processors may be dynamically assigned to perform iterations of both generating and using a simulated spatial point dataset, it may be that each processor is caused to maintain the copies of the KD tree, the specification of the spatial process model and/or the specification of the quadrats that are distributed to it between performances of iterations to at least reduce instances in which copies of such pieces of information must be provided to it, again. Similarly, in some embodiments, it may be that data storage associated with each one of the multiple execution threads supported by each of the multiple processors is caused to maintain a separate copy of the KD tree between performances of nearest neighbor processing operations to at least reduce instances in which copies of the KD tree must be provided to it, again.

With general reference to notations and nomenclature used herein, portions of the detailed description that follows may be presented in terms of program procedures executed by a processor of a machine or of multiple networked machines. These procedural descriptions and representations are used by those skilled in the art to most effectively convey the substance of their work to others skilled in the art. A procedure is here, and generally, conceived to be a self-consistent sequence of operations leading to a desired result. These operations are those requiring physical manipulations of physical quantities. Usually, though not necessarily, these quantities take the form of electrical, magnetic or optical communications capable of being stored, transferred, combined, compared, and otherwise manipulated. It proves convenient at times, principally for reasons of common usage, to refer to what is communicated as bits, values, elements, symbols, characters, terms, numbers, or the like. It should be noted, however, that all of these and similar terms are to be associated with the appropriate physical quantities and are merely convenient labels applied to those quantities.

Further, these manipulations are often referred to in terms, such as adding or comparing, which are commonly associated with mental operations performed by a human operator. However, no such capability of a human operator is necessary, or desirable in most cases, in any of the operations described herein that form part of one or more embodiments. Rather, these operations are machine operations. Useful machines for performing operations of various embodiments include machines selectively activated or configured by a routine stored within that is written in accordance with the teachings herein, and/or include apparatus specially constructed for the required purpose. Various embodiments also relate to apparatus or systems for performing these operations. These apparatus may be specially constructed for the required purpose or may include a general purpose computer. The required structure for a variety of these machines will appear from the description given.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

Systems depicted in some of the figures may be provided in various configurations. In some embodiments, the systems may be configured as a distributed system where one or more components of the system are distributed across one or more networks in a cloud computing system and/or a fog computing system.

FIG. 1 is a block diagram that provides an illustration of the hardware components of a data transmission network 100, according to embodiments of the present technology. Data transmission network 100 is a specialized computer system that may be used for processing large amounts of data where a large number of computer processing cycles are required.

Data transmission network 100 may also include computing environment 114. Computing environment 114 may be a specialized computer or other machine that processes the data received within the data transmission network 100. Data transmission network 100 also includes one or more network devices 102. Network devices 102 may include client devices that attempt to communicate with computing environment 114. For example, network devices 102 may send data to the computing environment 114 to be processed, may send signals to the computing environment 114 to control different aspects of the computing environment or the data it is processing, among other reasons. Network devices 102 may interact with the computing environment 114 through a number of ways, such as, for example, over one or more networks 108. As shown in FIG. 1, computing environment 114 may include one or more other systems. For example, computing environment 114 may include a database system 118 and/or a communications grid 120.

Figure 8:
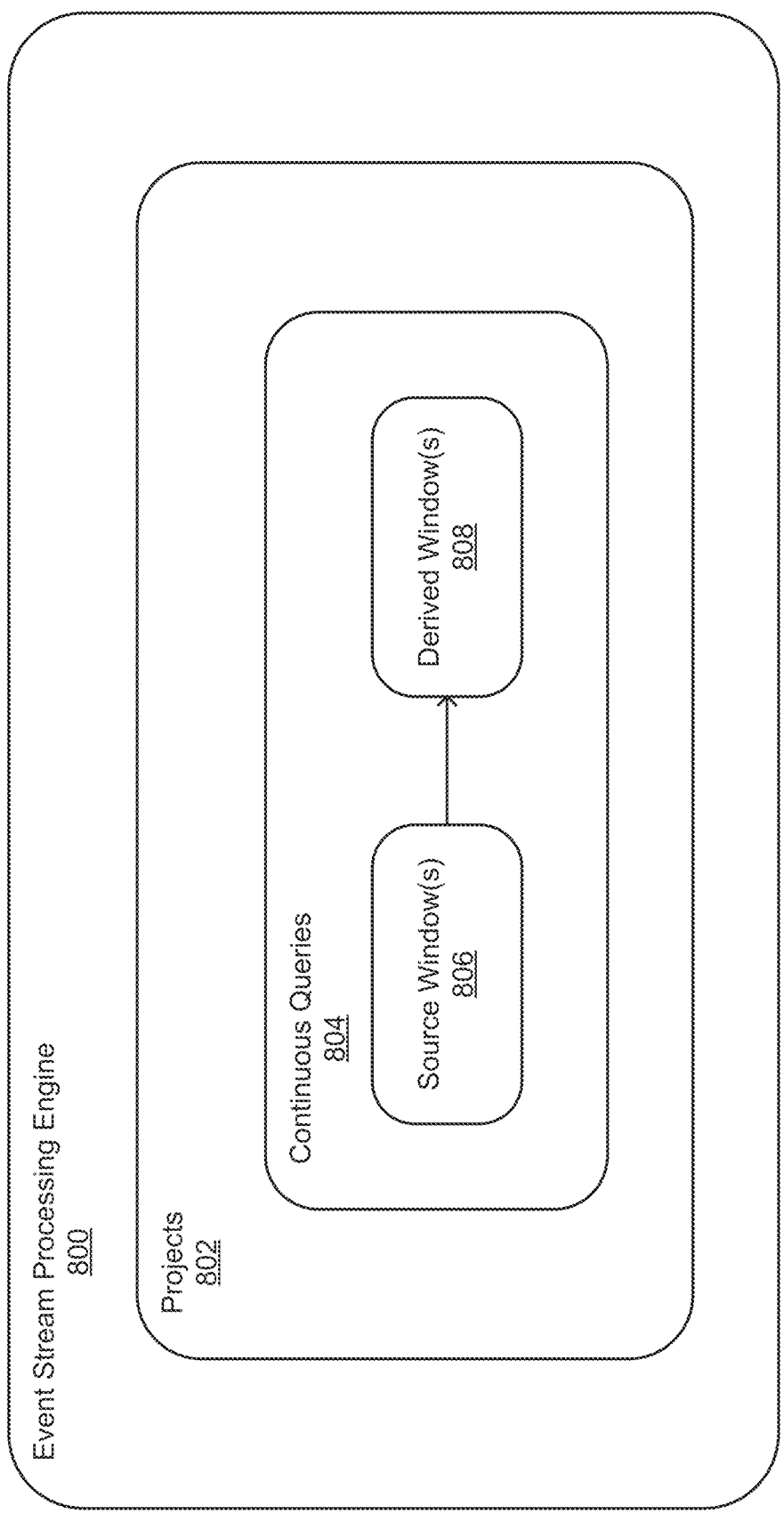
FIG. 8 illustrates a block diagram including components of an Event Stream Processing Engine (ESPE), according to embodiments of the present technology.
Figure 9:
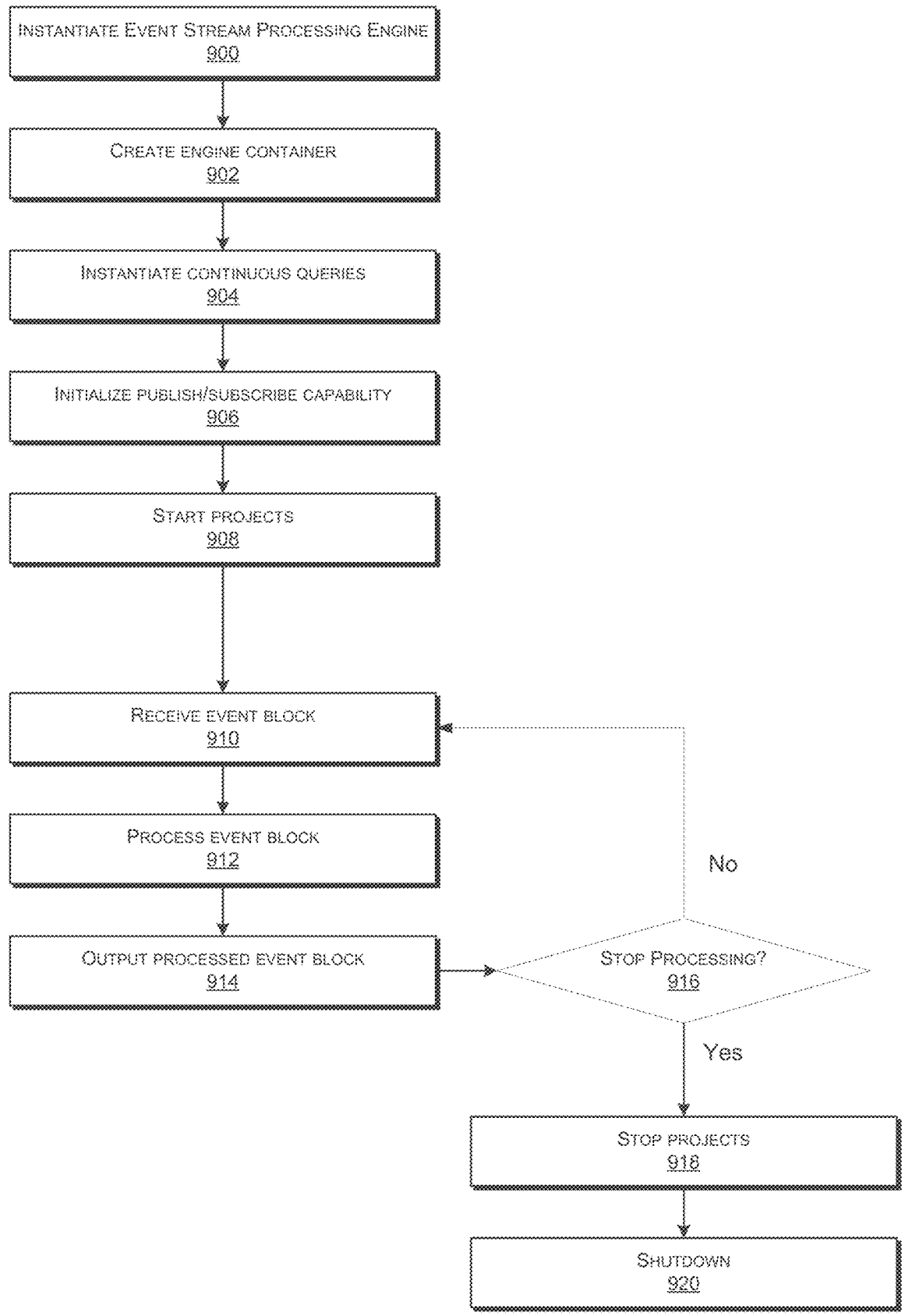
FIG. 9 illustrates a flow chart showing an example process including operations performed by an event stream processing engine, according to some embodiments of the present technology.
Figure 10:
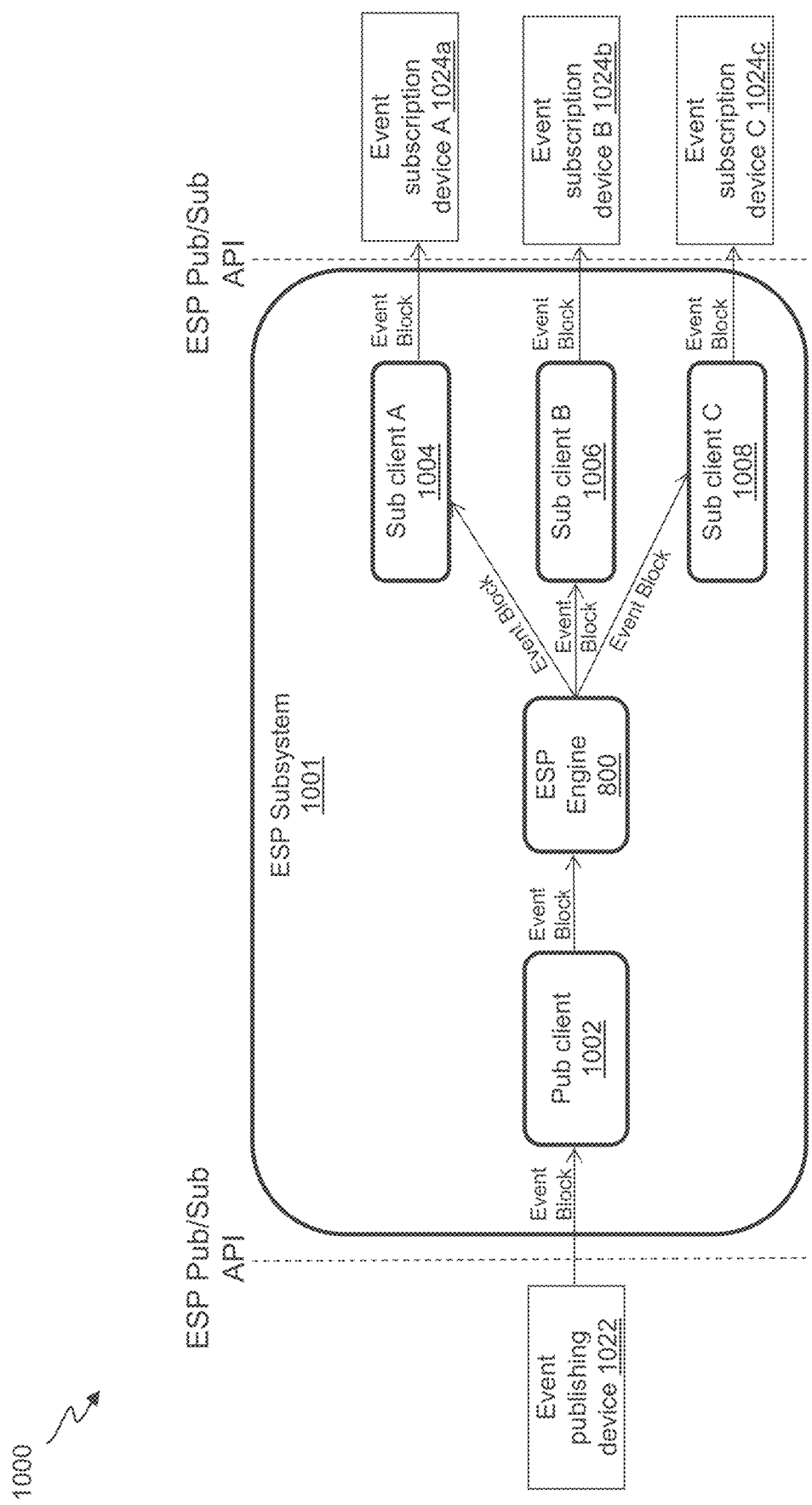
FIG. 10 illustrates an ESP system interfacing between a publishing device and multiple event subscribing devices, according to embodiments of the present technology.

In other embodiments, network devices may provide a large amount of data, either all at once or streaming over a period of time (e.g., using event stream processing (ESP), described further with respect to FIGS. 8-10), to the computing environment 114 via networks 108. For example, network devices 102 may include network computers, sensors, databases, or other devices that may transmit or otherwise provide data to computing environment 114. For example, network devices may include local area network devices, such as routers, hubs, switches, or other computer networking devices. These devices may provide a variety of stored or generated data, such as network data or data specific to the network devices themselves. Network devices may also include sensors that monitor their environment or other devices to collect data regarding that environment or those devices, and such network devices may provide data they collect over time. Network devices may also include devices within the internet of things, such as devices within a home automation network. Some of these devices may be referred to as edge devices, and may involve edge computing circuitry. Data may be transmitted by network devices directly to computing environment 114 or to network-attached data stores, such as network-attached data stores 110 for storage so that the data may be retrieved later by the computing environment 114 or other portions of data transmission network 100.

Data transmission network 100 may also include one or more network-attached data stores 110. Network-attached data stores 110 are used to store data to be processed by the computing environment 114 as well as any intermediate or final data generated by the computing system in non-volatile memory. However in certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores may store a variety of different types of data organized in a variety of different ways and from a variety of different sources. For example, network-attached data storage may include storage other than primary storage located within computing environment 114 that is directly accessible by processors located therein. Network-attached data storage may include secondary, tertiary or auxiliary storage, such as large hard drives, servers, virtual memory, among other types. Storage devices may include portable or non-portable storage devices, optical storage devices, and various other mediums capable of storing, containing data. A machine-readable storage medium or computer-readable storage medium may include a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, among others. Furthermore, the data stores may hold a variety of different types of data. For example, network-attached data stores 110 may hold unstructured (e.g., raw) data, such as manufacturing data (e.g., a database containing records identifying products being manufactured with parameter data for each product, such as colors and models) or product sales databases (e.g., a database containing individual data records identifying details of individual product sales).

The unstructured data may be presented to the computing environment 114 in different forms such as a flat file or a conglomerate of data records, and may have data values and accompanying time stamps. The computing environment 114 may be used to analyze the unstructured data in a variety of ways to determine the best way to structure (e.g., hierarchically) that data, such that the structured data is tailored to a type of further analysis that a user wishes to perform on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Data transmission network 100 may also include one or more server farms 106. Computing environment 114 may route select communications or data to the one or more sever farms 106 or one or more servers within the server farms. Server farms 106 can be configured to provide information in a predetermined manner. For example, server farms 106 may access data to transmit in response to a communication. Server farms 106 may be separately housed from each other device within data transmission network 100, such as computing environment 114, and/or may be part of a device or system.

Server farms 106 may host a variety of different types of data processing as part of data transmission network 100. Server farms 106 may receive a variety of different data from network devices, from computing environment 114, from cloud network 116, or from other sources. The data may have been obtained or collected from one or more sensors, as inputs from a control database, or may have been received as inputs from an external system or device. Server farms 106 may assist in processing the data by turning raw data into processed data based on one or more rules implemented by the server farms. For example, sensor data may be analyzed to determine changes in an environment over time or in real-time.

Data transmission network 100 may also include one or more cloud networks 116. Cloud network 116 may include a cloud infrastructure system that provides cloud services. In certain embodiments, services provided by the cloud network 116 may include a host of services that are made available to users of the cloud infrastructure system on demand. Cloud network 116 is shown in FIG. 1 as being connected to computing environment 114 (and therefore having computing environment 114 as its client or user), but cloud network 116 may be connected to or utilized by any of the devices in FIG. 1. Services provided by the cloud network can dynamically scale to meet the needs of its users. The cloud network 116 may comprise one or more computers, servers, and/or systems. In some embodiments, the computers, servers, and/or systems that make up the cloud network 116 are different from the user's own on-premises computers, servers, and/or systems. For example, the cloud network 116 may host an application, and a user may, via a communication network such as the Internet, on demand, order and use the application.

While each device, server and system in FIG. 1 is shown as a single device, it will be appreciated that multiple devices may instead be used. For example, a set of network devices can be used to transmit various communications from a single user, or remote server 140 may include a server stack. As another example, data may be processed as part of computing environment 114.

Each communication within data transmission network 100 (e.g., between client devices, between servers 106 and computing environment 114 or between a server and a device) may occur over one or more networks 108. Networks 108 may include one or more of a variety of different types of networks, including a wireless network, a wired network, or a combination of a wired and wireless network. Examples of suitable networks include the Internet, a personal area network, a local area network (LAN), a wide area network (WAN), or a wireless local area network (WLAN). A wireless network may include a wireless interface or combination of wireless interfaces. As an example, a network in the one or more networks 108 may include a short-range communication channel, such as a BLUETOOTH® communication channel or a BLUETOOTH® Low Energy communication channel. A wired network may include a wired interface. The wired and/or wireless networks may be implemented using routers, access points, bridges, gateways, or the like, to connect devices in the network 114, as will be further described with respect to FIG. 2. The one or more networks 108 can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS). In addition, data and/or transactional details may be encrypted.

Some aspects may utilize the Internet of Things (IoT), where things (e.g., machines, devices, phones, sensors) can be connected to networks and the data from these things can be collected and processed within the things and/or external to the things. For example, the IoT can include sensors in many different devices, and high value analytics can be applied to identify hidden relationships and drive increased efficiencies. This can apply to both big data analytics and real-time (e.g., ESP) analytics. This will be described further below with respect to FIG. 2.

As noted, computing environment 114 may include a communications grid 120 and a transmission network database system 118. Communications grid 120 may be a grid-based computing system for processing large amounts of data. The transmission network database system 118 may be for managing, storing, and retrieving large amounts of data that are distributed to and stored in the one or more network-attached data stores 110 or other data stores that reside at different locations within the transmission network database system 118. The compute nodes in the grid-based computing system 120 and the transmission network database system 118 may share the same processor hardware, such as processors that are located within computing environment 114.

Figure 2:
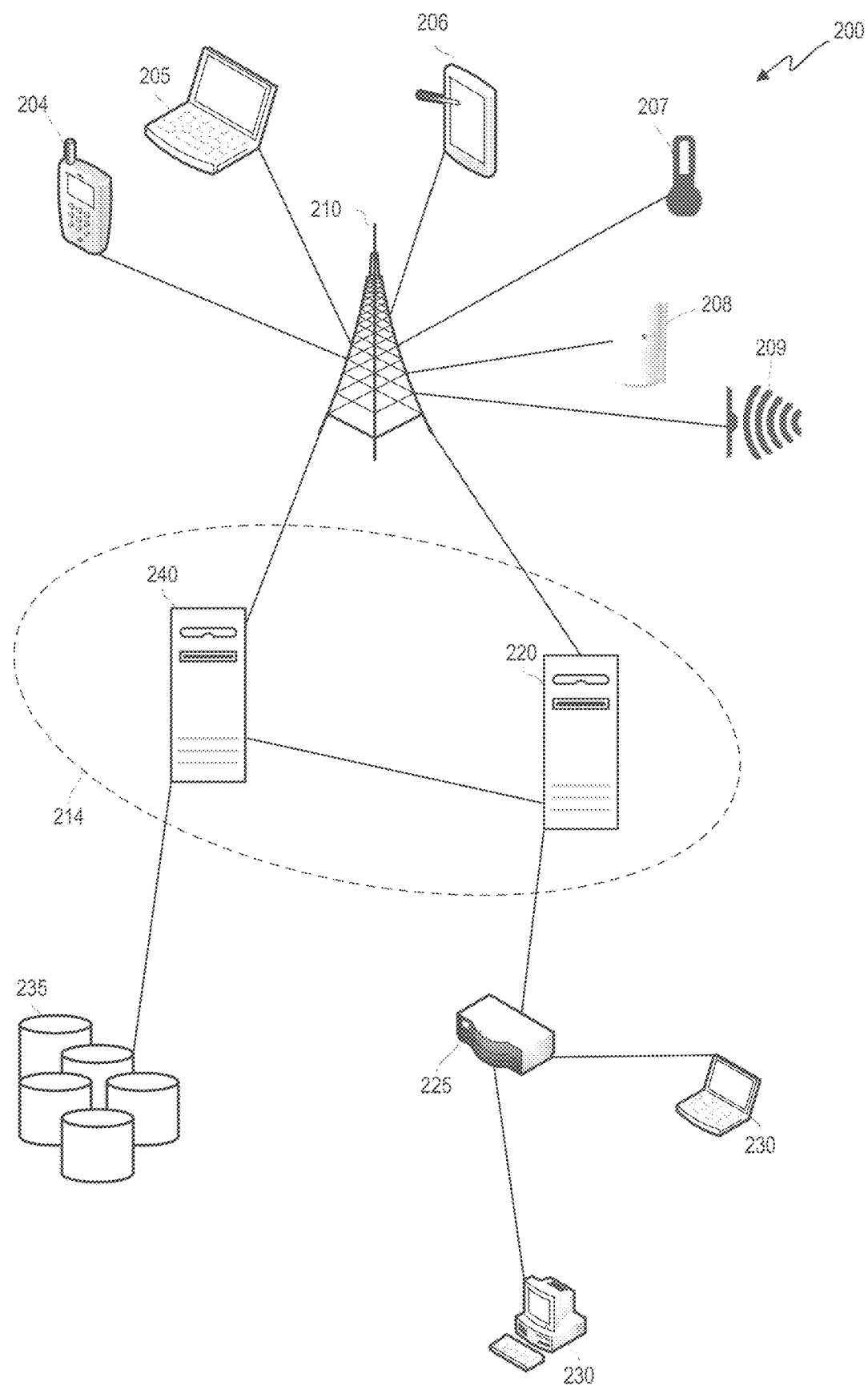
FIG. 2 illustrates an example network including an example set of devices communicating with each other over an exchange system and via a network, according to some embodiments of the present technology.

FIG. 2 illustrates an example network including an example set of devices communicating with each other over an exchange system and via a network, according to embodiments of the present technology. As noted, each communication within data transmission network 100 may occur over one or more networks. System 200 includes a network device 204 configured to communicate with a variety of types of client devices, for example client devices 230, over a variety of types of communication channels.

As shown in FIG. 2, network device 204 can transmit a communication over a network (e.g., a cellular network via a base station 210). The communication can be routed to another network device, such as network devices 205-209, via base station 210. The communication can also be routed to computing environment 214 via base station 210. For example, network device 204 may collect data either from its surrounding environment or from other network devices (such as network devices 205-209) and transmit that data to computing environment 214.

Although network devices 204-209 are shown in FIG. 2 as a mobile phone, laptop computer, tablet computer, temperature sensor, motion sensor, and audio sensor respectively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, flow rate sensors, among others. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, electrical current, among others. The sensors may be mounted to various components used as part of a variety of different types of systems (e.g., an oil drilling operation). The network devices may detect and record data related to the environment that it monitors, and transmit that data to computing environment 214.

As noted, one type of system that may include various sensors that collect data to be processed and/or transmitted to a computing environment according to certain embodiments includes an oil drilling system. For example, the one or more drilling operation sensors may include surface sensors that measure a hook load, a fluid rate, a temperature and a density in and out of the wellbore, a standpipe pressure, a surface torque, a rotation speed of a drill pipe, a rate of penetration, a mechanical specific energy, etc. and downhole sensors that measure a rotation speed of a bit, fluid densities, downhole torque, downhole vibration (axial, tangential, lateral), a weight applied at a drill bit, an annular pressure, a differential pressure, an azimuth, an inclination, a dog leg severity, a measured depth, a vertical depth, a downhole temperature, etc. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, of for example, the rate of penetration, mechanical specific energy, hook load, flow in fluid rate, flow out fluid rate, pump pressure, surface torque, rotation speed of the drill pipe, annular pressure, annular friction pressure, annular temperature, equivalent circulating density, etc. may also be stored in the data warehouse.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device 102 may include a home automation switch that may be coupled with a home appliance. In another embodiment, a network device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment according to certain embodiments includes a power or energy grid. A variety of different network devices may be included in an energy grid, such as various devices within one or more power plants, energy farms (e.g., wind farm, solar farm, among others) energy storage facilities, factories, homes and businesses of consumers, among others. One or more of such devices may include one or more sensors that detect energy gain or loss, electrical input or output or loss, and a variety of other efficiencies. These sensors may collect data to inform users of how the energy grid, and individual devices within the grid, may be functioning and how they may be made more efficient.

Network device sensors may also perform processing on data it collects before transmitting the data to the computing environment 114, or before deciding whether to transmit data to the computing environment 114. For example, network devices may determine whether data collected meets certain rules, for example by comparing data or values calculated from the data and comparing that data to one or more thresholds. The network device may use this data and/or comparisons to determine if the data should be transmitted to the computing environment 214 for further use or processing.

Computing environment 214 may include machines 220 and 240. Although computing environment 214 is shown in FIG. 2 as having two machines, 220 and 240, computing environment 214 may have only one machine or may have more than two machines. The machines that make up computing environment 214 may include specialized computers, servers, or other machines that are configured to individually and/or collectively process large amounts of data. The computing environment 214 may also include storage devices that include one or more databases of structured data, such as data organized in one or more hierarchies, or unstructured data. The databases may communicate with the processing devices within computing environment 214 to distribute data to them. Since network devices may transmit data to computing environment 214, that data may be received by the computing environment 214 and subsequently stored within those storage devices. Data used by computing environment 214 may also be stored in data stores 235, which may also be a part of or connected to computing environment 214.

Computing environment 214 can communicate with various devices via one or more routers 225 or other inter-network or intra-network connection components. For example, computing environment 214 may communicate with devices 230 via one or more routers 225. Computing environment 214 may collect, analyze and/or store data from or pertaining to communications, client device operations, client rules, and/or user-associated actions stored at one or more data stores 235. Such data may influence communication routing to the devices within computing environment 214, how data is stored or processed within computing environment 214, among other actions.

Notably, various other devices can further be used to influence communication routing and/or processing between devices within computing environment 214 and with devices outside of computing environment 214. For example, as shown in FIG. 2, computing environment 214 may include a web server 240. Thus, computing environment 214 can retrieve data of interest, such as client information (e.g., product information, client rules, etc.), technical product details, news, current or predicted weather, and so on.

In addition to computing environment 214 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from network device sensors as the sensors continuously sense, monitor and track changes in their environments. Devices within computing environment 214 may also perform pre-analysis on data it receives to determine if the data received should be processed as part of an ongoing project. The data received and collected by computing environment 214, no matter what the source or method or timing of receipt, may be processed over a period of time for a client to determine results data based on the client's needs and rules.

Figure 3:
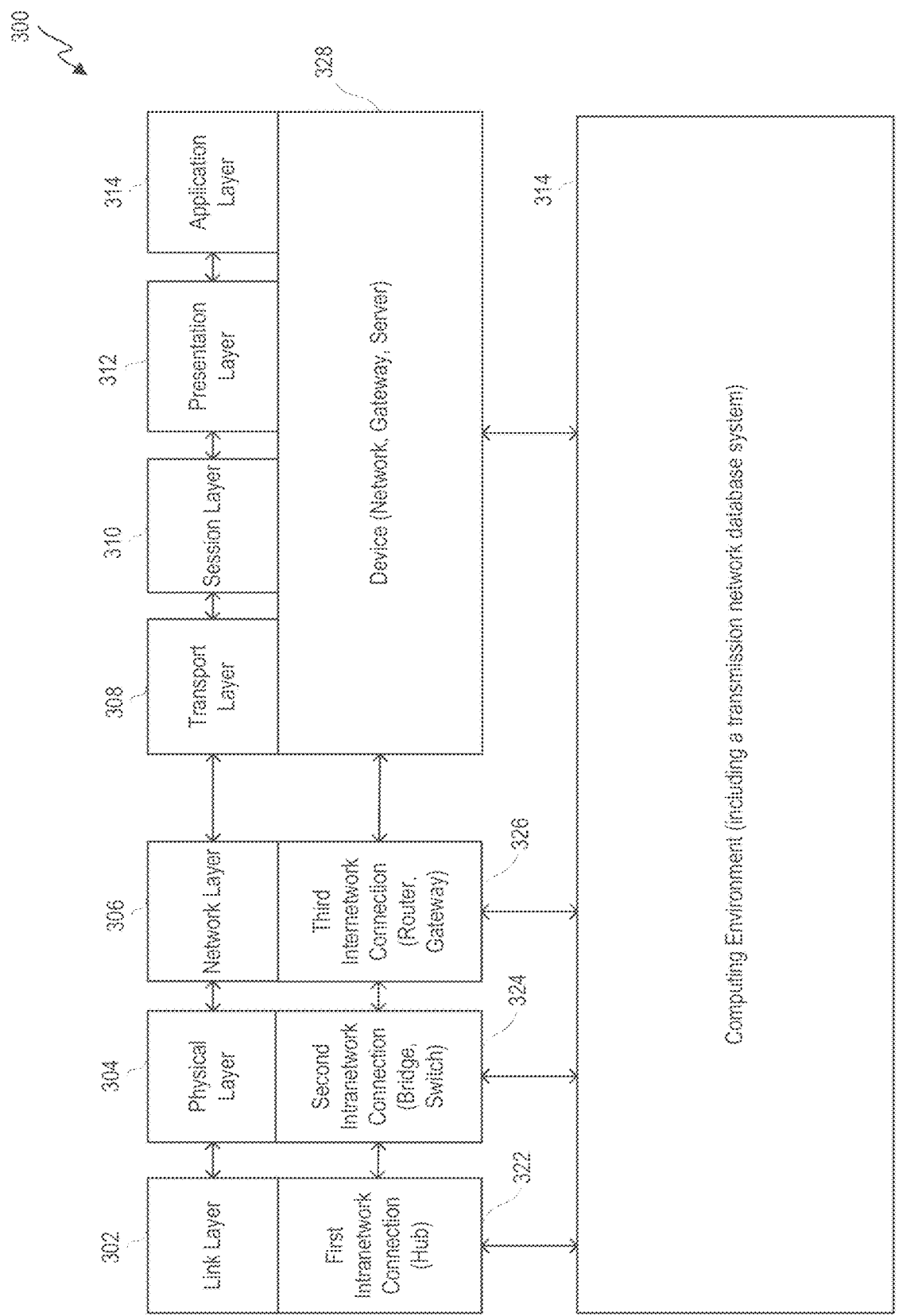
FIG. 3 illustrates a representation of a conceptual model of a communications protocol system, according to some embodiments of the present technology.

FIG. 3 illustrates a representation of a conceptual model of a communications protocol system, according to embodiments of the present technology. More specifically, FIG. 3 identifies operation of a computing environment in an Open Systems Interaction model that corresponds to various connection components. The model 300 shows, for example, how a computing environment, such as computing environment 314 (or computing environment 214 in FIG. 2) may communicate with other devices in its network, and control how communications between the computing environment and other devices are executed and under what conditions.

The model can include layers 301-307. The layers are arranged in a stack. Each layer in the stack serves the layer one level higher than it (except for the application layer, which is the highest layer), and is served by the layer one level below it (except for the physical layer, which is the lowest layer). The physical layer is the lowest layer because it receives and transmits raw bites of data, and is the farthest layer from the user in a communications system. On the other hand, the application layer is the highest layer because it interacts directly with a software application.

As noted, the model includes a physical layer 301. Physical layer 301 represents physical communication, and can define parameters of that physical communication. For example, such physical communication may come in the form of electrical, optical, or electromagnetic signals. Physical layer 301 also defines protocols that may control communications within a data transmission network.

Link layer 302 defines links and mechanisms used to transmit (i.e., move) data across a network. The link layer 302 manages node-to-node communications, such as within a grid computing environment. Link layer 302 can detect and correct errors (e.g., transmission errors in the physical layer 301). Link layer 302 can also include a media access control (MAC) layer and logical link control (LLC) layer.

Network layer 303 defines the protocol for routing within a network. In other words, the network layer coordinates transferring data across nodes in a same network (e.g., such as a grid computing environment). Network layer 303 can also define the processes used to structure local addressing within the network.

Transport layer 304 can manage the transmission of data and the quality of the transmission and/or receipt of that data. Transport layer 304 can provide a protocol for transferring data, such as, for example, a Transmission Control Protocol (TCP). Transport layer 304 can assemble and disassemble data frames for transmission. The transport layer can also detect transmission errors occurring in the layers below it.

Session layer 305 can establish, maintain, and manage communication connections between devices on a network. In other words, the session layer controls the dialogues or nature of communications between network devices on the network. The session layer may also establish checkpointing, adjournment, termination, and restart procedures.

Presentation layer 306 can provide translation for communications between the application and network layers. In other words, this layer may encrypt, decrypt and/or format data based on data types and/or encodings known to be accepted by an application or network layer.

Application layer 307 interacts directly with software applications and end users, and manages communications between them. Application layer 307 can identify destinations, local resource states or availability and/or communication content or formatting using the applications.

Intra-network connection components 321 and 322 are shown to operate in lower levels, such as physical layer 301 and link layer 302, respectively. For example, a hub can operate in the physical layer, a switch can operate in the link layer, and a router can operate in the network layer. Inter-network connection components 323 and 328 are shown to operate on higher levels, such as layers 303-307. For example, routers can operate in the network layer and network devices can operate in the transport, session, presentation, and application layers.

As noted, a computing environment 314 can interact with and/or operate on, in various embodiments, one, more, all or any of the various layers. For example, computing environment 314 can interact with a hub (e.g., via the link layer) so as to adjust which devices the hub communicates with. The physical layer may be served by the link layer, so it may implement such data from the link layer. For example, the computing environment 314 may control which devices it will receive data from. For example, if the computing environment 314 knows that a certain network device has turned off, broken, or otherwise become unavailable or unreliable, the computing environment 314 may instruct the hub to prevent any data from being transmitted to the computing environment 314 from that network device. Such a process may be beneficial to avoid receiving data that is inaccurate or that has been influenced by an uncontrolled environment. As another example, computing environment 314 can communicate with a bridge, switch, router or gateway and influence which device within the system (e.g., system 200) the component selects as a destination. In some embodiments, computing environment 314 can interact with various layers by exchanging communications with equipment operating on a particular layer by routing or modifying existing communications. In another embodiment, such as in a grid computing environment, a node may determine how data within the environment should be routed (e.g., which node should receive certain data) based on certain parameters or information provided by other layers within the model.

As noted, the computing environment 314 may be a part of a communications grid environment, the communications of which may be implemented as shown in the protocol of FIG. 3. For example, referring back to FIG. 2, one or more of machines 220 and 240 may be part of a communications grid computing environment. A gridded computing environment may be employed in a distributed system with non-interactive workloads where data resides in memory on the machines, or compute nodes. In such an environment, analytic code, instead of a database management system, controls the processing performed by the nodes. Data is co-located by pre-distributing it to the grid nodes, and the analytic code on each node loads the local data into memory. Each node may be assigned a particular task such as a portion of a processing project, or to organize or control other nodes within the grid.

Figure 4:
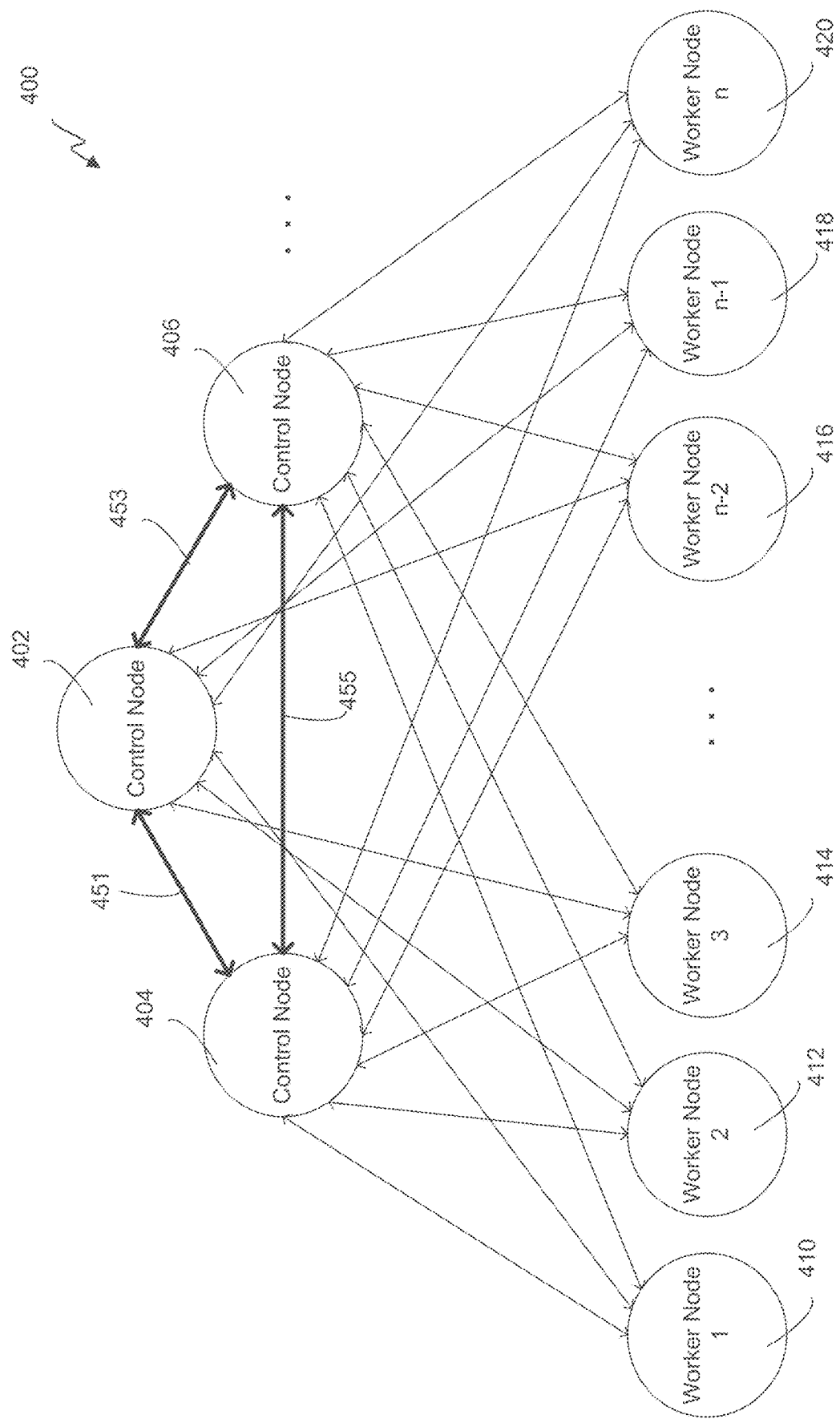
FIG. 4 illustrates a communications grid computing system including a variety of control and worker nodes, according to some embodiments of the present technology.

FIG. 4 illustrates a communications grid computing system 400 including a variety of control and worker nodes, according to embodiments of the present technology. Communications grid computing system 400 includes three control nodes and one or more worker nodes. Communications grid computing system 400 includes control nodes 402, 404, and 406. The control nodes are communicatively connected via communication paths 451, 453, and 455. Therefore, the control nodes may transmit information (e.g., related to the communications grid or notifications), to and receive information from each other. Although communications grid computing system 400 is shown in FIG. 4 as including three control nodes, the communications grid may include more or less than three control nodes.

Communications grid computing system (or just "communications grid") 400 also includes one or more worker nodes. Shown in FIG. 4 are six worker nodes 410-420. Although FIG. 4 shows six worker nodes, a communications grid according to embodiments of the present technology may include more or less than six worker nodes. The number of worker nodes included in a communications grid may be dependent upon how large the project or data set is being processed by the communications grid, the capacity of each worker node, the time designated for the communications grid to complete the project, among others. Each worker node within the communications grid 400 may be connected (wired or wirelessly, and directly or indirectly) to control nodes 402-406. Therefore, each worker node may receive information from the control nodes (e.g., an instruction to perform work on a project) and may transmit information to the control nodes (e.g., a result from work performed on a project). Furthermore, worker nodes may communicate with each other (either directly or indirectly). For example, worker nodes may transmit data between each other related to a job being performed or an individual task within a job being performed by that worker node. However, in certain embodiments, worker nodes may not, for example, be connected (communicatively or otherwise) to certain other worker nodes. In an embodiment, worker nodes may only be able to communicate with the control node that controls it, and may not be able to communicate with other worker nodes in the communications grid, whether they are other worker nodes controlled by the control node that controls the worker node, or worker nodes that are controlled by other control nodes in the communications grid.

A control node may connect with an external device with which the control node may communicate (e.g., a grid user, such as a server or computer, may connect to a controller of the grid). For example, a server or computer may connect to control nodes and may transmit a project or job to the node. The project may include a data set. The data set may be of any size. Once the control node receives such a project including a large data set, the control node may distribute the data set or projects related to the data set to be performed by worker nodes. Alternatively, for a project including a large data set, the data set may be received or stored by a machine other than a control node (e.g., a HADOOP® standard-compliant data node employing the HADOOP® Distributed File System, or HDFS).

Control nodes may maintain knowledge of the status of the nodes in the grid (i.e., grid status information), accept work requests from clients, subdivide the work across worker nodes, coordinate the worker nodes, among other responsibilities. Worker nodes may accept work requests from a control node and provide the control node with results of the work performed by the worker node. A grid may be started from a single node (e.g., a machine, computer, server, etc.). This first node may be assigned or may start as the primary control node that will control any additional nodes that enter the grid.

When a project is submitted for execution (e.g., by a client or a controller of the grid) it may be assigned to a set of nodes. After the nodes are assigned to a project, a data structure (i.e., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A control node, such as control node 402, may be designated as the primary control node. A server, computer or other external device may connect to the primary control node. Once the control node receives a project, the primary control node may distribute portions of the project to its worker nodes for execution. For example, when a project is initiated on communications grid 400, primary control node 402 controls the work to be performed for the project in order to complete the project as requested or instructed. The primary control node may distribute work to the worker nodes based on various factors, such as which subsets or portions of projects may be completed most efficiently and in the correct amount of time. For example, a worker node may perform analysis on a portion of data that is already local (e.g., stored on) the worker node. The primary control node also coordinates and processes the results of the work performed by each worker node after each worker node executes and completes its job. For example, the primary control node may receive a result from one or more worker nodes, and the control node may organize (e.g., collect and assemble) the results received and compile them to produce a complete result for the project received from the end user.

Any remaining control nodes, such as control nodes 404 and 406, may be assigned as backup control nodes for the project. In an embodiment, backup control nodes may not control any portion of the project. Instead, backup control nodes may serve as a backup for the primary control node and take over as primary control node if the primary control node were to fail. If a communications grid were to include only a single control node, and the control node were to fail (e.g., the control node is shut off or breaks) then the communications grid as a whole may fail and any project or job being run on the communications grid may fail and may not complete. While the project may be run again, such a failure may cause a delay (severe delay in some cases, such as overnight delay) in completion of the project. Therefore, a grid with multiple control nodes, including a backup control node, may be beneficial.

To add another node or machine to the grid, the primary control node may open a pair of listening sockets, for example. A socket may be used to accept work requests from clients, and the second socket may be used to accept connections from other grid nodes. The primary control node may be provided with a list of other nodes (e.g., other machines, computers, servers) that will participate in the grid, and the role that each node will fill in the grid. Upon startup of the primary control node (e.g., the first node on the grid), the primary control node may use a network protocol to start the server process on every other node in the grid. Command line parameters, for example, may inform each node of one or more pieces of information, such as: the role that the node will have in the grid, the host name of the primary control node, the port number on which the primary control node is accepting connections from peer nodes, among others. The information may also be provided in a configuration file, transmitted over a secure shell tunnel, recovered from a configuration server, among others. While the other machines in the grid may not initially know about the configuration of the grid, that information may also be sent to each other node by the primary control node. Updates of the grid information may also be subsequently sent to those nodes.

For any control node other than the primary control node added to the grid, the control node may open three sockets. The first socket may accept work requests from clients, the second socket may accept connections from other grid members, and the third socket may connect (e.g., permanently) to the primary control node. When a control node (e.g., primary control node) receives a connection from another control node, it first checks to see if the peer node is in the list of configured nodes in the grid. If it is not on the list, the control node may clear the connection. If it is on the list, it may then attempt to authenticate the connection. If authentication is successful, the authenticating node may transmit information to its peer, such as the port number on which a node is listening for connections, the host name of the node, information about how to authenticate the node, among other information. When a node, such as the new control node, receives information about another active node, it will check to see if it already has a connection to that other node. If it does not have a connection to that node, it may then establish a connection to that control node.

Any worker node added to the grid may establish a connection to the primary control node and any other control nodes on the grid. After establishing the connection, it may authenticate itself to the grid (e.g., any control nodes, including both primary and backup, or a server or user controlling the grid). After successful authentication, the worker node may accept configuration information from the control node.

When a node joins a communications grid (e.g., when the node is powered on or connected to an existing node on the grid or both), the node is assigned (e.g., by an operating system of the grid) a universally unique identifier (UUID). This unique identifier may help other nodes and external entities (devices, users, etc.) to identify the node and distinguish it from other nodes. When a node is connected to the grid, the node may share its unique identifier with the other nodes in the grid. Since each node may share its unique identifier, each node may know the unique identifier of every other node on the grid. Unique identifiers may also designate a hierarchy of each of the nodes (e.g., backup control nodes) within the grid. For example, the unique identifiers of each of the backup control nodes may be stored in a list of backup control nodes to indicate an order in which the backup control nodes will take over for a failed primary control node to become a new primary control node. However, a hierarchy of nodes may also be determined using methods other than using the unique identifiers of the nodes. For example, the hierarchy may be predetermined, or may be assigned based on other predetermined factors.

The grid may add new machines at any time (e.g., initiated from any control node). Upon adding a new node to the grid, the control node may first add the new node to its table of grid nodes. The control node may also then notify every other control node about the new node. The nodes receiving the notification may acknowledge that they have updated their configuration information.

Primary control node 402 may, for example, transmit one or more communications to backup control nodes 404 and 406 (and, for example, to other control or worker nodes within the communications grid). Such communications may sent periodically, at fixed time intervals, between known fixed stages of the project's execution, among other protocols. The communications transmitted by primary control node 402 may be of varied types and may include a variety of types of information. For example, primary control node 402 may transmit snapshots (e.g., status information) of the communications grid so that backup control node 404 always has a recent snapshot of the communications grid. The snapshot or grid status may include, for example, the structure of the grid (including, for example, the worker nodes in the grid, unique identifiers of the nodes, or their relationships with the primary control node) and the status of a project (including, for example, the status of each worker node's portion of the project). The snapshot may also include analysis or results received from worker nodes in the communications grid. The backup control nodes may receive and store the backup data received from the primary control node. The backup control nodes may transmit a request for such a snapshot (or other information) from the primary control node, or the primary control node may send such information periodically to the backup control nodes.

As noted, the backup data may allow the backup control node to take over as primary control node if the primary control node fails without requiring the grid to start the project over from scratch. If the primary control node fails, the backup control node that will take over as primary control node may retrieve the most recent version of the snapshot received from the primary control node and use the snapshot to continue the project from the stage of the project indicated by the backup data. This may prevent failure of the project as a whole.

A backup control node may use various methods to determine that the primary control node has failed. In one example of such a method, the primary control node may transmit (e.g., periodically) a communication to the backup control node that indicates that the primary control node is working and has not failed, such as a heartbeat communication. The backup control node may determine that the primary control node has failed if the backup control node has not received a heartbeat communication for a certain predetermined period of time. Alternatively, a backup control node may also receive a communication from the primary control node itself (before it failed) or from a worker node that the primary control node has failed, for example because the primary control node has failed to communicate with the worker node.

Different methods may be performed to determine which backup control node of a set of backup control nodes (e.g., backup control nodes 404 and 406) will take over for failed primary control node 402 and become the new primary control node. For example, the new primary control node may be chosen based on a ranking or "hierarchy" of backup control nodes based on their unique identifiers. In an alternative embodiment, a backup control node may be assigned to be the new primary control node by another device in the communications grid or from an external device (e.g., a system infrastructure or an end user, such as a server or computer, controlling the communications grid). In another alternative embodiment, the backup control node that takes over as the new primary control node may be designated based on bandwidth or other statistics about the communications grid.

A worker node within the communications grid may also fail. If a worker node fails, work being performed by the failed worker node may be redistributed amongst the operational worker nodes. In an alternative embodiment, the primary control node may transmit a communication to each of the operable worker nodes still on the communications grid that each of the worker nodes should purposefully fail also. After each of the worker nodes fail, they may each retrieve their most recent saved checkpoint of their status and restart the project from that checkpoint to minimize lost progress on the project being executed.

Figure 5:
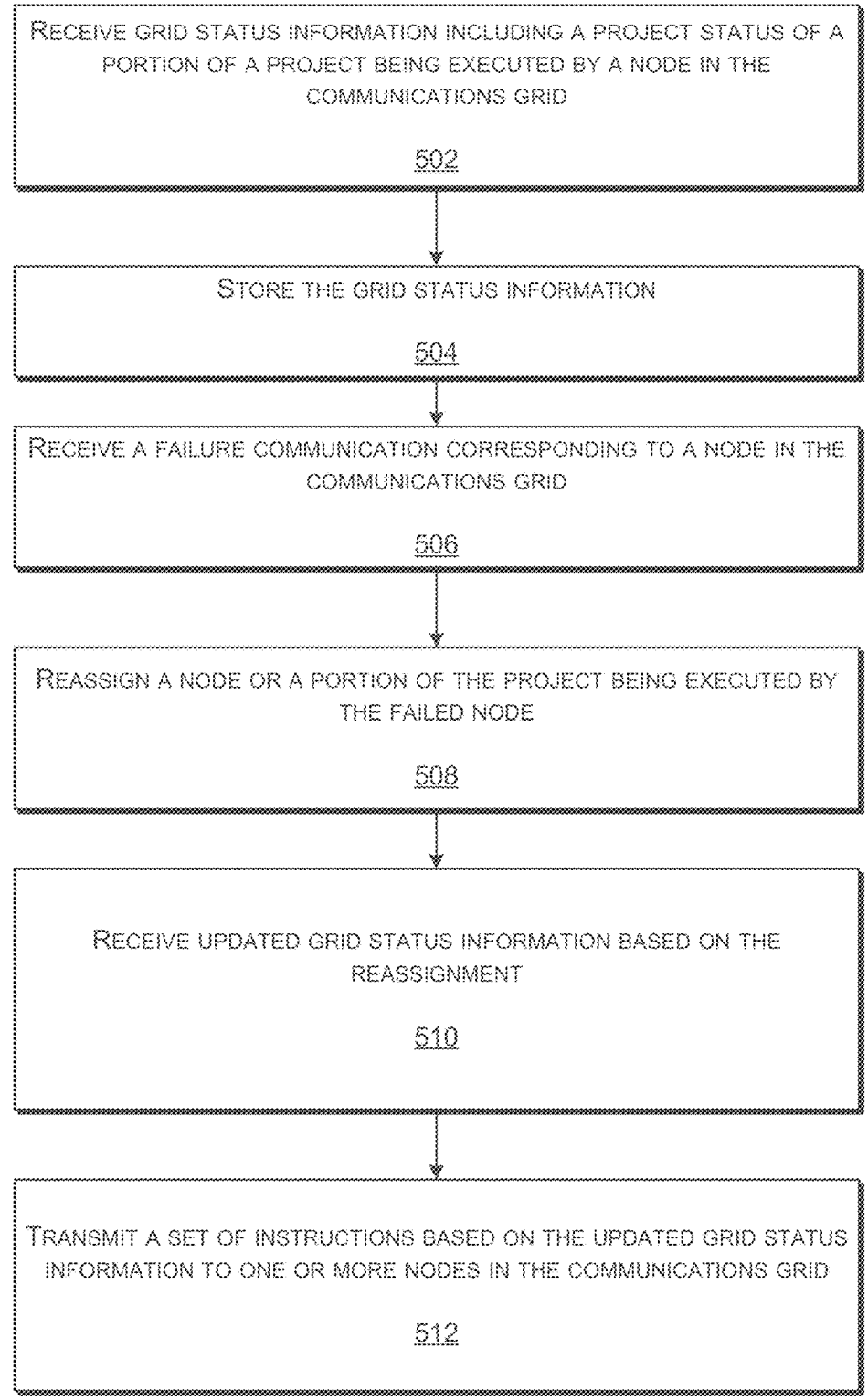
FIG. 5 illustrates a flow chart showing an example process for adjusting a communications grid or a work project in a communications grid after a failure of a node, according to some embodiments of the present technology.

FIG. 5 illustrates a flow chart showing an example process 500 for adjusting a communications grid or a work project in a communications grid after a failure of a node, according to embodiments of the present technology. The process may include, for example, receiving grid status information including a project status of a portion of a project being executed by a node in the communications grid, as described in operation 502. For example, a control node (e.g., a backup control node connected to a primary control node and a worker node on a communications grid) may receive grid status information, where the grid status information includes a project status of the primary control node or a project status of the worker node. The project status of the primary control node and the project status of the worker node may include a status of one or more portions of a project being executed by the primary and worker nodes in the communications grid. The process may also include storing the grid status information, as described in operation 504. For example, a control node (e.g., a backup control node) may store the received grid status information locally within the control node. Alternatively, the grid status information may be sent to another device for storage where the control node may have access to the information.

The process may also include receiving a failure communication corresponding to a node in the communications grid in operation 506. For example, a node may receive a failure communication including an indication that the primary control node has failed, prompting a backup control node to take over for the primary control node. In an alternative embodiment, a node may receive a failure that a worker node has failed, prompting a control node to reassign the work being performed by the worker node. The process may also include reassigning a node or a portion of the project being executed by the failed node, as described in operation 508. For example, a control node may designate the backup control node as a new primary control node based on the failure communication upon receiving the failure communication. If the failed node is a worker node, a control node may identify a project status of the failed worker node using the snapshot of the communications grid, where the project status of the failed worker node includes a status of a portion of the project being executed by the failed worker node at the failure time.

The process may also include receiving updated grid status information based on the reassignment, as described in operation 510, and transmitting a set of instructions based on the updated grid status information to one or more nodes in the communications grid, as described in operation 512. The updated grid status information may include an updated project status of the primary control node or an updated project status of the worker node. The updated information may be transmitted to the other nodes in the grid to update their stale stored information.

Figure 6:
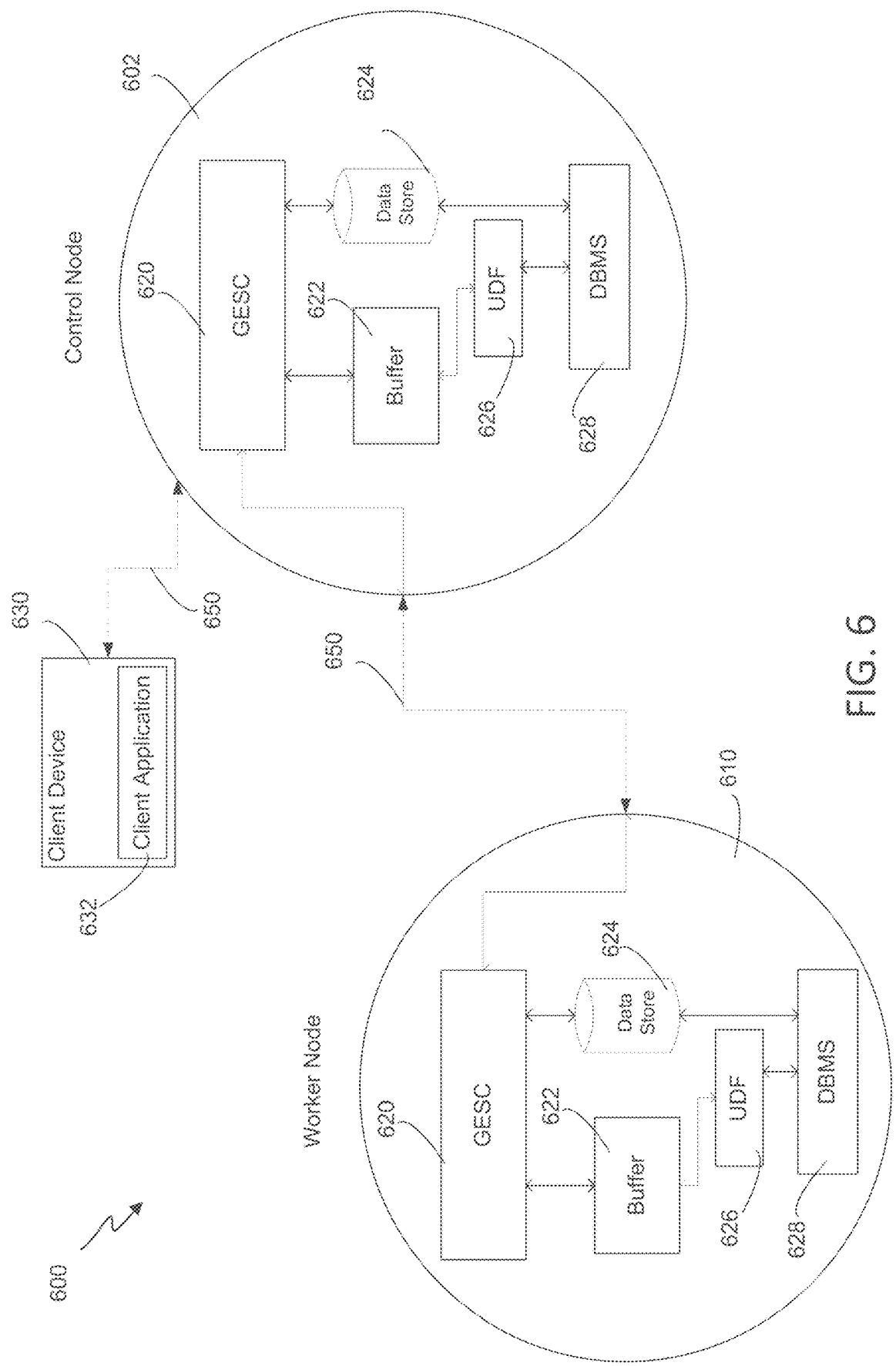
FIG. 6 illustrates a portion of a communications grid computing system including a control node and a worker node, according to some embodiments of the present technology.

FIG. 6 illustrates a portion of a communications grid computing system 600 including a control node and a worker node, according to embodiments of the present technology. Communications grid 600 computing system includes one control node (control node 602) and one worker node (worker node 610) for purposes of illustration, but may include more worker and/or control nodes. The control node 602 is communicatively connected to worker node 610 via communication path 650. Therefore, control node 602 may transmit information (e.g., related to the communications grid or notifications), and to receive information from worker node 610 via path 650.

Similar to in FIG. 4, communications grid computing system (or just "communications grid") 600 includes data processing nodes (control node 602 and worker node 610). Nodes 602 and 610 comprise multi-core data processors. Each node 602 and 610 includes a grid-enabled software component (GESC) 620 that executes on the data processor associated with that node and interfaces with buffer memory 622 also associated with that node. Each node 602 and 610 includes a database management software (DBMS) 628 that executes on a database server (not shown) at control node 602 and on a database server (not shown) at worker node 610.

Each node also includes a data store 624. Data stores 624, similar to network-attached data stores 110 in FIG. 1 and data stores 235 in FIG. 2, are used to store data to be processed by the nodes in the computing environment. Data stores 624 may also store any intermediate or final data generated by the computing system after being processed, for example in non-volatile memory. However in certain embodiments, the configuration of the grid computing environment allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the grid receives queries (e.g., ad hoc) from a client and when responses, which are generated by processing large amounts of data, need to be generated quickly or on-the-fly. In such a situation, the grid may be configured to retain the data within memory so that responses can be generated at different levels of detail and so that a client may interactively query against this information.

Each node also includes a user-defined function (UDF) 626. The UDF provides a mechanism for the DMBS 628 to transfer data to or receive data from the database stored in the data stores 624 that are managed by the DBMS. For example, UDF 626 can be invoked by the DBMS to provide data to the GESC for processing. The UDF 626 may establish a socket connection (not shown) with the GESC to transfer the data. Alternatively, the UDF 626 can transfer data to the GESC by writing data to shared memory accessible by both the UDF and the GESC.

The GESC 620 at the nodes 602 and 620 may be connected via a network, such as network 108 shown in FIG. 1. Therefore, nodes 602 and 620 can communicate with each other via the network using a predetermined communication protocol such as, for example, the Message Passing Interface (MPI). Each GESC 620 can engage in point-to-point communication with the GESC at another node or in collective communication with multiple GESCs via the network. The GESC 620 at each node may contain identical (or nearly identical) software instructions. Each node may be capable of operating as either a control node or a worker node. The GESC at the control node 602 can communicate, over a communication path 652, with a client deice 630. More specifically, control node 602 may communicate with client application 632 hosted by the client device 630 to receive queries and to respond to those queries after processing large amounts of data.

DMBS 628 may control the creation, maintenance, and use of database or data structure (not shown) within a nodes 602 or 610. The database may organize data stored in data stores 624. The DMBS 628 at control node 602 may accept requests for data and transfer the appropriate data for the request. With such a process, collections of data may be distributed across multiple physical locations. In this example, each node 602 and 610 stores a portion of the total data managed by the management system in its associated data store 624.

Furthermore, the DBMS may be responsible for protecting against data loss using replication techniques. Replication includes providing a backup copy of data stored on one node on one or more other nodes. Therefore, if one node fails, the data from the failed node can be recovered from a replicated copy residing at another node. However, as described herein with respect to FIG. 4, data or status information for each node in the communications grid may also be shared with each node on the grid.

Figure 7:
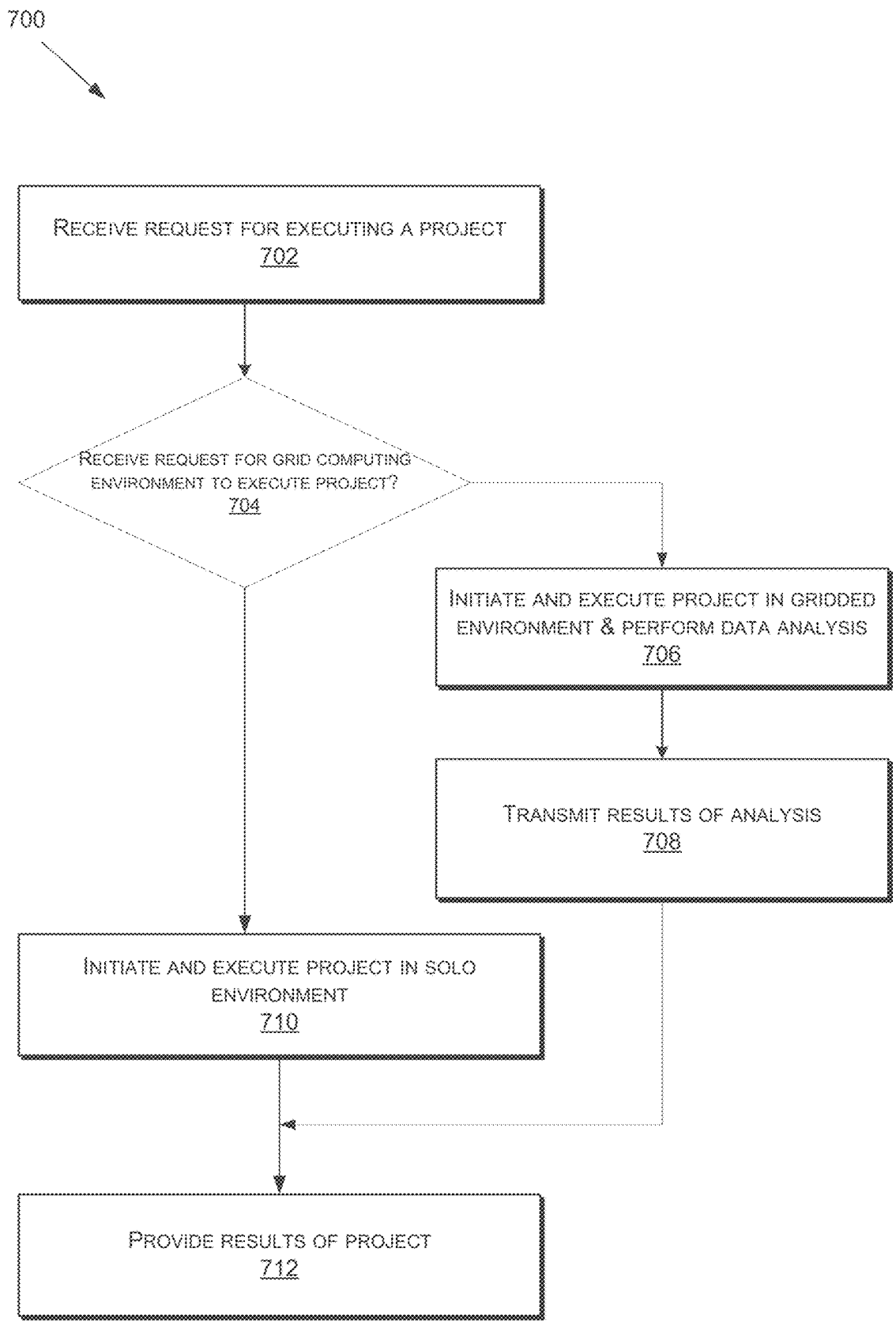
FIG. 7 illustrates a flow chart showing an example process for executing a data analysis or processing project, according to some embodiments of the present technology.

FIG. 7 illustrates a flow chart showing an example method 700 for executing a project within a grid computing system, according to embodiments of the present technology. As described with respect to FIG. 6, the GESC at the control node may transmit data with a client device (e.g., client device 630) to receive queries for executing a project and to respond to those queries after large amounts of data have been processed. The query may be transmitted to the control node, where the query may include a request for executing a project, as described in operation 702. The query can contain instructions on the type of data analysis to be performed in the project and whether the project should be executed using the grid-based computing environment, as shown in operation 704.

To initiate the project, the control node may determine if the query requests use of the grid-based computing environment to execute the project. If the determination is no, then the control node initiates execution of the project in a solo environment (e.g., at the control node), as described in operation 710. If the determination is yes, the control node may initiate execution of the project in the grid-based computing environment, as described in operation 706. In such a situation, the request may include a requested configuration of the grid. For example, the request may include a number of control nodes and a number of worker nodes to be used in the grid when executing the project. After the project has been completed, the control node may transmit results of the analysis yielded by the grid, as described in operation 708. Whether the project is executed in a solo or grid-based environment, the control node provides the results of the project, as described in operation 712.

As noted with respect to FIG. 2, the computing environments described herein may collect data (e.g., as received from network devices, such as sensors, such as network devices 204-209 in FIG. 2, and client devices or other sources) to be processed as part of a data analytics project, and data may be received in real time as part of a streaming analytics environment (e.g., ESP). Data may be collected using a variety of sources as communicated via different kinds of networks or locally, such as on a real-time streaming basis. For example, network devices may receive data periodically from network device sensors as the sensors continuously sense, monitor and track changes in their environments. More specifically, an increasing number of distributed applications develop or produce continuously flowing data from distributed sources by applying queries to the data before distributing the data to geographically distributed recipients. An event stream processing engine (ESPE) may continuously apply the queries to the data as it is received and determines which entities should receive the data. Client or other devices may also subscribe to the ESPE or other devices processing ESP data so that they can receive data after processing, based on for example the entities determined by the processing engine. For example, client devices 230 in FIG. 2 may subscribe to the ESPE in computing environment 214. In another example, event subscription devices 1024*a-c*, described further with respect to FIG. 10, may also subscribe to the ESPE. The ESPE may determine or define how input data or event streams from network devices or other publishers (e.g., network devices 204-209 in FIG. 2) are transformed into meaningful output data to be consumed by subscribers, such as for example client devices 230 in FIG. 2.

FIG. 8 illustrates a block diagram including components of an Event Stream Processing Engine (ESPE), according to embodiments of the present technology. ESPE 800 may include one or more projects 802. A project may be described as a second-level container in an engine model managed by ESPE 800 where a thread pool size for the project may be defined by a user. Each project of the one or more projects 802 may include one or more continuous queries 804 that contain data flows, which are data transformations of incoming event streams. The one or more continuous queries 804 may include one or more source windows 806 and one or more derived windows 808.

The ESPE may receive streaming data over a period of time related to certain events, such as events or other data sensed by one or more network devices. The ESPE may perform operations associated with processing data created by the one or more devices. For example, the ESPE may receive data from the one or more network devices 204-209 shown in FIG. 2. As noted, the network devices may include sensors that sense different aspects of their environments, and may collect data over time based on those sensed observations. For example, the ESPE may be implemented within one or more of machines 220 and 240 shown in FIG. 2. The ESPE may be implemented within such a machine by an ESP application. An ESP application may embed an ESPE with its own dedicated thread pool or pools into its application space where the main application thread can do application-specific work and the ESPE processes event streams at least by creating an instance of a model into processing objects.

The engine container is the top-level container in a model that manages the resources of the one or more projects 802. In an illustrative embodiment, for example, there may be only one ESPE 800 for each instance of the ESP application, and ESPE 800 may have a unique engine name. Additionally, the one or more projects 802 may each have unique project names, and each query may have a unique continuous query name and begin with a uniquely named source window of the one or more source windows 806. ESPE 800 may or may not be persistent.

Continuous query modeling involves defining directed graphs of windows for event stream manipulation and transformation. A window in the context of event stream manipulation and transformation is a processing node in an event stream processing model. A window in a continuous query can perform aggregations, computations, pattern-matching, and other operations on data flowing through the window. A continuous query may be described as a directed graph of source, relational, pattern matching, and procedural windows. The one or more source windows 806 and the one or more derived windows 808 represent continuously executing queries that generate updates to a query result set as new event blocks stream through ESPE 800. A directed graph, for example, is a set of nodes connected by edges, where the edges have a direction associated with them.

An event object may be described as a packet of data accessible as a collection of fields, with at least one of the fields defined as a key or unique identifier (ID). The event object may be created using a variety of formats including binary, alphanumeric, XML, etc. Each event object may include one or more fields designated as a primary identifier (ID) for the event so ESPE 800 can support operation codes (opcodes) for events including insert, update, upsert, and delete. Upsert opcodes update the event if the key field already exists; otherwise, the event is inserted. For illustration, an event object may be a packed binary representation of a set of field values and include both metadata and field data associated with an event. The metadata may include an opcode indicating if the event represents an insert, update, delete, or upsert, a set of flags indicating if the event is a normal, partial-update, or a retention generated event from retention policy management, and a set of microsecond timestamps that can be used for latency measurements.

An event block object may be described as a grouping or package of event objects. An event stream may be described as a flow of event block objects. A continuous query of the one or more continuous queries 804 transforms a source event stream made up of streaming event block objects published into ESPE 800 into one or more output event streams using the one or more source windows 806 and the one or more derived windows 808. A continuous query can also be thought of as data flow modeling.

The one or more source windows 806 are at the top of the directed graph and have no windows feeding into them. Event streams are published into the one or more source windows 806, and from there, the event streams may be directed to the next set of connected windows as defined by the directed graph. The one or more derived windows 808 are all instantiated windows that are not source windows and that have other windows streaming events into them. The one or more derived windows 808 may perform computations or transformations on the incoming event streams. The one or more derived windows 808 transform event streams based on the window type (that is operators such as join, filter, compute, aggregate, copy, pattern match, procedural, union, etc.) and window settings. As event streams are published into ESPE 800, they are continuously queried, and the resulting sets of derived windows in these queries are continuously updated.

FIG. 9 illustrates a flow chart showing an example process including operations performed by an event stream processing engine, according to some embodiments of the present technology. As noted, the ESPE 800 (or an associated ESP application) defines how input event streams are transformed into meaningful output event streams. More specifically, the ESP application may define how input event streams from publishers (e.g., network devices providing sensed data) are transformed into meaningful output event streams consumed by subscribers (e.g., a data analytics project being executed by a machine or set of machines).

Within the application, a user may interact with one or more user interface windows presented to the user in a display under control of the ESPE independently or through a browser application in an order selectable by the user. For example, a user may execute an ESP application, which causes presentation of a first user interface window, which may include a plurality of menus and selectors such as drop down menus, buttons, text boxes, hyperlinks, etc. associated with the ESP application as understood by a person of skill in the art. As further understood by a person of skill in the art, various operations may be performed in parallel, for example, using a plurality of threads.

At operation 900, an ESP application may define and start an ESPE, thereby instantiating an ESPE at a device, such as machine 220 and/or 240. In an operation 902, the engine container is created. For illustration, ESPE 800 may be instantiated using a function call that specifies the engine container as a manager for the model.

In an operation 904, the one or more continuous queries 804 are instantiated by ESPE 800 as a model. The one or more continuous queries 804 may be instantiated with a dedicated thread pool or pools that generate updates as new events stream through ESPE 800. For illustration, the one or more continuous queries 804 may be created to model business processing logic within ESPE 800, to predict events within ESPE 800, to model a physical system within ESPE 800, to predict the physical system state within ESPE 800, etc. For example, as noted, ESPE 800 may be used to support sensor data monitoring and management (e.g., sensing may include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, or electrical current, etc.).

ESPE 800 may analyze and process events in motion or "event streams." Instead of storing data and running queries against the stored data, ESPE 800 may store queries and stream data through them to allow continuous analysis of data as it is received. The one or more source windows 806 and the one or more derived windows 808 may be created based on the relational, pattern matching, and procedural algorithms that transform the input event streams into the output event streams to model, simulate, score, test, predict, etc. based on the continuous query model defined and application to the streamed data.

In an operation 906, a publish/subscribe (pub/sub) capability is initialized for ESPE 800. In an illustrative embodiment, a pub/sub capability is initialized for each project of the one or more projects 802. To initialize and enable pub/sub capability for ESPE 800, a port number may be provided. Pub/sub clients can use a host name of an ESP device running the ESPE and the port number to establish pub/sub connections to ESPE 800.

FIG. 10 illustrates an ESP system 1000 interfacing between publishing device 1022 and event subscribing devices 1024a-c, according to embodiments of the present technology. ESP system 1000 may include ESP device or subsystem 851, event publishing device 1022, an event subscribing device A 1024a, an event subscribing device B 1024b, and an event subscribing device C 1024c. Input event streams are output to ESP device 851 by publishing device 1022. In alternative embodiments, the input event streams may be created by a plurality of publishing devices. The plurality of publishing devices further may publish event streams to other ESP devices. The one or more continuous queries instantiated by ESPE 800 may analyze and process the input event streams to form output event streams output to event subscribing device A 1024a, event subscribing device B 1024b, and event subscribing device C 1024c. ESP system 1000 may include a greater or a fewer number of event subscribing devices of event subscribing devices.

Publish-subscribe is a message-oriented interaction paradigm based on indirect addressing. Processed data recipients specify their interest in receiving information from ESPE 800 by subscribing to specific classes of events, while information sources publish events to ESPE 800 without directly addressing the receiving parties. ESPE 800 coordinates the interactions and processes the data. In some cases, the data source receives confirmation that the published information has been received by a data recipient.

A publish/subscribe API may be described as a library that enables an event publisher, such as publishing device 1022, to publish event streams into ESPE 800 or an event subscriber, such as event subscribing device A 1024a, event subscribing device B 1024b, and event subscribing device C 1024c, to subscribe to event streams from ESPE 800. For illustration, one or more publish/subscribe APIs may be defined. Using the publish/subscribe API, an event publishing application may publish event streams into a running event stream processor project source window of ESPE 800, and the event subscription application may subscribe to an event stream processor project source window of ESPE 800.

The publish/subscribe API provides cross-platform connectivity and endianness compatibility between ESP application and other networked applications, such as event publishing applications instantiated at publishing device 1022, and event subscription applications instantiated at one or more of event subscribing device A 1024a, event subscribing device B 1024b, and event subscribing device C 1024c.

Referring back to FIG. 9, operation 906 initializes the publish/subscribe capability of ESPE 800. In an operation 908, the one or more projects 802 are started. The one or more started projects may run in the background on an ESP device. In an operation 910, an event block object is received from one or more computing device of the event publishing device 1022.

ESP subsystem 800 may include a publishing client 1002, ESPE 800, a subscribing client A 1004, a subscribing client B 1006, and a subscribing client C 1008. Publishing client 1002 may be started by an event publishing application executing at publishing device 1022 using the publish/subscribe API. Subscribing client A 1004 may be started by an event subscription application A, executing at event subscribing device A 1024a using the publish/subscribe API. Subscribing client B 1006 may be started by an event subscription application B executing at event subscribing device B 1024b using the publish/subscribe API. Subscribing client C 1008 may be started by an event subscription application C executing at event subscribing device C 1024c using the publish/subscribe API.

An event block object containing one or more event objects is injected into a source window of the one or more source windows 806 from an instance of an event publishing application on event publishing device 1022. The event block object may generated, for example, by the event publishing application and may be received by publishing client 1002. A unique ID may be maintained as the event block object is passed between the one or more source windows 806 and/or the one or more derived windows 808 of ESPE 800, and to subscribing client A 1004, subscribing client B 1006, and subscribing client C 1008 and to event subscription device A 1024a, event subscription device B 1024b, and event subscription device C 1024c. Publishing client 1002 may further generate and include a unique embedded transaction ID in the event block object as the event block object is processed by a continuous query, as well as the unique ID that publishing device 1022 assigned to the event block object.

In an operation 912, the event block object is processed through the one or more continuous queries 804. In an operation 914, the processed event block object is output to one or more computing devices of the event subscribing devices 1024a-c. For example, subscribing client A 1004, subscribing client B 1006, and subscribing client C 1008 may send the received event block object to event subscription device A 1024*a*, event subscription device B 1024*b*, and event subscription device C 1024*c*, respectively.

ESPE 800 maintains the event block containership aspect of the received event blocks from when the event block is published into a source window and works its way through the directed graph defined by the one or more continuous queries 804 with the various event translations before being output to subscribers. Subscribers can correlate a group of subscribed events back to a group of published events by comparing the unique ID of the event block object that a publisher, such as publishing device 1022, attached to the event block object with the event block ID received by the subscriber.

In an operation 916, a determination is made concerning whether or not processing is stopped. If processing is not stopped, processing continues in operation 910 to continue receiving the one or more event streams containing event block objects from the, for example, one or more network devices. If processing is stopped, processing continues in an operation 918. In operation 918, the started projects are stopped. In operation 920, the ESPE is shutdown.

As noted, in some embodiments, big data is processed for an analytics project after the data is received and stored. In other embodiments, distributed applications process continuously flowing data in real-time from distributed sources by applying queries to the data before distributing the data to geographically distributed recipients. As noted, an event stream processing engine (ESPE) may continuously apply the queries to the data as it is received and determines which entities receive the processed data. This allows for large amounts of data being received and/or collected in a variety of environments to be processed and distributed in real time. For example, as shown with respect to FIG. 2, data may be collected from network devices that may include devices within the internet of things, such as devices within a home automation network. However, such data may be collected from a variety of different resources in a variety of different environments. In any such situation, embodiments of the present technology allow for real-time processing of such data.

Aspects of the current disclosure provide technical solutions to technical problems, such as computing problems that arise when an ESP device fails which results in a complete service interruption and potentially significant data loss. The data loss can be catastrophic when the streamed data is supporting mission critical operations such as those in support of an ongoing manufacturing or drilling operation. An embodiment of an ESP system achieves a rapid and seamless failover of ESPE running at the plurality of ESP devices without service interruption or data loss, thus significantly improving the reliability of an operational system that relies on the live or real-time processing of the data streams. The event publishing systems, the event subscribing systems, and each ESPE not executing at a failed ESP device are not aware of or effected by the failed ESP device. The ESP system may include thousands of event publishing systems and event subscribing systems. The ESP system keeps the failover logic and awareness within the boundaries of out-messaging network connector and out-messaging network device.

In one example embodiment, a system is provided to support a failover when event stream processing (ESP) event blocks. The system includes, but is not limited to, an out-messaging network device and a computing device. The computing device includes, but is not limited to, a processor and a computer-readable medium operably coupled to the processor. The processor is configured to execute an ESP engine (ESPE). The computer-readable medium has instructions stored thereon that, when executed by the processor, cause the computing device to support the failover. An event block object is received from the ESPE that includes a unique identifier. A first status of the computing device as active or standby is determined. When the first status is active, a second status of the computing device as newly active or not newly active is determined. Newly active is determined when the computing device is switched from a standby status to an active status. When the second status is newly active, a last published event block object identifier that uniquely identifies a last published event block object is determined. A next event block object is selected from a non-transitory computer-readable medium accessible by the computing device. The next event block object has an event block object identifier that is greater than the determined last published event block object identifier. The selected next event block object is published to an out-messaging network device. When the second status of the computing device is not newly active, the received event block object is published to the out-messaging network device. When the first status of the computing device is standby, the received event block object is stored in the non-transitory computer-readable medium.

Figure 11:
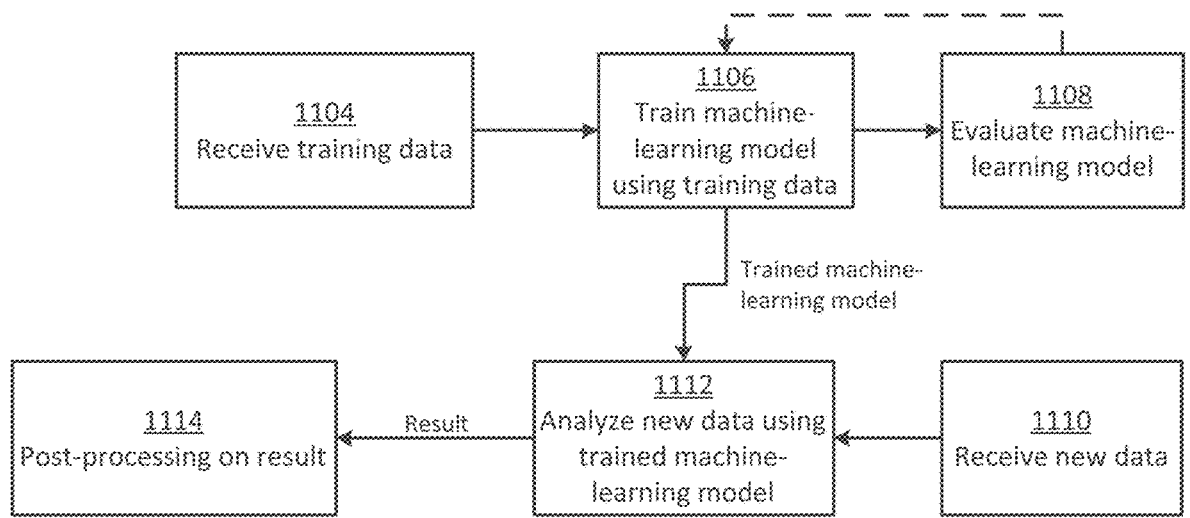
FIG. 11 illustrates a flow chart showing an example process of generating and using a machine-learning model according to some aspects.

FIG. 11 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Naïve bias classifiers, logistic regression classifiers, ridge regression classifiers, random forest classifiers, least absolute shrinkage and selector (LASSO) classifiers, and support vector machines; (iv) clusterers, such as k-means clusterers, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, N.C.

Machine-learning models can be constructed through an at least partially automated (e.g., with little or no human involvement) process called training. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 11.

In block 1104, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 1106, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 1108, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if the machine-learning model has an inadequate degree of accuracy for a particular task, the process can return to block 1106, where the machine-learning model can be further trained using additional training data or otherwise modified to improve accuracy. If the machine-learning model has an adequate degree of accuracy for the particular task, the process can continue to block 1110.

In block 1110, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 1112, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 1114, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 12:
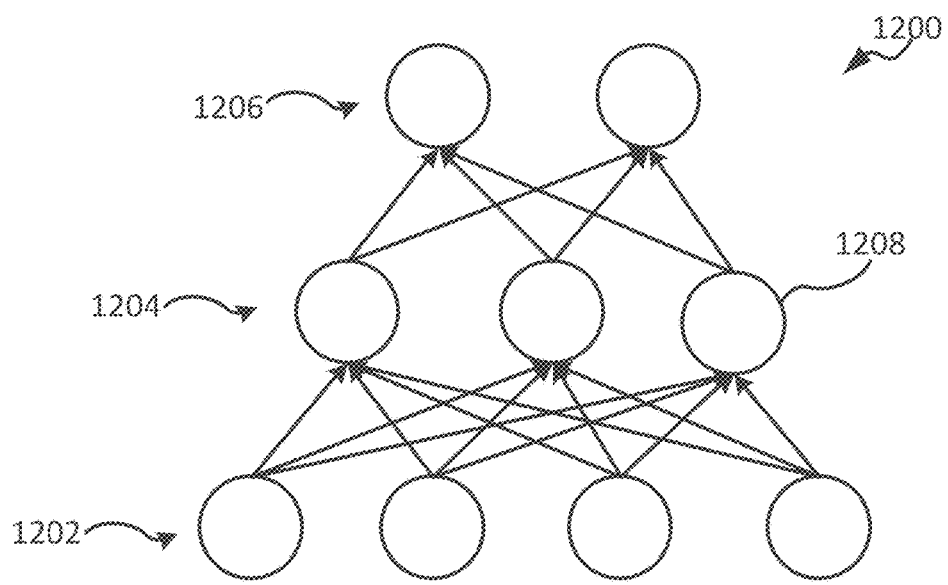
FIG. 12 illustrates an example machine-learning model based on a neural network.

A more specific example of a machine-learning model is the neural network 1200 shown in FIG. 12. The neural network 1200 is represented as multiple layers of interconnected neurons, such as neuron 1208, that can exchange data between one another. The layers include an input layer 1202 for receiving input data, a hidden layer 1204, and an output layer 1206 for providing a result. The hidden layer 1204 is referred to as hidden because it may not be directly observable or have its input directly accessible during the normal functioning of the neural network 1200. Although the neural network 1200 is shown as having a specific number of layers and neurons for exemplary purposes, the neural network 1200 can have any number and combination of layers, and each layer can have any number and combination of neurons.

The neurons and connections between the neurons can have numeric weights, which can be tuned during training. For example, training data can be provided to the input layer 1202 of the neural network 1200, and the neural network 1200 can use the training data to tune one or more numeric weights of the neural network 1200. In some examples, the neural network 1200 can be trained using backpropagation. Backpropagation can include determining a gradient of a particular numeric weight based on a difference between an actual output of the neural network 1200 and a desired output of the neural network 1200. Based on the gradient, one or more numeric weights of the neural network 1200 can be updated to reduce the difference, thereby increasing the accuracy of the neural network 1200. This process can be repeated multiple times to train the neural network 1200. For example, this process can be repeated hundreds or thousands of times to train the neural network 1200.

In some examples, the neural network 1200 is a feed-forward neural network. In a feed-forward neural network, every neuron only propagates an output value to a subsequent layer of the neural network 1200. For example, data may only move one direction (forward) from one neuron to the next neuron in a feed-forward neural network.

In other examples, the neural network 1200 is a recurrent neural network. A recurrent neural network can include one or more feedback loops, allowing data to propagate in both forward and backward through the neural network 1200. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 1200 operates by receiving a vector of numbers from one layer; transforming the vector of numbers into a new vector of numbers using a matrix of numeric weights, a nonlinearity, or both; and providing the new vector of numbers to a subsequent layer of the neural network 1200. Each subsequent layer of the neural network 1200 can repeat this process until the neural network 1200 outputs a final result at the output layer 1206. For example, the neural network 1200 can receive a vector of numbers as an input at the input layer 1202. The neural network 1200 can multiply the vector of numbers by a matrix of numeric weights to determine a weighted vector. The matrix of numeric weights can be tuned during the training of the neural network 1200. The neural network 1200 can transform the weighted vector using a nonlinearity, such as a sigmoid tangent or the hyperbolic tangent. In some examples, the nonlinearity can include a rectified linear unit, which can be expressed using the equation $y=\max(x, 0)$ where y is the output and x is an input value from the weighted vector. The transformed output can be supplied to a subsequent layer, such as the hidden layer 1204, of the neural network 1200. The subsequent layer of the neural network 1200 can receive the transformed output, multiply the transformed output by a matrix of numeric weights and a nonlinearity, and provide the result to yet another layer of the neural network 1200. This process continues until the neural network 1200 outputs a final result at the output layer 1206.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the communications grid computing system 400 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network to analyze the data using fewer processing cycles and less memory than other approaches, while obtaining a similar or greater level of accuracy.

Figure 13A:
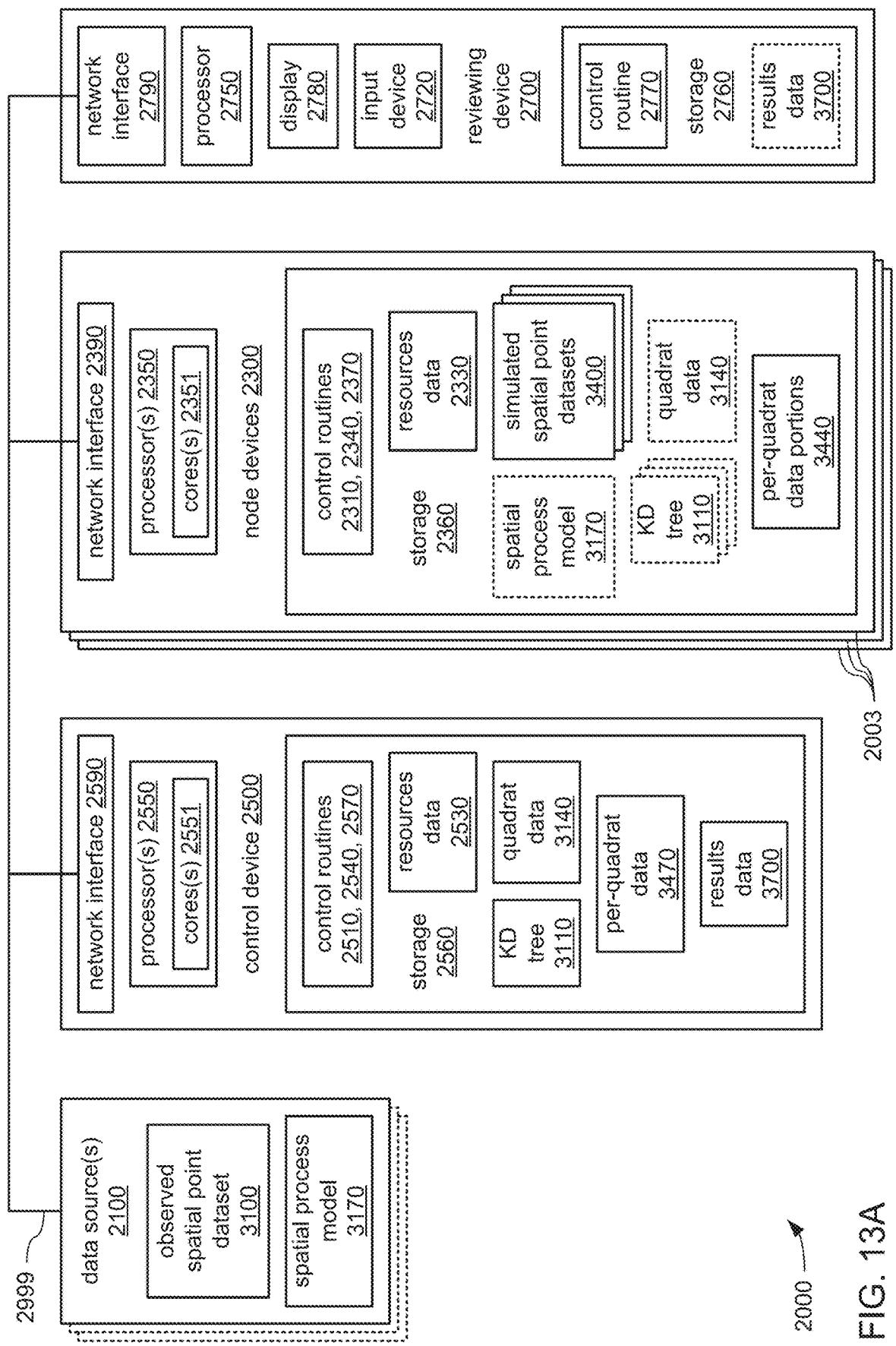
FIGS. 13A and 13B each illustrate an example embodiment of a processing system.
Figure 13B:
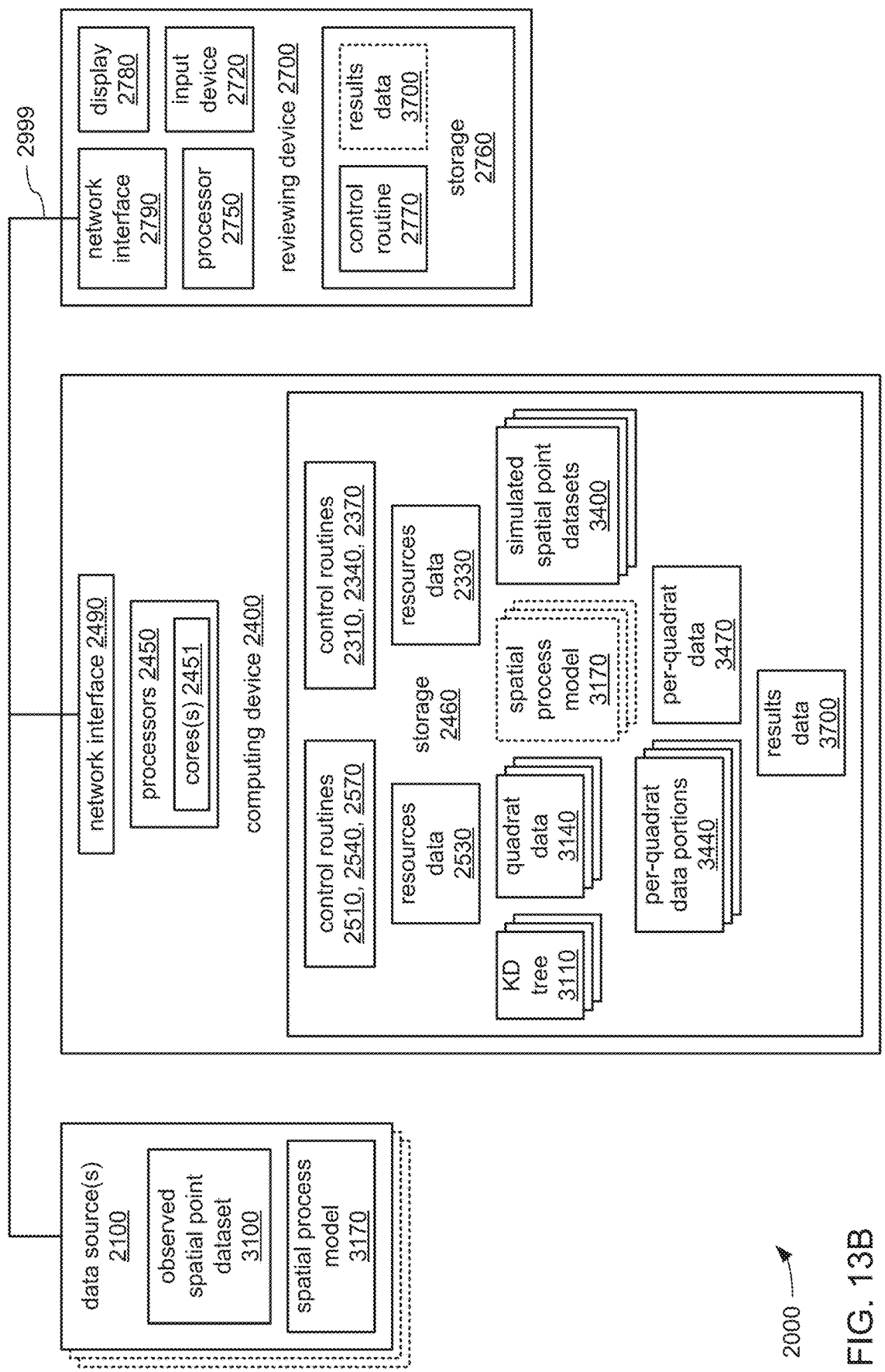
Figure 14A:
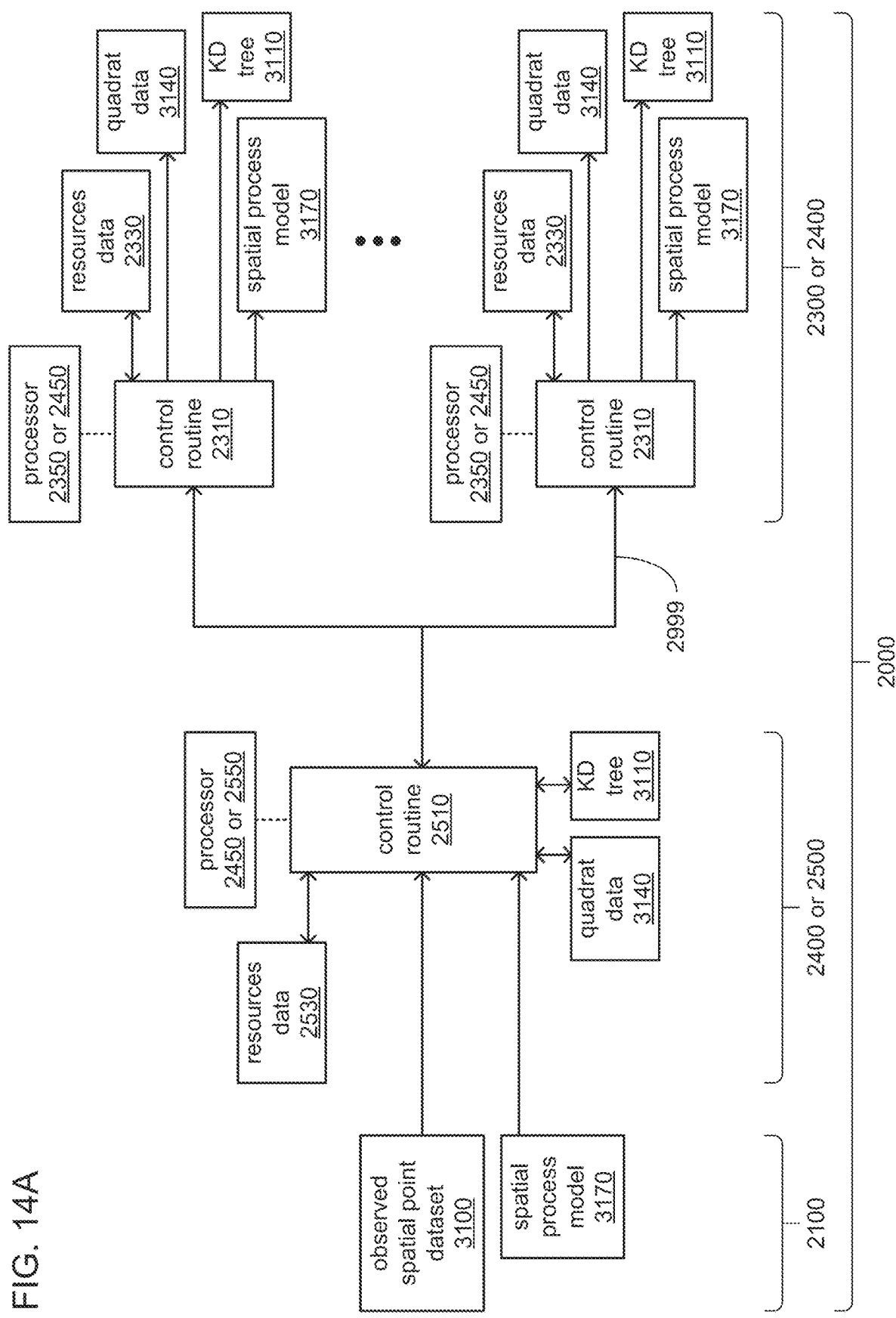
FIGS. 14A, 14B and 14C, together, illustrate an overview of an example of operating either of the example embodiments of a processing system of either of FIG. 13A or 13B.
Figure 14B:
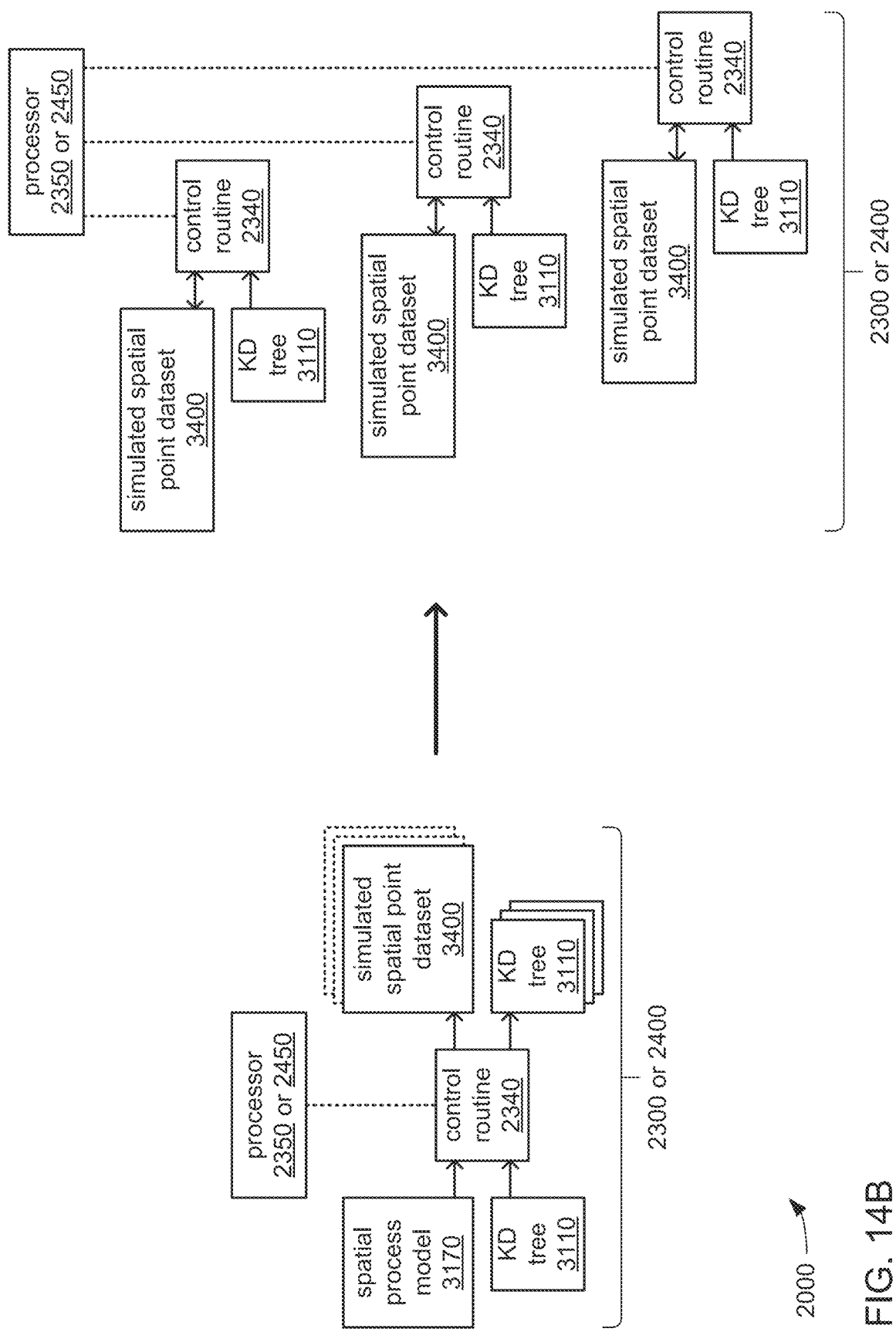
Figure 14C:
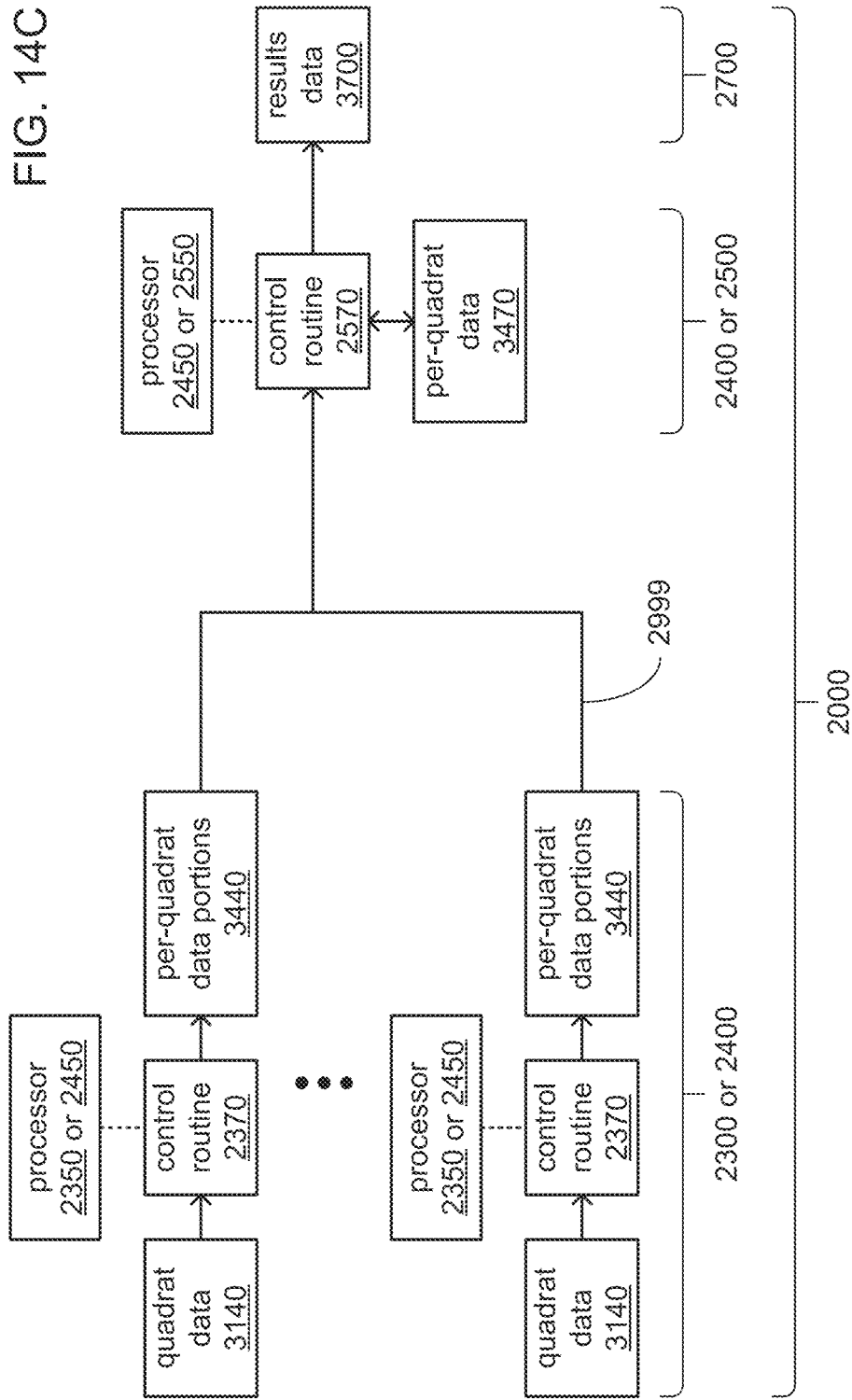

FIGS. 13A and 13B illustrate two different example embodiments of a processing system 2000, and FIGS. 14A, 14B and 14C, together, illustrate an example of the operation of either of these embodiments of the processing system 2000. More specifically, FIG. 13A illustrates a block diagram of an example embodiment of a distributed processing system 2000 incorporating one or more data sources 2100, one or more node devices 2300 that may form a node device grid 2003, at least one control device 2500, and/or at least one requesting device 2700 coupled by a network 2999. FIG. 13B illustrates a block diagram of an alternate example embodiment of a non-distributed processing system 2000 in which the processing functionality of the one or more node devices 2300 and the at least one control device is incorporated into a single computing device 2400. FIG. 14A illustrates aspects of operating embodiments of the processing system 2000 of either FIG. 13A or 13B to perform various initial operations of a goodness-of-fit test of a spatial process model 3170 that was earlier fitted to observed spatial point dataset 3100. FIG. 14B illustrates aspects of operating embodiments of the processing system 2000 of either FIG. 13A or 13B to perform, in parallel, multiple iterations of both generating and using simulated spatial point datasets 3400 as part of performing the goodness-of-fit test. FIG. 14C illustrates aspects of collecting and combining results of the multiple iterations to derive and use one or more residual values to determine whether the goodness-of-fit is sufficient.

Turning to FIG. 13A, the data sources 2100 may each be any of a variety of devices (or may include a set of any of a variety of devices) that may generate and/or store one or more observed spatial point datasets 3100, and/or one or more spatial process models 3170. One or more of the data sources 2100 may include one or more storage devices operated by a commercial, academic or governmental entity that may generate and/or provide online access to data (e.g., access via the Internet) as a service, such as an online library, online data streaming service, online archives of official government data, etc. An example of such storage devices may be interconnected sets of computing devices across which large datasets may be stored in a distributed and/or redundant manner to better enable reliable and/or speedier access.

Alternatively or additionally, one or more of the data sources 2100 may be network-connected devices serving various functions within one or more larger systems of network-connected devices installed within houses or other structures, and/or installed across a geographical area. An example of such network-connected devices may be consumer appliances coupled to the Internet (such that they may be deemed to be "online") to form part of what is often referred to as an "Internet of things." Another example of such network-connected devices may be utility service equipment installed at the location of multiple houses and/or other structures as part of a utility system for the provision of electric power, water, natural gas, telecommunications, Internet access, etc., such as metering devices, devices at substations and/or types of distribution point, etc. Still another example of such network-connected devices may be geological and/or meteorological sensor devices positioned about a geographical area to gather seismic and/or weather data. It may be that such network-connected devices include varieties of controlling devices that gather data generated by other network-connected devices associated with particular houses and/or other structures, and aggregate that data into observed spatial point datasets 3100 for later access and use.

Each of the observed spatial point datasets 3100 may include any of a wide variety of types of data associated with any of a wide variety of subjects, including observation data concerning occurrences of a particular event across a predetermined geographic, nautical, aeronautical and/or astronomical region. By way of example, one or more observed spatial point datasets 3100 may include recorded observations concerning geological and/or meteorological events, or recorded observations from laboratory experiments in areas such as particle physics. By way of another example, one or more observed spatial point datasets 3100 may include indications of activities performed by a random sample of individuals of a population of people in a selected nationality or municipality, or of a population of a threatened species under study in the wild. By way of still another example, one or more observed spatial point datasets 3100 may include data collected from various sensors employed in the routine monitoring of various weather conditions or the routine monitoring of consumer appliances and/or machinery performing their functions, or from various sensors employed in monitoring aspects of environmental events and/or laboratory experiments.

As will be explained in greater detail, the data source(s) 2100, the node device(s) 2300, the control device 2500 and/or the requesting device 2700 may cooperate through the network 2999 to perform a goodness-of-fit test of a spatial process model 3170 that has been fitted to an observed spatial point dataset 3100. In so doing, a KD tree 3110 and quadrat data 3140 may be generated from the observed spatial point dataset 3100, and then copies thereof may distributed among the one or more node devices 2300, along with copies of the spatial process model 3170, under the control of the control device 2500 and through the network 2999.

In various embodiments, the network 2999 may be a single network that may extend within a single building or other relatively limited area, may be a combination of connected networks that may extend a considerable distance (e.g., include the Internet), and/or may include the Internet of Things as well as the use or employment of acoustic and non-acoustic measures (or combination). Thus, the network 2999 may be based on any of a variety (or combination) of non-acoustic communications technologies by which communications may be effected, including without limitation, wired technologies employing electrically and/or optically conductive cabling, and wireless technologies employing infrared, laser, radio frequency (RF) or other forms of wireless transmission and/or reception employing passive and/or active techniques. Alternatively or additionally, the communications technologies employed may include acoustic conductance through one or more forms of gaseous, liquid and/or solid media.

In various embodiments, each of the multiple node devices 2300 may incorporate one or more processors 2350, a storage 2360, and/or a network interface 2390 to couple each of the node devices 2300 to the network 2999. The processor(s) 2350 may incorporate multiple processing cores 2351 and/or other features to support the execution of multiple executable routines and/or multiple instances of executable routine(s) across multiple execution threads. The storage 2360 may store control routines 2310, 2340 and/or 2370; resources data 2330; multiple copies of the KD tree 3110; a copy of the quadrat data 3140; a copy of the spatial process model 3170; multiple different simulated spatial point datasets 3400; and/or per-quadrat data portions 3440. Each of the control routines 2310, 2340 and 2370 may incorporate a sequence of instructions operative on the processor(s) 2350 to implement logic to perform various functions.

In various embodiments, the control device 2500 may incorporate one or more processors 2550, a storage 2560, and/or a network interface 2590 to couple the control device 2500 to the network 2999. The processor(s) 2550 may incorporate multiple processing cores 2551 and/or other features to support the execution of multiple executable routines and/or multiple instances of executable routine(s) across multiple execution threads. The storage 2560 may store control routines 2510, 2540 and/or 2570; resources data 2530; a copy of the KD tree 3110; a copy of the quadrat data 3140; per-quadrat data 3470; and/or results data 3700. Each of the control routines 2510, 2540 and 2570 may incorporate a sequence of instructions operative on the processor(s) 2550 to implement logic to perform various functions.

In various embodiments, the requesting device 2700 may incorporate one or more processors 2750, a storage 2760, an input device 2720, a display 2780, and/or a network interface 2790 to couple the requesting device 2700 to the network 2999. The storage 2760 may store a control routine 2770 and/or the results data 3700.

Turning to FIG. 14A, in addition to FIG. 13A, one or more data source(s) 2100, one or more node device(s) 2300, the control device 2500 and/or the requesting device 2700 may cooperate through the network 2999 to perform a goodness-of-fit test to evaluate the fitting of the spatial process model 3170 to the spatial process that generated the observation data within the observed spatial point dataset 3100.

In executing the control routine 2510, the processor(s) 2550 of the control device 2500 may perform various initial operations of the goodness-of-fit test, as well as to coordinate the performances of more of such initial operations performed by the node device(s) 2300. More specifically, processor(s) 2550 of the control device 2500 may cooperate with the data source(s) 2100 to receive a copy of the observed spatial point dataset 3100 and a copy of the spatial process model 3170 therefrom through the network 2999. As previously discussed, the observed spatial point dataset 3100 may include observation data specifying locations within a particular region (e.g., a specified area or volume) at which instances of a particular event were observed to have occurred. Upon receiving the observed spatial point dataset 3100, the processor(s) 2550 may be caused to derive a set of multiple quadrats into which the particular region may be divided, and may store indications of locations and/or boundaries of each of those quadrats as the quadrat data 3140.

As also previously discussed, the observed spatial point dataset 3100 may include further observation data specifying covariate values for each of the specified locations. The covariate values for each specified location may include one or move values descriptive of aspect(s) of that location, itself, and/or may include one or more values descriptive of aspect(s) of the instance of the particular event that occurred there. In preparation for subsequent nearest neighbor processing operations that are to be performed by the node device(s) 2300 (as will be described in greater detail), the processor(s) 2550 may be caused by further execution of the control routine 2510 to generate a copy of the KD tree 3110 from the observed spatial point dataset 3100. Within the KD tree 3110, at least a subset of the observation data of the observed spatial point dataset 3100 may be organized in a tree-like data structure in a manner that correlates each specified location (of at least a subset of the specified locations) with at least a subset of its corresponding covariate values.

As will be recognized by those skilled in the art, it may be that the processing resources provided by the node devices 2300 may be shared in a manner in which the overall distributed processing abilities of the distributed processing system 2000 of FIG. 13A may also be allocated to the performance of one or more jobs having no connection with the performance of the goodness-of-fit test of the spatial process model 3170. Therefore, it may be that the availabilities of the various processing resources of each one of the node devices 2300 is subject to dynamic change. To address this, the processor(s) 2550 may be caused to recurringly receive indications from each of the node devices 2300 of the level of availability of the various processing resources of each, and may store indications of those levels of availability (with recurring updates) as the resources data 2530. In continuing to execute the control routine 2510, the processor(s) 2550 may be caused to refer to the resources data 2530 to recurringly reassess which ones of the node devices 2300 have sufficient processing resources available to be assigned to perform iterative portions of the goodness-of-fit test. Accordingly, the processor(s) 2550 may be caused to provide copies of the KD tree 3110, the quadrat data 3140 and/or the spatial process model 3170, via the network 2999, to each of the node devices 2300 that are deemed to have such sufficient processing resources available.

Within each of the node devices 2300, execution of a copy of the control routine 2310 therein may cause a processor 2350 of that node device 2300 to maintain indications of currently available processing resources within that node device 2300 (with recurring updates) as an instance of the resources data 2330, and to recurringly transmit indications of the availability of each of such processing resources to the control device 2500 via the network 2999. As previously discussed, the performance of the goodness-of-fit test may entail the performance of multiple iterations of a combination of generating and using one of multiple simulated spatial point datasets 3400, and the performance of each such iteration may be assigned to one of the processors 2350 of the node devices 2300. Further, there may be multiple ones of such iterations being performed in parallel by multiple ones of the processors 2350 across multiple ones of the node devices 2300. To accommodate this, the indications of availability of processing resources that are transmitted from each of the node devices 2300 to the control device 2500 may include indications of the level of availability of each one of the one or more processors 2350 within each of the node devices 2300.

As also previously discussed, the performance of each iteration of the multiple iterations may entail the use of the corresponding one of the simulated spatial point datasets 3400 generated therein as an input to numerous nearest neighbor processing operations that may be performed in parallel across multiple execution threads supported by the one of the processors 2350 to which that iteration is assigned. Further, and as also previously discussed, the level of availability of processing resources of each of the processors 2350 may be dynamically changing, and this may result in dynamic changes in the quantity of execution threads of each processor 2350 that are available over time. To accommodate this, the indications of availability of processing resources that are transmitted from each of the node devices 2300 to the control device 2500 may include indications of quantities of available execution threads for each processor 2350. Such indications of quantities of execution threads of each of the processors 2350 that are currently available across all of the node devices 2300 may be taken into account within the control device 2500 in determining which node device(s) 2300 have processor(s) 2350 with sufficient availability of execution threads for performing iteration(s) of the goodness-of-fit test.

Turning to FIG. 14B, in addition to FIG. 13A, where a processor 2350 of one of the node devices 2300 has been selected to perform at least one of the iterations of the goodness-of-fit test (again, in embodiments where there are processors 2350 able to support numerous execution threads, such processors 2350 may be selected to perform multiple iterations in parallel), that node device 2300 may be provided with a copy of each of the KD tree 3110, the quadrat data 3140 and/or the spatial process model 3170 from the control device 2500 through the network 2999 as previously discussed. Within that node device 2300, execution of a copy of the control routine 2340 therein may cause that processor 2350 to perform the at least one iteration, beginning with using the copy of the spatial process model 3170 to generate a separate simulated spatial point dataset 3400 for each iteration of that at least one iteration.

That processor 2350 may also be caused to replicate the single received copy of the KD tree 3110 into enough copies to provide a separate copy thereof for each available execution thread of that processor 2350. In this way, and as previously discussed, competition among the multiple execution threads of that processor 2350 for access to a single copy of the KD tree 3110 while performing nearest neighbor processing operations between the simulated locations of a simulated spatial point dataset 3400 and the locations of the KD tree 3110 is avoided. Additionally, in some embodiments, and as depicted with dotted lines, it may be that multiple copies of the simulated spatial point dataset 3400 of each iteration are also generated to avoid similar competition for access to it among those same multiple execution threads.

Additionally, and although not specifically shown, further execution of the control routine 2340 may cause ongoing cooperation with the control device 2500 through the network 2999 to continue monitoring the availability of processing resources associated with each processor 2350 among the multiple node devices 2300, and to provide ongoing coordination of the performances of the multiple iterations of both generation and use of simulated spatial point datasets 3400. More specifically, the processor(s) 2550 of the control device 2500 may be caused by execution of the control routine 2540 to recurringly reassess which one of the processors 2350 should be assigned to perform the next iteration(s) based on current levels of available processing resources for each of the processors 2350, including quantities of available execution threads for each. Further, each of the processors 2350 currently engaged in the performance of at least one of the iterations may provide an indication of having reached a predetermined point in each of such performances by transmitting an inquiry to the control device 2550 concerning whether the predetermined quantity of iterations has yet been performed and/or should that processor 2350 proceed with performing another iteration following completion of a current iteration.

Turning to FIG. 14C, in addition to FIG. 13A, as previously discussed, upon completion of the numerous nearest neighbor processing operations across multiple execution threads of a single processor 2350 as part of performing a single iteration assigned to that processor 2350, interpolation of covariate values may be performed between the simulated locations of the corresponding simulated spatial point dataset 3400 and their identified nearest neighbors among the locations specified in the KD tree. Following such interpolation operations, further execution of the control routine 2370 may cause that single processor 2350 to use a copy of the quadrat data 3140 specifying quadrat locations and/or boundaries to derive per-quadrat counts and/or other per-quadrat values, and to store those as an instance of per-quadrat data portions 3440. That processor 2350 may then be caused to provide that instance of per-quadrat data portions 3440 to the control device 2500.

Within the control device 2500, execution of the control routine 2570 may cause processor(s) 2550 of the control device 2500 to receive each instance of per-quadrat data portions 3440, and to combine the per-quadrat counts and/or other per-quadrat values with others that were previously received to generate the per-quadrat data 3470. Following the receipt of each of the per-quadrat data portions 3440 corresponding to all of the simulated spatial point datasets 3400 that have been generated and used across all of the iterations, the processor(s) 2550 of the control device may use the resulting per-quadrat values of the per-quadrat data 3470 to derive various goodness-of-fit statistics, Pearson residual values, p-values and/or other residual values, which may be stored as part of the results data 3700. The processor(s) 2550 may then be caused to compare one or more of those derived values to one or more predetermined threshold values to determine whether the level of goodness-of-fit of the spatial process model 3170 is sufficient.

Comparing FIGS. 13A and 13B, as an alternative to the distributed processing system 2000 of FIG. 13A that includes multiple node device(s) 2300 that provide processors 2350 among which many of the operations for goodness-of-fit may be performed in parallel (as described), it may instead be the case that such parallel performances are to be distributed across multiple processors 2450 of the single computing device 2400 in the processing system 2000 of FIG. 13B. More specifically, it may be that one of the processors 2450 may execute the control routines 2510, 2540 and 2570 (in much the same way as described above for processor(s) 2550 of the control device 2500) to thereby coordinate the activities of multiple other processors 2450, which may each execute the control routines 2310, 2340 and 2370 (in much the same way as described above for processors 2350 of the node devices 2300) to each perform one or more of the iterations of the goodness-of-fit test.

Figure 15A:
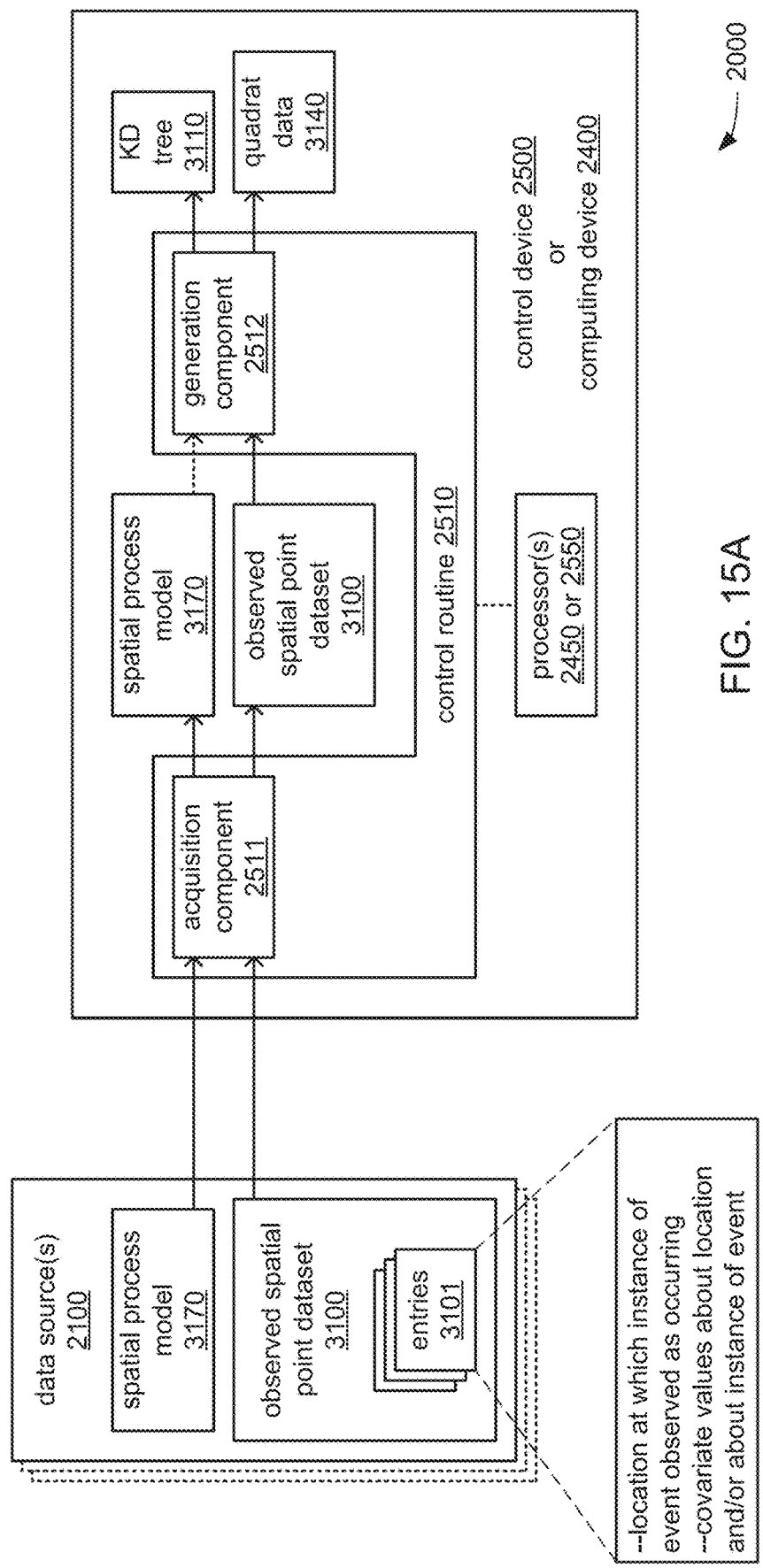
FIGS. 15A, 15B, 15C, 15D, 15E and 15F, together, illustrate, in greater detail, aspects of the initial operations for which FIGS. 14A and 14B provided an overview.
Figure 15B:
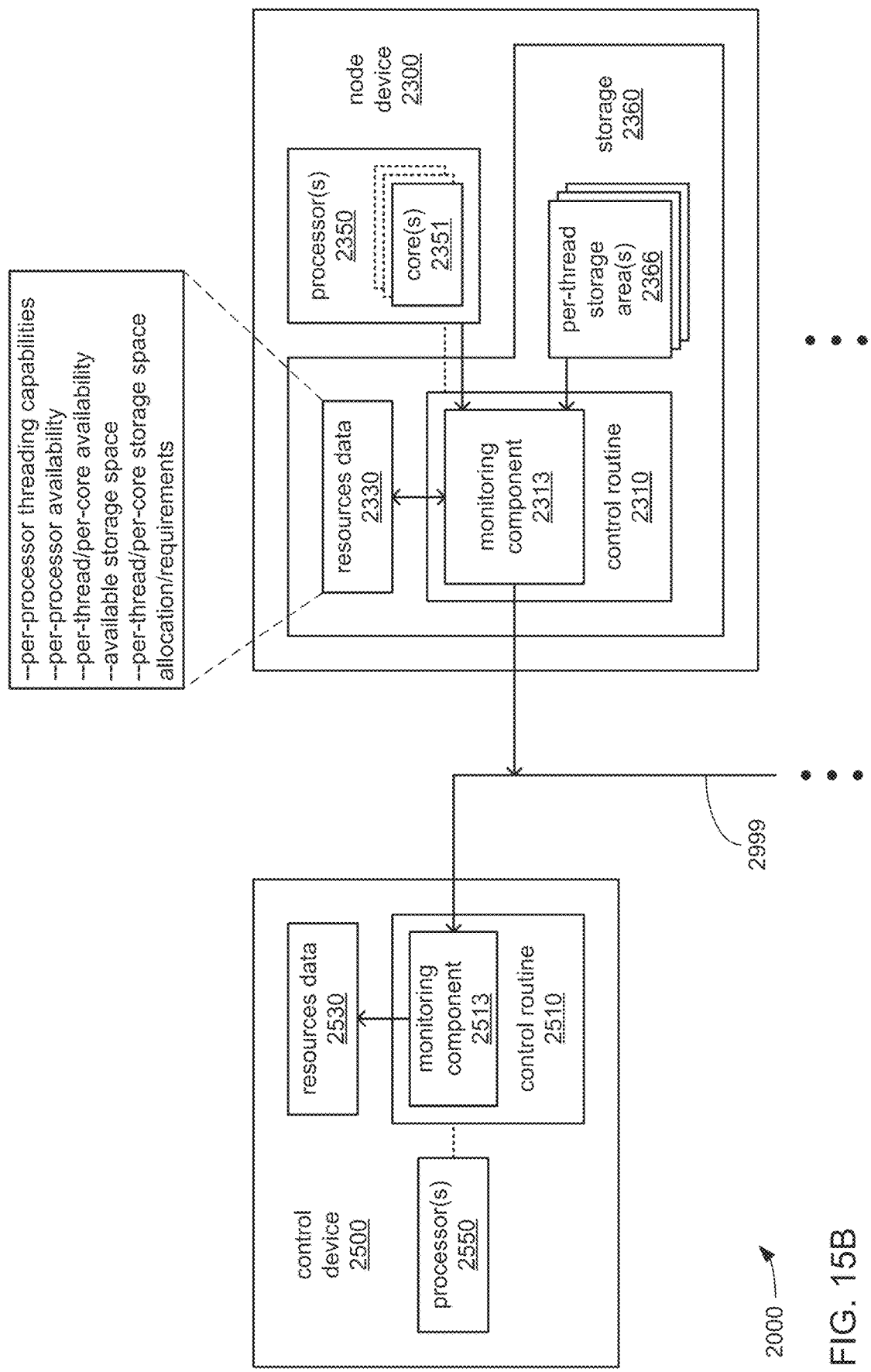
Figure 15C:
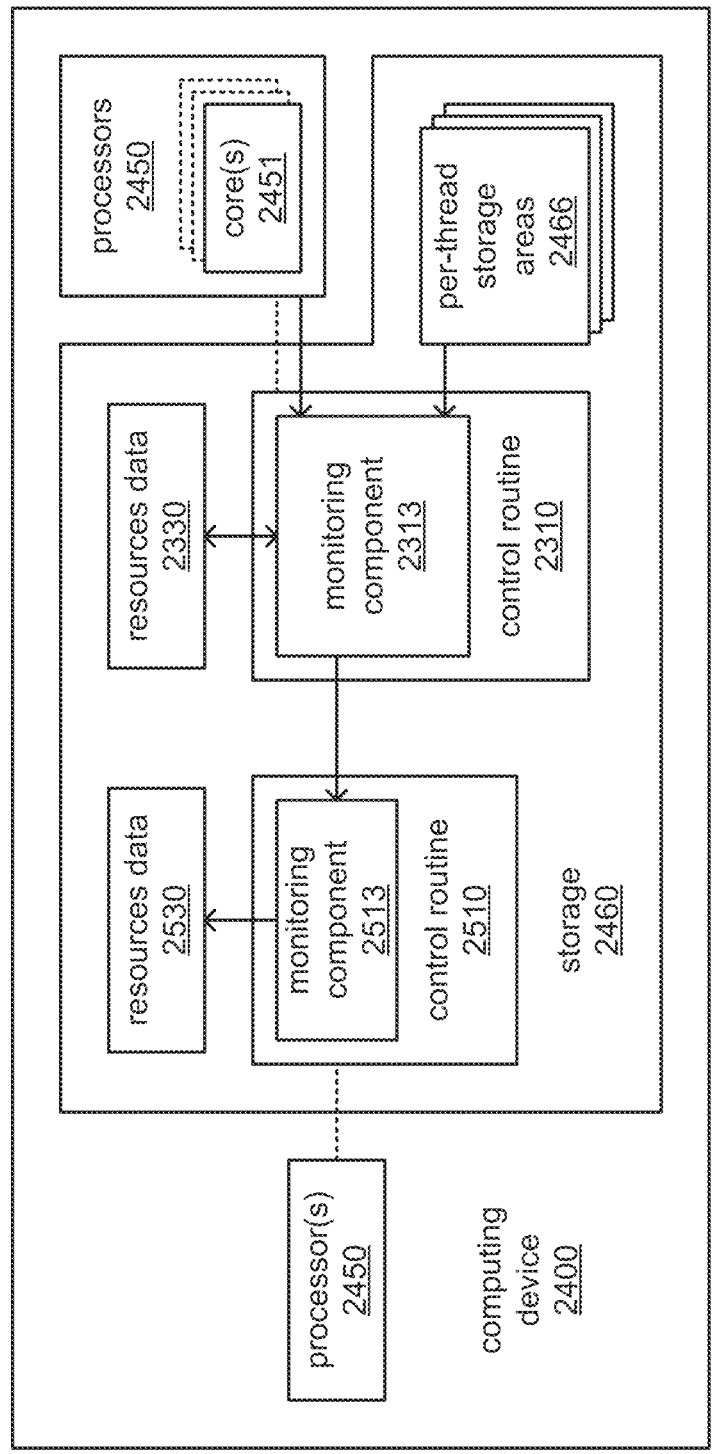
Figure 15D:
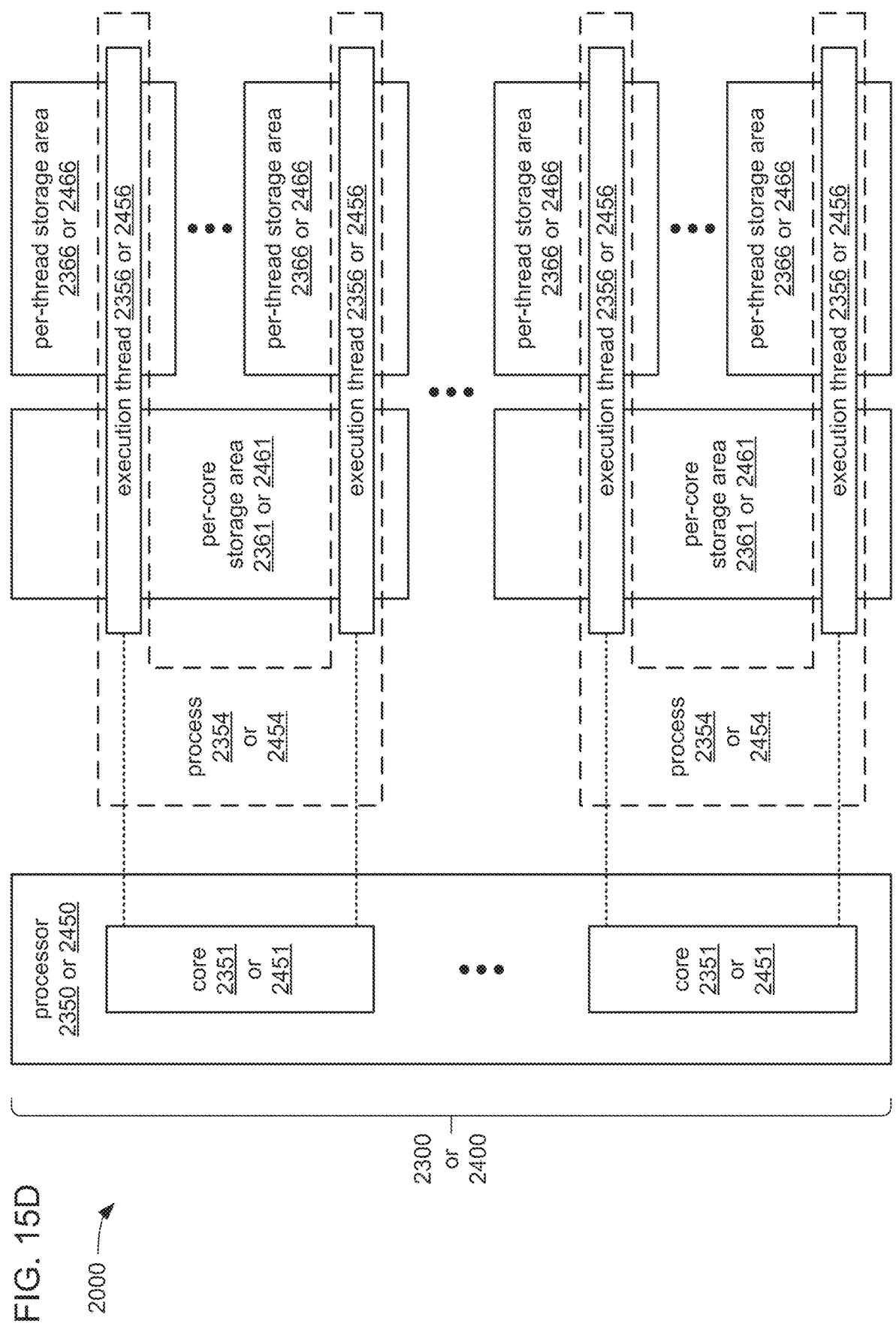
Figure 15E:
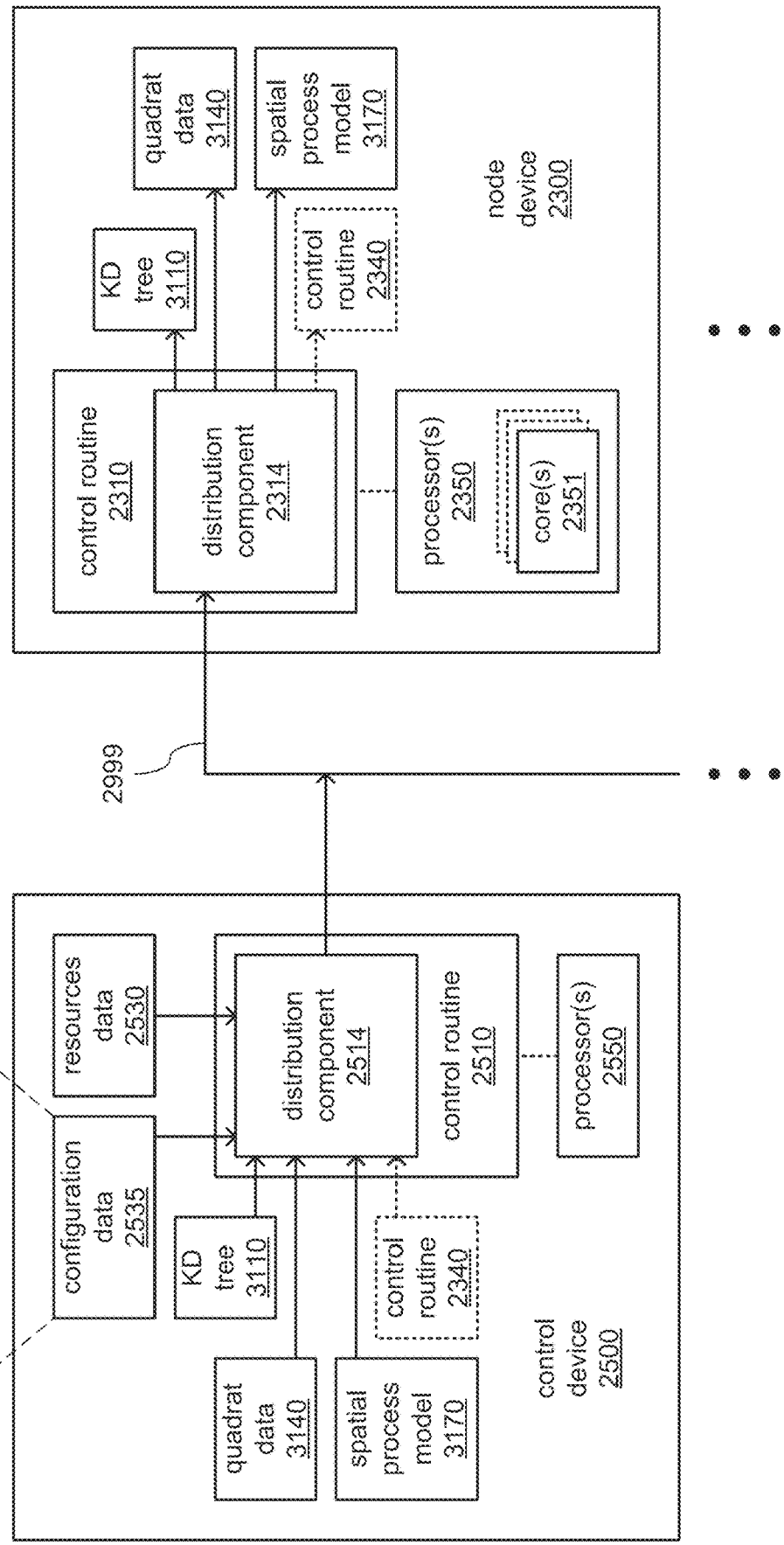
Figure 15F:
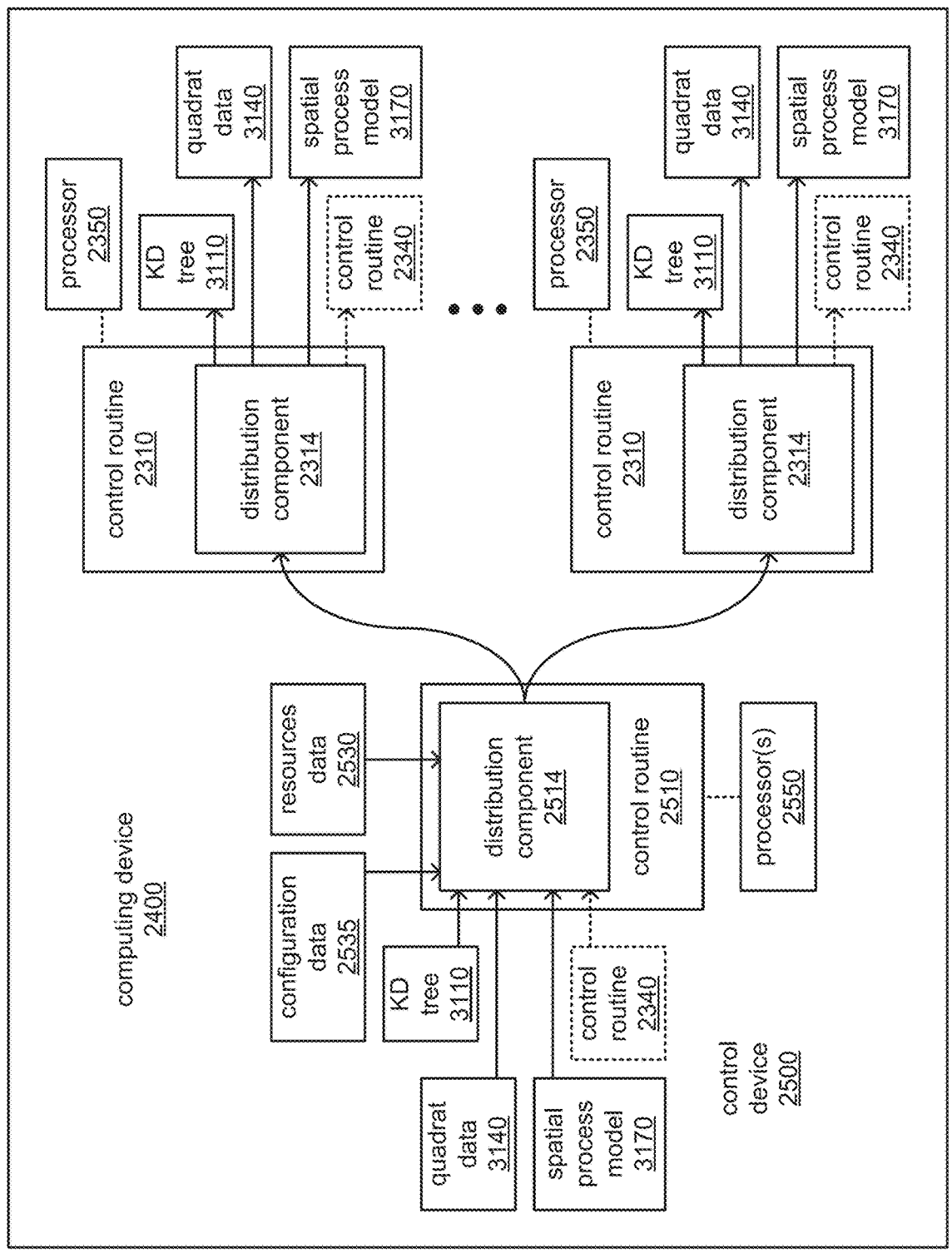

FIGS. 15A, 15B, 15C, 15D, 15E and 15F, taken together, illustrate further aspects of embodiments of the initial operations of FIG. 14A in greater detail. FIGS. 16A, 16B, 16C, 16D and 16E, taken together, illustrate further aspects of embodiments of the parallel performance of the multiple iterations of FIGS. 14B-C in greater detail. More specifically, FIGS. 15A-D are block diagrams depicting further aspects of gathering various pieces of data in preparation for the performance of the multiple iterations of both generating and using simulated spatial point datasets 3400 in performing a goodness of fit test of a spatial process model 3170. FIGS. 15E-F are block diagrams depicting further aspects of selecting and provisioning multiple processors 2350 (and/or cores 2351 thereof), or multiple processors 2450 (and/or cores 2451 thereof). FIGS. 16A-E are block diagrams depicting further aspects of using the selected and provisioned processors 2350 or 2450 (or cores 2351 or 2451 thereof, respectively) to perform the multiple iterations, including the numerous performances of nearest neighbor operations, in a two level parallel manner.

Turning to FIG. 15A, in addition to FIG. 14A, processor(s) 2550 of the control device 2500 or processor(s) 2450 of the computing device 2400 may be caused by execution of an acquisition component 2511 of the control routine 2510 to cooperate with the one or more data source(s) 2100 through the network 2999 to retrieve an observed spatial point dataset 3100 and a spatial process model 3170. As depicted, the observed spatial point dataset 3100 may employ an array-like data structure incorporating numerous entries 3101 (e.g., a table, comma-separated list, or other form of two-dimensional array), where each entry 3101 may include an indication of a location within a particular region at which an instance of a particular type of event is observed to have occurred, along with covariate values concerning that location and/or concerning that instance of the event.

It should be noted that, in some embodiments, one or both of the observed spatial point dataset 3100 and the spatial process model 3170 may include an indication of the size, shape, boundaries and/or location of the particular region. Alternatively or additionally, the data source(s) 2100 may include a separate piece of data (not shown) that provides such information, that the processor(s) 2450 or 2550 may be caused by further execution of the acquisition component 2511 to retrieve.

Upon receiving at least the observed spatial point dataset 3100, the processor(s) 2450 or 2550 may be caused by execution of a generation component 2512 of the control routine 2510 to derive a set of multiple quadrats into which the particular region may be divided from at least the covariate values for the locations specified in the observed spatial point dataset 3100, and may store indications of locations and/or boundaries of each of those quadrats as the quadrat data 3140. However, where the specification of the particular region is included in the spatial process model 3170, the generation of the quadrat data 3140 may also be based on such indications retrieved therefrom in lieu of being retrieved from the observed spatial point dataset 3100.

Also upon receiving at least the observed spatial point dataset 3100, the processor(s) 2450 or 2550 may also be caused to generate a copy of the KD tree 3110 from the observed spatial point dataset 3100. In embodiments in which the observed spatial point dataset 3100 incorporates numerous entries 3101 that correlate locations of occurrences of the particular event to covariate values for those locations and/or for those occurrences, the generation of the KD tree 3110 may entail a re-arrangement of the entries 3101 into a tree-like data structure in which the entries 3101 become nodes along the branches thereof. However, it should be noted that such re-arrangement of the entries 3101 may additionally entail the limiting of the covariate values that are included in such nodes to just the covariates that were involved in fitting the spatial process model 3170 based on the observed spatial point dataset 3100. As part of such limiting what covariate values are so included, the processor(s) 2450 or 2550 may be caused to analyze the spatial process model 3170 to identify the ones of the covariate values that are to be so included.

Turning to FIGS. 15B-D, in addition to FIG. 14A, information may be collected concerning the availability of processing resources to which performances of iterations of both generating and using simulated spatial point datasets 3400 may be assigned as part of performing a goodness-of-fit test of the spatial process model 3170. More specifically, FIG. 15B depicts aspects of the collection of such information by processor(s) 2550 of the control device 2500 in embodiments of the distributed processing system 2000 of FIG. 13A in which the processing resources of processors 2350 of node devices 2300 are to be so used. In contrast, FIG. 15C depicts aspects of the collection of such information by processor(s) 2450 of the single computing device 2400 in embodiments of the processing system 2000 of FIG. 13B in which other processors 2450 of the single computing device 2400 are to be so used.

As depicted in FIG. 15B, processor(s) 2350 within multiple ones of the node devices 2300 may be caused by execution of a monitoring component 2313 of a copy of the control routine 2310 to monitor levels of availability of their own processing resources. Such processing resources may include, and are not limited to: the availability and/or multi-threading capabilities of each processor 2350; the availability of execution threads and/or per-thread storage for each processor 2350; the availability of cores and/or per-core storage for each processor; the quantities of available cores 2351 and/or amounts of available storage space that is at least available to be allocated to each available execution thread (e.g., able to be allocated as per-thread storage areas 2366); processor type for each processor 2350; and/or description of instruction set that is supported by each processor 2350. The processor(s) 2350 may be further caused to store indications of such levels of availability of processing resources as local copies of resources data 2330, and/or may transmit such indications on a recurring basis (e.g., at a recurring timed interval and/or as recurringly triggered by one or more specific events) via the network 2999 to the control device 2500.

As also depicted in FIG. 15B, processor(s) 2550 of the control device 2500 may be caused by execution of a corresponding monitoring component 2513 of the control routine 2510 to collect such indications of processing resources from the node devices 2300 and recurringly update such indications in the resources data 2530.

Similarly, as depicted in FIG. 15C, processor(s) 2450 within the single computing device 2400 may be similarly caused to monitor levels of availability of their own processing resources, to store indications thereof as a local copy or copies of resources data 2330, and/or to provide indications thereof to another processor 2450 that may collect such indications for storage as the resources data 2530.

Turning to FIG. 15D, the architecture of each of the processors 2350 or 2450 may incorporate various features enabling the parallel execution of multiple different pieces of software or software components, and/or multiple instances of a single piece of software or software component. By way of example, and as depicted, at least a subset of the processors 2350 or 2450 may incorporate one or more cores 2351 or 2451, each of which may support more than one execution thread 2356 or 2456, respectively.

In some embodiments, multiple execution threads 2356 or 2456 of a single core 2351 or 2451 may be required to be relatively closely associated with each other such that they must be associated with executing the same piece of software or software component such that they are associated with the same execution process 2354 or 2454, respectively. In other architectures, it may be permissible for multiple threads 2356 or 2456 of a single core 2351 or 2451 to be associated with executing entirely unrelated pieces of software or software components.

In some embodiments in which multiple execution threads 2356 or 2456 are supported per processor 2350 or 2450, and/or per core 2351 or 2451, there may be variations in the level of support for allowing each thread to be allocated its own separate per-thread storage space 2366 or 2466, respectively, (i.e., storage space that is accessible from just one execution thread 2356 or 2456). By way of example, it may be that threads 2356 or 2456 that are associated with the same core 2351 or 2451, respectively, are required to share storage space (such that storage space may be provided as per-core storage area 2361 or 2461). In such embodiments, it may be that providing each execution thread 2356 or 2456 with a separate copy of a single data structure requires the specification of differing virtual memory addresses for each such copy for each execution thread 2356 or 2456.

In some embodiments, at least a subset of the processors 2350 or 2450 may incorporate a combination of cores 2351 or 2451 of differing types that may support differing instruction sets, differing quantities of execution threads 2356 or 2456, respectively, and/or different speeds of execution. By way of example, it is becoming increasingly common for processors to include a combination of higher performance cores and lower power cores that differ in one or more of such aspects.

In some embodiments, different ones of the processors 2350 or 2450, and/or different ones of the cores 2351 or 2451, respectively, may be of differing types that each support a different range of functionality. By way of example, it has become increasingly commonplace for processors to include both central processing unit (CPU) cores capable of performing a broad range of functions, along with graphics processing unit (GPU) cores or other special-function cores that are more efficient than CPU cores for performing various specialized functions (e.g., rendering graphical images). As those skilled in the art will readily recognize, such different types of processor and/or core are likely to support very different instruction sets with very different varieties and/or specializations of instructions.

As a result of such variety of possible differences among the processors 2350 or 2450, and/or among cores 2351 or 2451, respectively, thereof, it may be that the processing resource availability information that is recurringly collected and maintained within the resources data 2530 includes indications of such aspects of processor architecture, including differences in versions of instruction sets supported, differences in types of processors and/or cores, differences in multi-threading support, differences in specialization, etc. Such resource availability information may then lead to the assignment of a specific subset of the cores 2351 of a processor 2350 to perform an iteration of both generation and use of a simulated spatial point dataset 3400, instead of the assignment of the entire processor 2350.

Alternatively or additionally, and as previously discussed, it may be that a processor 2350 incorporates a relatively large quantity of cores 2351 as part of supporting a relatively large quantity of execution threads 2356. In such embodiments, it may be deemed desirable to assign each of multiple different subsets of the cores 2351 of such a processor 2350 to perform a different iteration such that multiple iterations may be performed by such a processor in parallel.

Turning to FIGS. 15E-F, in addition to FIG. 14B, one or more particular processors 2350 or 2450, and/or one or more particular processor cores 2351 or 2451, may be selected to be assigned to perform iterations of both generating and using simulated spatial point datasets 3400 in performing a goodness-of-fit test of the spatial process model 3170. More specifically, FIG. 15E depicts aspects of such assignments being made to processors 2350 and/or cores 2351 thereof among multiple node devices 2300 in embodiments of the distributed processing system 2000 of FIG. 13A. In contrast, FIG. 15F depicts aspects of such assignments being made to processors 2450 and/or cores 2451 thereof within the single computing device 2400 in embodiments of the processing system 2000 of FIG. 13B.

As depicted in FIG. 15E, one or more processors 2350, and/or one or more cores 2351 thereof, may be assigned to perform such iterations based on various aspects of the processing resources that each provides, including the availability of multiple execution threads 2356 to support multiple parallel performances of nearest neighbor processing operations within such iterations. As depicted, it may be that execution of a distribution component 2514 of the control routine 2510 causes processor(s) 2550 of the control device 2500 to retrieve and use indications of one or more minimum requirements and/or prioritization requirements from configuration data 2535 that serve to provide rules for the selection of processors 2350 and/or cores 2351 thereof.

By way of example, it may be that such rules specify that priority is to be given to selecting processors 2350 (and/or cores 2351 thereof) that are able to provide higher quantities of execution threads 2356. Alternatively or additionally, it may be that such rules specify that no processor 2350 (and/or core 2351 thereof) is to be selected that is unable to provide at least a specified minimum quantity of execution threads 2356. Similar rules for prioritization and/or restrictions may be specified for the provision of sufficient storage space per execution thread 2356. Alternatively or additionally, there may be rules specifying that no processor 2350 (and/or core 2351 thereof) is to be selected that does not support a specific instruction set, a specific version of instruction set and/or specific instructions. Similar rules may be specified for restricting against the selection of processors 2350 (and/or cores 2351 thereof) that are not of a specific type and/or that do not meet various other specified architectural requirements.

As also depicted in FIG. 15E, upon selecting a processor 2350 (and/or one or more specific cores 2351 thereof), the processor(s) 2550 of the control device 2500 may be caused to transmit copies of the KD tree 3110, the quadrat data 3140 and/or the spatial process model 3170 via the network 2999 to the node device 2300 that includes the selected processor 2350 (and/or the selected one or more specific cores 2351 thereof). The processor(s) 2550 may also be caused to transmit a copy of the control routine 2340 to that node device 2300.

It should be noted that, in some embodiments, the control device 2500 may store multiple versions of the control routine 2340, and may select a particular version thereof for being provided to that node device 2300 depending on one or more aspects of the selected processor 2350 (and/or the selected one or more cores 2351 thereof). Such different versions of the control routine 2340 may be optimized for use with different types of processor 2350 (and/or one or more cores 2351 thereof), different instruction sets, different versions of an instruction set, etc. By way of example, where the selected processor 2350 includes both CPU and GPU variants of cores 2351, different version(s) of the control routine 2340 may be provided to the node device 2300 that includes the selected processor 2350, depending on whether a CPU variant and/or a GPU variant of core 2351 was selected.

Within each node device 2300 that includes a selected processor 2350 (e.g., a processor 2350 that includes at least one selected core 2351), execution of a corresponding distribution component 2314 of a copy of the control routine 2310 may cause processor(s) 2350 to cooperate with the control device 2500 to receive and store the provided copies of the KD tree 3110, the quadrat data 3140, the spatial process model 3170 and/or the control routine 2340.

Similarly, as depicted in FIG. 15F, processor(s) 2450 within the single computing device 2400 may be similarly caused to select other processor(s) 2450 (and/or cores 2451 thereof) to perform such iterations based on such rules, and may also similarly distribute copies of the KD tree 3110, the quadrat data 3140, the spatial process model 3170 and/or the control routine 2340.

Referring back to both FIGS. 15E and 15F, regardless of the exact manner of provision of multiple copies of the KD tree 3110, the quadrat data 3140, the spatial process model 3170 and/or version(s) of the control routine 2340 to multiple processors 2350 or 2450, such multiple copies may be retained, even as each current iteration ends, so as to be available for use by the those same multiple processors 2350 or 2450 without having to again be provided thereto.

Figure 16A:
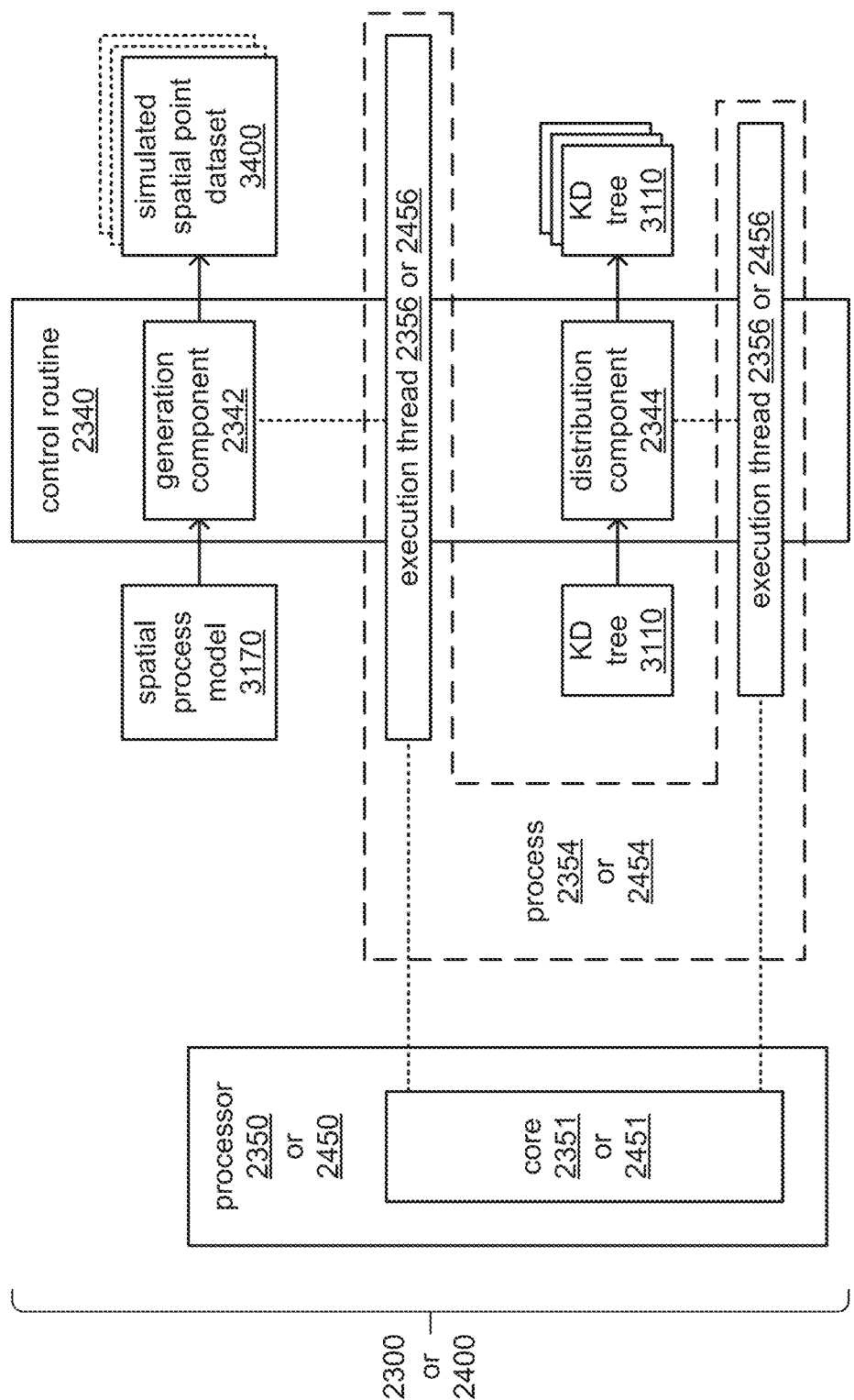
FIGS. 16A, 16B, 16C, 16D and 16E, together, illustrate, in greater detail, aspects of the per-iteration operations for which FIG. 14C provided an overview.

Turning to FIG. 16A, in addition to FIG. 14B, where a processor 2350 of one of the node devices 2300 (or at least one core 2351 thereof), or a processor 2450 of the single computing device 2400 (or at least one core 2451 thereof), has been selected to perform an iteration of the goodness-of-fit test, execution of a generation component 2342 of a copy of the control routine 2340 may cause that processor 2350 or 2450 (or at least one core 2351 or 2451 thereof) to begin the performance of that iteration by using at least the copy of the spatial process model 3170 to generate the simulated spatial point dataset 3400 for that iteration. It should be noted that this presumes that the spatial process model 3170 includes an indication of the shape, size, location and/or boundaries of the particular region. If such information is not included in the spatial process model 3170, then it may be retrieved from the KD tree 3110 or the quadrat data 3140.

That processor 2350 or 2450 (or at least one core 2351 or 2451 thereof) may also be caused, by execution of a distribution component 2344 of the control routine 2340, to replicate the single received copy of the KD tree 3110 into enough copies to provide a separate copy thereof for each available execution thread 2356 or 2456 of that processor 2350 or 2450 that is to be employed in performing nearest neighbor processing operations between the simulated locations of the simulated spatial point dataset 3400 and the observed locations of the KD tree 3110. Correspondingly, in some embodiments, and as depicted with dotted lines, it may be that multiple copies of the simulated spatial point dataset 3400 to also provide a separate copy thereof for each of those same execution threads 2356 or 2456, respectively.

It should be noted that, although FIG. 16A depicts these executions of the generation component 2342 and the distribution component 2344 as being on separate execution threads 2356 or 2456 that are associated with the same process 2354 or 2454 on the same core 2351 or 2451, respectively, it is also possible that these two components may be executed sequentially on a single thread, or that the two depicted separate threads may be associated with different cores 2351 or 2451.

Figure 16B:
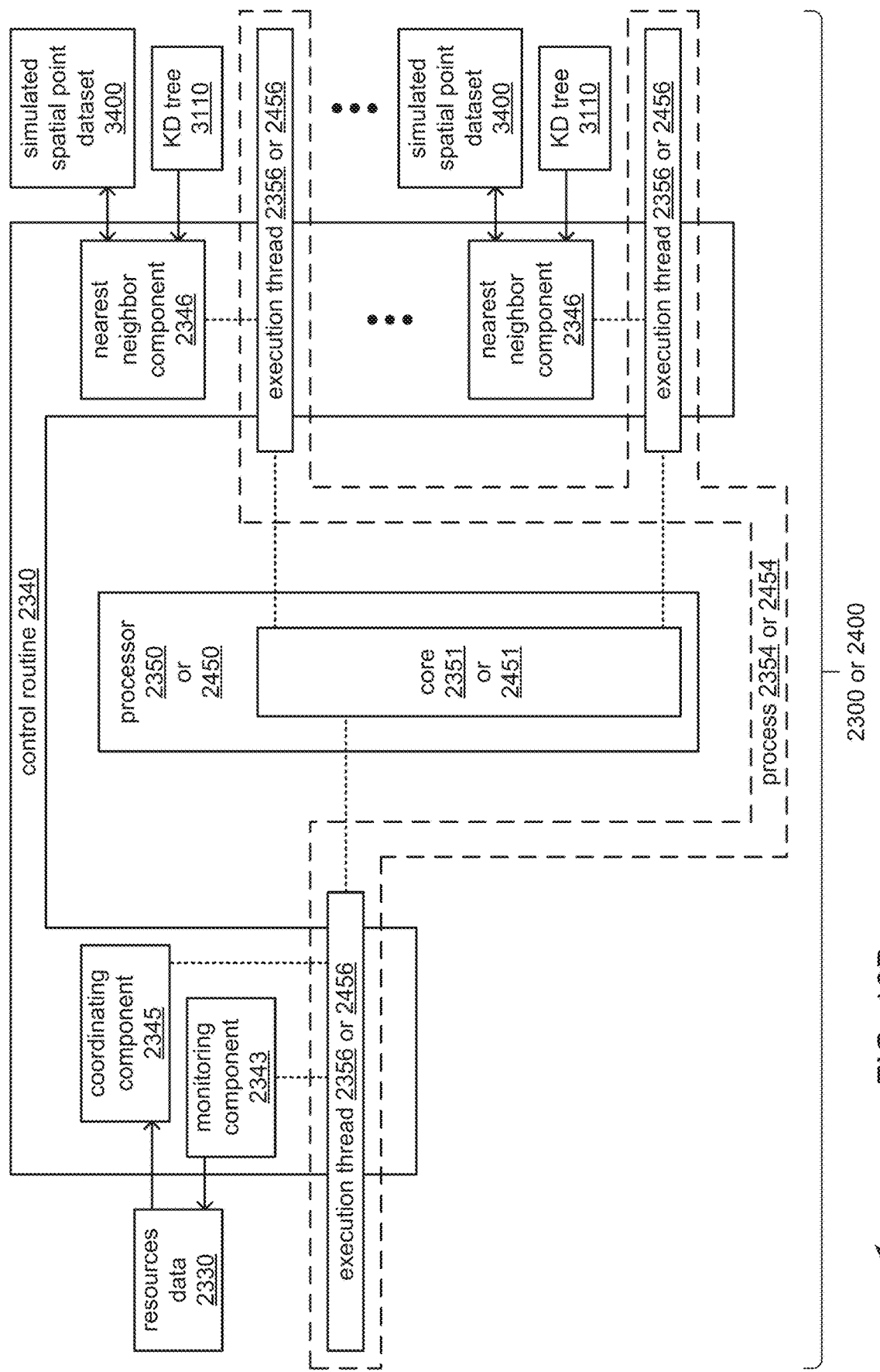

Turning to FIG. 16B, in addition to FIG. 14B, as depicted, the parallel executions of a nearest neighbor component 2346 of the control routine 2340 on multiple execution threads 2356 or 2456 of at least one core 2351 or 2451 of a processor 2350 or 2450 may cause multiple instances of nearest neighbor processing operations for one iteration of generation and use of a single simulated spatial point dataset 3400 to be performed in parallel across those threads. More precisely, in each such performance of nearest neighbor processing operations for one iteration, the nearest neighbor to a single simulated location of the simulated spatial point dataset 3400 may be searched for among the observed locations within the KD tree 3100. Thus, it is envisioned that numerous accesses may be made to the KD tree 3100 in each of the performances of nearest neighbor processing operations, while, in contrast, a simulated spatial point dataset 3400 may be accessed only once for each of those performance. It should be noted that FIG. 16B depicts aspects of an embodiment in which separate copies of the nearest neighbor component 2346, the KD tree 3100 and/or the simulated spatial point dataset 3400 are allocated to and used by each of the multiple execution threads 2356 or 2456 that are employed in performing nearest neighbor processing operations for a single iteration in parallel.

The provision of such separate copies of at least data to each thread may be performed to avoid instances of competition between threads to access the same copy at the same storage locations, thereby avoiding instances in which the executions across multiple threads may effectively become serialized as a result of repeated competing usages of locking of storage locations. However, it should be noted that, in embodiments in which multiple execution threads 2356 or 2456 that are associated with the same process 2354 or 2454 and/or with the same core 2351 or 2451 are required to execute portions of the same piece of software, it may not be possible to provide each execution thread 2356 or 2456 with such separate copies of the nearest neighbor component 2346, although the provision of separate copies of the KD tree 3110 and/or of the simulated spatial point dataset 3400 may still be possible. Such limitations may be specific to particular architectures or variations of a common architecture in differing processors 2350 or 2450 offered by different manufactures in which such aspects of support for multiple threads may be implemented differently. As discussed above, accommodating such differences may be accomplished through the provision of multiple versions of the control routine 2340. Alternatively or additionally, accommodating such differences may be accomplished by imposition of a rule in which priority is given to selecting processors having architectures that do not place such limits on the use of multiple threads associated with the same core 2351 or 2451, and/or with the same process 2354 or 2454, respectively.

Figure 16C:
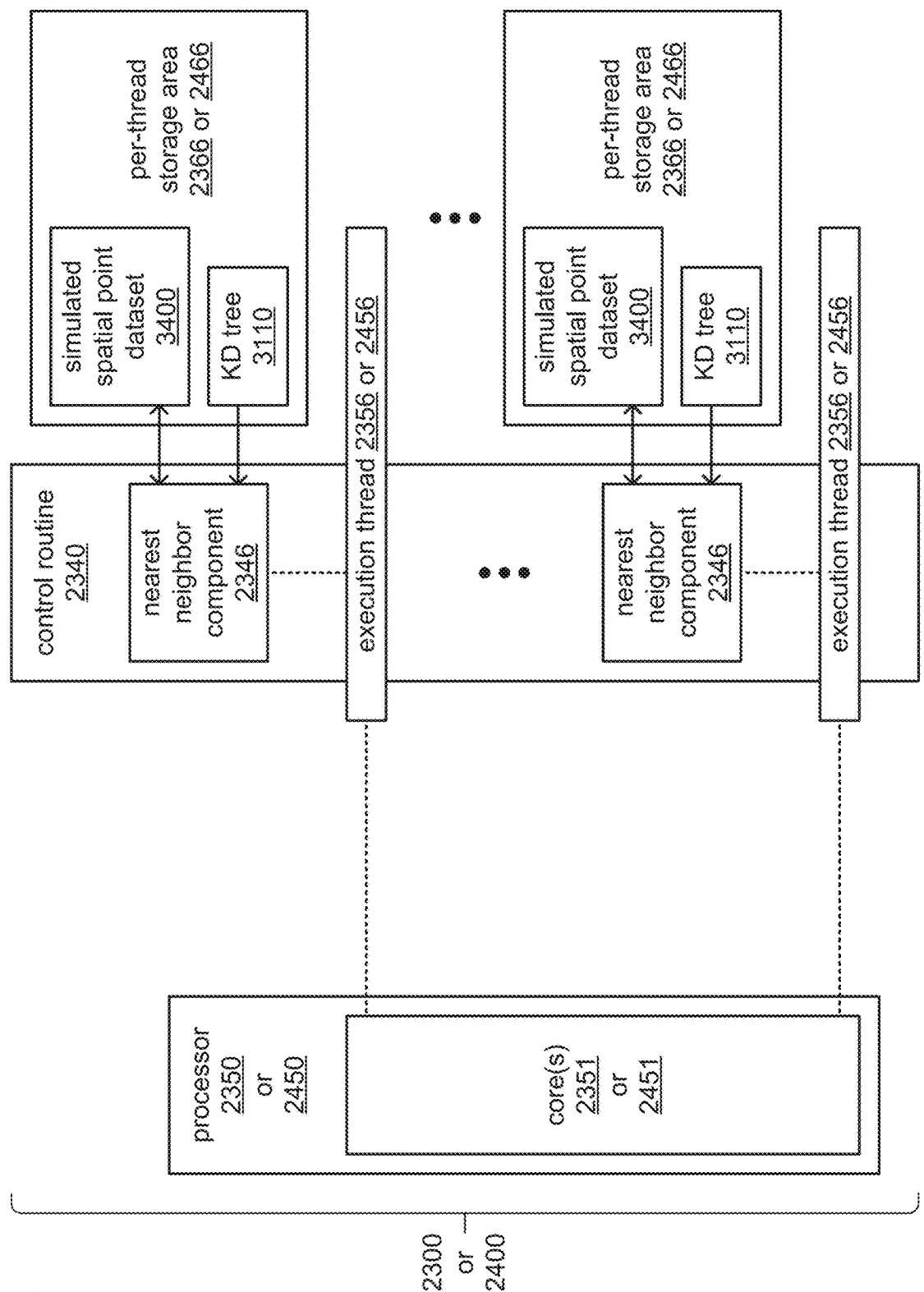
Figure 16D:
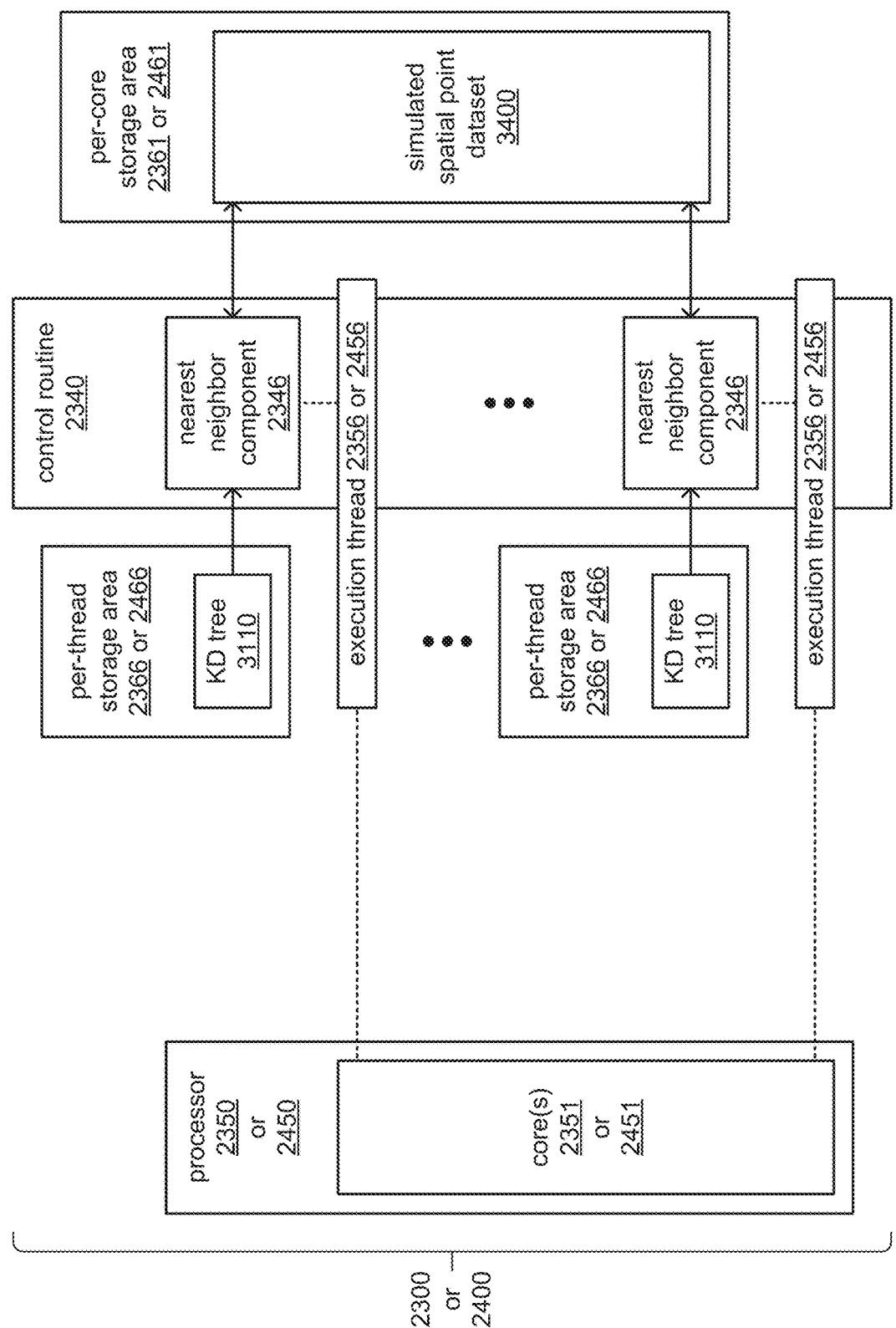

FIG. 16C specifically depicts an example embodiment of a processing architecture that does not impose such limitations. More specifically, such a processing architecture may support the allocation of separate per-thread storage areas 2366 or 2466 for each execution thread 2356 or 2456 in which at least data structures may be stored where access is limited to the corresponding execution thread 2356 or 2456, respectively. FIG. 16D depicts an example of a somewhat different processing architecture that still allows for such per-thread storage areas 2366 or 2466, but also supports the allocation of a per-core storage area 2361 or 2461 where at least data structures may be stored that are to be shared among the execution threads 2356 or 2456. As depicted, and by way of example, a single copy of the simulated spatial point dataset 3400 may be stored therein for such shared access.

Referring back to both FIGS. 16B and 16C, regardless of the exact manner in which multiple copies of the KD tree 3110 may be stored for and/or accessed by for multiple execution threads 2356 or 2456, such multiple copies may be retained, even as a current iteration ends, so as to be available for use by the multiple execution threads 2356 or 2456 without having to again be provided thereto.

Returning to FIG. 16B, in addition to FIG. 14B, as also depicted, execution of a monitoring component 2343 of the control routine 2340 on still another execution thread 2356 or 2456 may cause the processor 2350 or 2450 to continue to monitor the availability of processing resources, and to continue to update the resources data 2330 with indications of levels of availability of those processing resources. Further, execution of a coordinating component 2345 may additionally cause ongoing provision of such indications to the control device 2500 or to another processor 2450 that executes the control routine 2540 (not specifically shown) to provide coordination of the performances of the multiple iterations of generation and use of simulated spatial point datasets 3400 across multiple processors 2350 or 2450. Again, such coordination by processor(s) 2550 or 2450 that execute the control routine 2540 may include recurringly reassessing which processors 2350 or 2450 (or which cores 2351 or 2451 thereof) should be assigned to perform the next iteration based on current levels of available processing resources, including quantities of available execution threads for each.

Figure 16E:
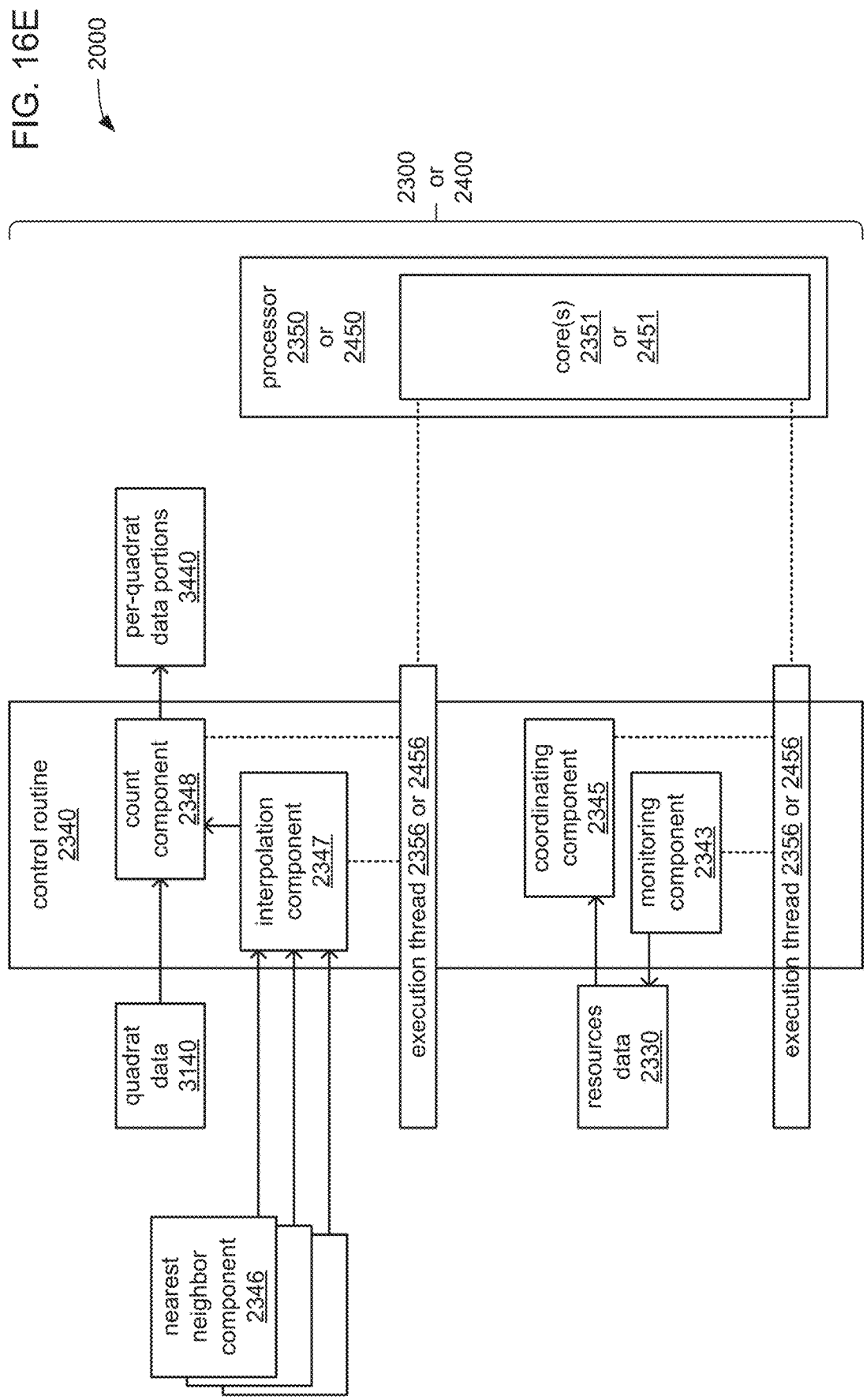

Turning to FIG. 16E, in addition to FIG. 14C, as previously discussed, upon completion of the numerous nearest neighbor processing operations across multiple execution threads 2356 or 2456 of a single processor 2350 or 2450 (or at least a single core 2351 or 2451 thereof) as part of performing a single iteration, execution of an interpolation component 2347 of the control routine 2340 may cause the performance of interpolation of covariate values between the simulated locations of the corresponding simulated spatial point dataset 3400 and their identified nearest neighbors among the locations specified in the KD tree. Additionally, execution of a count component 2348 of the control routine 2340 may cause the processor 2350 or 2450 to use a copy of the quadrat data 3140 specifying quadrat locations and/or boundaries to derive per-quadrat counts and/or other per-quadrat values, and to store those as an instance of per-quadrat data portions 3440. That processor 2350 or 2450 may then be caused to provide that instance of per-quadrat data portions 3440 to the control device 2500 or to the processor 2450 that generates the results data 3700 therefrom, as discussed in reference to FIG. 14C.

In various embodiments, each of the processors 2350, 2450, 2550 and 2750 may include any of a wide variety of commercially available processors. Further, one or more of these processors may include a combination of multiple processors, a multi-threaded processor, a multi-core processor (whether the multiple cores coexist on the same or separate dies), and/or a multi-processor architecture of some other variety by which multiple physically separate processors are linked.

In various embodiments, each of the control routines 2310, 2340, 2370, 2510, 2540 and 2570, including the components of which each is composed, may be selected to be operative on whatever type of processor or processors that are selected to implement applicable ones of the processors 2350, 2450, 2550 and/or 2750 within each one of the devices 2300, 2400, 2500 and/or 2700, respectively. In various embodiments, each of these routines may include one or more of an operating system, device drivers and/or application-level routines (e.g., so-called "software suites" provided on disc media, "applets" obtained from a remote server, etc.). Where an operating system is included, the operating system may be any of a variety of available operating systems appropriate for the processors 2350, 2450, 2550 and/or 2750. Where one or more device drivers are included, those device drivers may provide support for any of a variety of other components, whether hardware or software components, of the devices 2300, 2400, 2500 and/or 2700.

In various embodiments, each of the storages 2360, 2460, 2560 and 2760 may be based on any of a wide variety of information storage technologies, including volatile technologies requiring the uninterrupted provision of electric power, and/or including technologies entailing the use of machine-readable storage media that may or may not be removable. Thus, each of these storages may include any of a wide variety of types (or combination of types) of storage device, including without limitation, read-only memory (ROM), random-access memory (RAM), dynamic RAM (DRAM), Double-Data-Rate DRAM (DDR-DRAM), synchronous DRAM (SDRAM), static RAM (SRAM), programmable ROM (PROM), erasable programmable ROM (EPROM), electrically erasable programmable ROM (EEPROM), flash memory, polymer memory (e.g., ferroelectric polymer memory), ovonic memory, phase change or ferroelectric memory, silicon-oxide-nitride-oxide-silicon (SONOS) memory, magnetic or optical cards, one or more individual ferromagnetic disk drives, non-volatile storage class memory, or a plurality of storage devices organized into one or more arrays (e.g., multiple ferromagnetic disk drives organized into a Redundant Array of Independent Disks array, or RAID array). It should be noted that although each of these storages is depicted as a single block, one or more of these may include multiple storage devices that may be based on differing storage technologies. Thus, for example, one or more of each of these depicted storages may represent a combination of an optical drive or flash memory card reader by which programs and/or data may be stored and conveyed on some form of machine-readable storage media, a ferromagnetic disk drive to store programs and/or data locally for a relatively extended period, and one or more volatile solid state memory devices enabling relatively quick access to programs and/or data (e.g., SRAM or DRAM). It should also be noted that each of these storages may be made up of multiple storage components based on identical storage technology, but which may be maintained separately as a result of specialization in use (e.g., some DRAM devices employed as a main storage while other DRAM devices employed as a distinct frame buffer of a graphics controller).

However, in a specific embodiment, the storage within one or more of the data sources 2100 may be implemented with a redundant array of independent discs (RAID) of a RAID level selected to provide fault tolerant storage.

In various embodiments, each of the input device(s) 2720 may each be any of a variety of types of input device that may each employ any of a wide variety of input detection and/or reception technologies. Examples of such input devices include, and are not limited to, microphones, remote controls, stylus pens, card readers, finger print readers, virtual reality interaction gloves, graphical input tablets, joysticks, keyboards, retina scanners, the touch input components of touch screens, trackballs, environmental sensors, and/or either cameras or camera arrays to monitor movement of persons to accept commands and/or data provided by those persons via gestures and/or facial expressions.

In various embodiments, each of the display(s) 2780 may each be any of a variety of types of display device that may each employ any of a wide variety of visual presentation technologies. Examples of such a display device includes, and is not limited to, a cathode-ray tube (CRT), an electroluminescent (EL) panel, a liquid crystal display (LCD), a gas plasma display, etc. In some embodiments, the displays 2180 and/or 2880 may each be a touchscreen display such that the input device(s) 2810, respectively, may be incorporated therein as touch-sensitive components thereof.

In various embodiments, each of the network interfaces 2390, 2490, 2590 and 2790 may employ any of a wide variety of communications technologies enabling these devices to be coupled to other devices as has been described. Each of these interfaces includes circuitry providing at least some of the requisite functionality to enable such coupling. However, each of these interfaces may also be at least partially implemented with sequences of instructions executed by corresponding ones of the processors (e.g., to implement a protocol stack or other features). Where electrically and/or optically conductive cabling is employed, these interfaces may employ timings and/or protocols conforming to any of a variety of industry standards, including without limitation, RS-232C, RS-422, USB, Ethernet (IEEE-802.3) or IEEE-1394. Where the use of wireless transmissions is entailed, these interfaces may employ timings and/or protocols conforming to any of a variety of industry standards, including without limitation, IEEE 802.11a, 802.11ad, 802.11ah, 802.11ax, 802.11b, 802.11g, 802.16, 802.20 (commonly referred to as "Mobile Broadband Wireless Access"); Bluetooth; ZigBee; or a cellular radiotelephone service such as GSM with General Packet Radio Service (GSM/GPRS), CDMA/1×RTT, Enhanced Data Rates for Global Evolution (EDGE), Evolution Data Only/Optimized (EV-DO), Evolution For Data and Voice (EV-DV), High Speed Downlink Packet Access (HSDPA), High Speed Uplink Packet Access (HSUPA), 4G LTE, etc.

However, in a specific embodiment, one or more of the network interfaces 2390, 2490, 2590 and/or 2790 may be implemented with multiple copper-based or fiber-optic based network interface ports to provide redundant and/or parallel pathways in exchanging data.

In various embodiments, the division of processing and/or storage resources among the devices 2300, 2400 and/or 2500, and/or the API architectures employed to support communications among the devices 2300, 2400 and/or 2500 may be configured to and/or selected to conform to any of a variety of standards for distributed processing, including without limitation, IEEE P2413, AllJoyn, IoTivity, etc. By way of example, a subset of API and/or other architectural features of one or more of such standards may be employed to implement the relatively minimal degree of coordination described herein to provide greater efficiency in parallelizing processing of data, while minimizing exchanges of coordinating information that may lead to undesired instances of serialization among processes.

Some systems may use Hadoop®, an open-source framework for storing and analyzing big data in a distributed computing environment. Some systems may use cloud computing, which can enable ubiquitous, convenient, on-demand network access to a shared pool of configurable computing resources (e.g., networks, servers, storage, applications and services) that can be rapidly provisioned and released with minimal management effort or service provider interaction. Some grid systems may be implemented as a multi-node Hadoop® cluster, as understood by a person of skill in the art. Apache™ Hadoop® is an open-source software framework for distributed computing.

The invention claimed is:

1. An apparatus comprising at least one processor and a storage to store instructions that, when executed by the at least one processor, cause the at least one processor to perform operations comprising:
   receive, from a requesting device and via a network, a request to perform a test of goodness-of-fit of a spatial process model to an observed spatial point dataset;
   retrieve, from at least one data source device, the observed spatial point dataset and a specification of the spatial process model, wherein:
      the observed spatial point dataset comprises indications of locations within a region at which instances of an event were observed to have occurred, and corresponding covariate values for each location; and
      the spatial process model is fitted to the observed spatial point dataset to serve as a model of a spatial point process that generated the observed spatial point dataset;

generate, from at least the observed spatial point dataset, a KD tree wherein each node of the KD tree comprises one of the indications of a location at which an instance of the event was observed to have occurred and the corresponding covariate values;

derive, from at least the observed spatial point dataset, multiple quadrats into which the region is divided;

receive, from multiple processors, indications of current levels of availability of processing resources comprising a quantity of currently available execution threads for each processor of the multiple processors;

select, based on at least the quantity of currently available execution threads for each processor of the multiple processors, a subset of the multiple processors to perform multiple iterations of a portion of the test in parallel, wherein each iteration comprises:
- generating a simulated spatial point dataset of multiple simulated spatial point datasets; and
- using the simulated spatial point dataset with the KD tree in multiple performances of nearest neighbor processing across multiple execution threads of a single processor of the subset;

provide, to each processor of the subset, the KD tree, the specification of the spatial process model, and an indication of the multiple quadrats to enable each processor of the subset to perform at least one iteration;

receive, from each processor of the subset, per-quadrat data portions indicative of results of the performance of at least a single iteration;

combine the per-quadrat data portions received from each processor of the subset to derive at least one goodness-of-fit statistic indicative of a level of goodness-of-fit of the spatial process model to the observed spatial point dataset; and transmit an indication of the level of goodness-of-fit to the requesting device.

2. The apparatus of claim 1, wherein each processor of the subset is caused to perform operations of an iteration comprising:

generate, from at least the KD tree and specification of the spatial process model, one of the simulated spatial point datasets of the multiple simulated spatial point datasets, wherein the one of the simulated spatial point datasets comprises indications of simulated locations within the region at which simulated instances of the event occurred, and corresponding simulated covariate values for each simulated location;

generate multiple copies of the KD tree;

provide a separate copy of the multiple copies of the KD tree to each available execution thread of the processor to prevent competition for access to the KD tree among the available execution threads of the processor; and on each available execution thread of the processor, and in parallel with others of the available execution threads of the processor, perform nearest neighbor processing between a simulated location of the one of the simulated spatial point datasets and the indications of locations of the separate copy of the KD tree provided to the available execution thread.

3. The apparatus of claim 2, wherein each processor of the subset is caused to generate the per-quadrat data portions indicative of the results of the performance of at least a single iteration.

4. The apparatus of claim 2, wherein each processor of the subset is caused to retain at least one of the KD tree, the specification of the spatial process model or the indication of multiple quadrats to enable the processor to perform a next iteration without again receiving the at least one of the KD tree, the specification of the spatial process model or the indication of multiple quadrats.

5. The apparatus of claim 4, wherein:

separate storage space is allocated to each available execution thread of the processor to separately store each one of the separate copies of the KD tree that is provided to each available execution thread; and each of the separate copies of the KD tree is retained in the corresponding storage space allocated to one of the available execution threads of the processor to enable use of each of the available execution threads of the processor to perform nearest neighbor processing operations of the next iteration without again being provided with a copy of the KD tree.

6. The apparatus of claim 1, wherein the selection of the subset comprises prioritizing selecting processors of the multiple processors having a higher quantity of currently available execution threads.

7. The apparatus of claim 1, wherein:

the indications of current levels of availability of processing resources further comprises an indication of an amount of separate storage space available to be allocated to each available execution thread for each processor of the multiple processors; and the selection of the subset is further based on the amount of separate storage space available to be allocated to each available execution thread for each processor of the multiple processors.

8. The apparatus of claim 1, wherein:

the indications of current levels of availability of processing resources further comprises at least one of an indication of what instruction set is supported by each processor of the multiple processors, or an indication of what version of an instruction set is supported by each processor of the multiple processors; and the at least one processor is caused, for each processor of the subset, to perform operations comprising:
- select a version of a routine that is executable to cause performance of an iteration of the multiple iterations based on at least one of the indication of what instruction set is supported by the processor or an indication of what version of an instruction set is supported by the processor; and
- provide the processor with the selected version of the routine.

9. The apparatus of claim 1, wherein:

each processor of the subset comprises multiple cores;

the reception of a quantity of currently available execution threads for each processor of the multiple processors comprises receiving a quantity of currently available execution threads for each core of each processor of the multiple processors; and the selection of the subset to perform the multiple iterations comprises a selection of at least one core of the multiple cores of each processor of the subset, wherein each selected core of each processor of the subset is caused to perform a separate iteration in which the multiple performances of nearest neighbor processing for an iteration is performed across the multiple execution threads of a single selected core.

10. The apparatus of claim 1, wherein:

at least one of the observed spatial point dataset or the specification of the spatial process model comprises a specification of the region;

the specification of the region comprises at least one of a specification of a dimension of the region, a specification of a shape of the region, a specification of a location of the region, or a specification of a boundary of the region; and the derivation of the multiple quadrats is partially based on the specification of the region.

11. A non-transitory machine-readable storage medium having a computer-program product stored therein, the computer-program product including instructions operable to cause at least one processor to perform operations comprising:

receive, from a requesting device and via a network, a request to perform a test of goodness-of-fit of a spatial process model to an observed spatial point dataset;

retrieve, from at least one data source device, the observed spatial point dataset and a specification of the spatial process model, wherein:

the observed spatial point dataset comprises indications of locations within a region at which instances of an event were observed to have occurred, and corresponding covariate values for each location; and the spatial process model is fitted to the observed spatial point dataset to serve as a model of a spatial point process that generated the observed spatial point dataset;

generate, from at least the observed spatial point dataset, KD tree wherein each node of the KD tree comprises one of the indications of a location at which an instance of the event was observed to have occurred and the corresponding covariate values;

derive, from at least the observed spatial point dataset, multiple quadrats into which the region is divided;

receive, from multiple processors, indications of current levels of availability of processing resources comprising a quantity of currently available execution threads for each processor of the multiple processors;

select, based on at least the quantity of currently available execution threads for each processor of the multiple processors, a subset of the multiple processors to perform multiple iterations of a portion of the test in parallel, wherein each iteration comprises:

generating a simulated spatial point dataset of multiple simulated spatial point datasets; and using the simulated spatial point dataset with the KD tree in multiple performances of nearest neighbor processing across multiple execution threads of a single processor of the subset;

provide, to each processor of the subset, the KD tree, the specification of the spatial process model, and an indication of the multiple quadrats to enable each processor of the subset to perform at least one iteration;

receive, from each processor of the subset, per-quadrat data portions indicative of results of the performance of at least a single iteration;

combine the per-quadrat data portions received from each processor of the subset to derive at least one goodness-of-fit statistic indicative of a level of goodness-of-fit of the spatial process model to the observed spatial point dataset; and transmit an indication of the level of goodness-of-fit to the requesting device.

12. The the non-transitory machine-readable storage medium of claim 11, wherein each processor of the subset is caused to perform operations of an iteration comprising:

generate, from at least the KD tree and specification of the spatial process model, one of the simulated spatial point datasets of the multiple simulated spatial point datasets, wherein the one of the simulated spatial point datasets comprises indications of simulated locations within the region at which simulated instances of the event occurred, and corresponding simulated covariate values for each simulated location;

generate multiple copies of the KD tree;

provide a separate copy of the multiple copies of the KD tree to each available execution thread of the processor to prevent competition for access to the KD tree among the available execution threads of the processor; and on each available execution thread of the processor, and in parallel with others of the available execution threads of the processor, perform nearest neighbor processing between a simulated location of the one of the simulated spatial point datasets and the indications of locations of the separate copy of the KD tree provided to the available execution thread.

13. The the non-transitory machine-readable storage medium of claim 12, wherein each processor of the subset is caused to generate the per-quadrat data portions indicative of the results of the performance of at least a single iteration.

14. The the non-transitory machine-readable storage medium of claim 12, wherein each processor of the subset is caused to retain at least one of the KD tree, the specification of the spatial process model or the indication of multiple quadrats to enable the processor to perform a next iteration without again receiving the at least one of the KD tree, the specification of the spatial process model or the indication of multiple quadrats.

15. The the non-transitory machine-readable storage medium of claim 14, wherein:

separate storage space is allocated to each available execution thread of the processor to separately store each one of the separate copies of the KD tree that is provided to each available execution thread; and each of the separate copies of the KD tree is retained in the corresponding storage space allocated to one of the available execution threads of the processor to enable use of each of the available execution threads of the processor to perform nearest neighbor processing operations of the next iteration without again being provided with a copy of the KD tree.

16. The the non-transitory machine-readable storage medium of claim 11, wherein the selection of the subset comprises prioritizing selecting processors of the multiple processors having a higher quantity of currently available execution threads.

17. The the non-transitory machine-readable storage medium of claim 11, wherein:

the indications of current levels of availability of processing resources further comprises an indication of an amount of separate storage space available to be allocated to each available execution thread for each processor of the multiple processors; and the selection of the subset is further based on the amount of separate storage space available to be allocated to each available execution thread for each processor of the multiple processors.

18. The the non-transitory machine-readable storage medium of claim 11, wherein:

the indications of current levels of availability of processing resources further comprises at least one of an indication of what instruction set is supported by each processor of the multiple processors, or an indication of what version of an instruction set is supported by each processor of the multiple processors; and the at least one processor is caused, for each processor of the subset, to perform operations comprising:

select a version of a routine that is executable to cause performance of an iteration of the multiple iterations based on at least one of the indication of what instruction set is supported by the processor or an indication of what version of an instruction set is supported by the processor; and provide the processor with the selected version of the routine.

19. The the non-transitory machine-readable storage medium of claim 11, wherein:

each processor of the subset comprises multiple cores;

the reception of a quantity of currently available execution threads for each processor of the multiple processors comprises receiving a quantity of currently available execution threads for each core of each processor of the multiple processors; and the selection of the subset to perform the multiple iterations comprises a selection of at least one core of the multiple cores of each processor of the subset, wherein each selected core of each processor of the subset is caused to perform a separate iteration in which the multiple performances of nearest neighbor processing for an iteration is performed across the multiple execution threads of a single selected core.

20. The the non-transitory machine-readable storage medium of claim 11, wherein:

at least one of the observed spatial point dataset or the specification of the spatial process model comprises a specification of the region;

the specification of the region comprises at least one of a specification of a dimension of the region, a specification of a shape of the region, a specification of a location of the region, or a specification of a boundary of the region; and the derivation of the multiple quadrats is partially based on the specification of the region.

21. A computer-implemented method comprising:

receiving, by at least one processor of a processing system, and from a requesting device and via a network, a request to perform a test of goodness-of-fit of a spatial process model to an observed spatial point dataset;

retrieving, from at least one data source device, and via the network, the observed spatial point dataset and a specification of the spatial process model, wherein:

the observed spatial point dataset comprises indications of locations within a region at which instances of an event were observed to have occurred, and corresponding covariate values for each location; and the spatial process model is fitted to the observed spatial point dataset to serve as a model of a spatial point process that generated the observed spatial point dataset;

generating, by the at least one processor, and from at least the observed spatial point dataset, a KD tree wherein each node of the KD tree comprises one of the indications of a location at which an instance of the event was observed to have occurred and the corresponding covariate values;

deriving, by the at least one processor, and from at least the observed spatial point dataset, multiple quadrats into which the region is divided;

receiving, by the at least one processor, and from multiple processors, indications of current levels of availability of processing resources comprising a quantity of currently available execution threads for each processor of the multiple processors;

selecting, by the at least one processor, and based on at least the quantity of currently available execution threads for each processor of the multiple processors, a subset of the multiple processors to perform multiple iterations of a portion of the test in parallel, wherein each iteration comprises:

generating a simulated spatial point dataset of multiple simulated spatial point datasets; and using the simulated spatial point dataset with the KD tree in multiple performances of nearest neighbor processing across multiple execution threads of a single processor of the subset;

providing, from the at least one processor, and to each processor of the subset, the KD tree, the specification of the spatial process model, and an indication of the multiple quadrats to enable each processor of the subset to perform at least one iteration;

receiving, by the at least one processor, and from each processor of the subset, per-quadrat data portions indicative of results of the performance of at least a single iteration;

combining, by the at least one processor, the per-quadrat data portions received from each processor of the subset to derive at least one goodness-of-fit statistic indicative of a level of goodness-of-fit of the spatial process model to the observed spatial point dataset; and transmitting, from the at least one processor, an indication of the level of goodness-of-fit to the requesting device via the network.

22. The computer-implemented method of claim 21, comprising performing, by each processor of the subset, operations of an iteration comprising:

generating, from at least the KD tree and specification of the spatial process model, one of the simulated spatial point datasets of the multiple simulated spatial point datasets, wherein the one of the simulated spatial point datasets comprises indications of simulated locations within the region at which simulated instances of the event occurred, and corresponding simulated covariate values for each simulated location;

generating multiple copies of the KD tree;

providing a separate copy of the multiple copies of the KD tree to each available execution thread of the processor to prevent competition for access to the KD tree among the available execution threads of the processor; and on each available execution thread of the processor, and in parallel with others of the available execution threads of the processor, performing nearest neighbor processing between a simulated location of the one of the simulated spatial point datasets and the indications of locations of the separate copy of the KD tree provided to the available execution thread.

23. The computer-implemented method of claim 22, comprising generating, by each processor of the subset, the per-quadrat data portions indicative of the results of the performance of at least a single iteration.

24. The computer-implemented method of claim 22, comprising retaining, by each processor of the subset, at least one of the KD tree, the specification of the spatial process model or the indication of multiple quadrats to enable the processor to perform a next iteration without again receiving the at least one of the KD tree, the specification of the spatial process model or the indication of multiple quadrats.

25. The computer-implemented method of claim 24, wherein:

separate storage space is allocated to each available execution thread of the processor to separately store each one of the separate copies of the KD tree that is provided to each available execution thread; and each of the separate copies of the KD tree is retained in the corresponding storage space allocated to one of the available execution threads of the processor to enable use of each of the available execution threads of the processor to perform nearest neighbor processing operations of the next iteration without again being provided with a copy of the KD tree.

26. The computer-implemented method of claim 21, wherein the selection of the subset comprises prioritizing selecting processors of the multiple processors having a higher quantity of currently available execution threads.

27. The computer-implemented method of claim 21, wherein:

the indications of current levels of availability of processing resources further comprises an indication of an amount of separate storage space available to be allocated to each available execution thread for each processor of the multiple processors; and the selection of the subset is further based on the amount of separate storage space available to be allocated to each available execution thread for each processor of the multiple processors.

28. The computer-implemented method of claim 21, wherein:

the indications of current levels of availability of processing resources further comprises at least one of an indication of what instruction set is supported by each processor of the multiple processors, or an indication of what version of an instruction set is supported by each processor of the multiple processors; and the method comprises, for each processor of the subset, performing, by the at least one processor, operations comprising:

selecting a version of a routine that is executable to cause performance of an iteration of the multiple iterations based on at least one of the indication of what instruction set is supported by the processor or an indication of what version of an instruction set is supported by the processor; and providing the processor with the selected version of the routine.

29. The computer-implemented method of claim 21, wherein:

each processor of the subset comprises multiple cores;

receiving a quantity of currently available execution threads for each processor of the multiple processors comprises receiving a quantity of currently available execution threads for each core of each processor of the multiple processors; and selecting the subset to perform the multiple iterations comprises selecting at least one core of the multiple cores of each processor of the subset, wherein each selected core of each processor of the subset is caused to perform a separate iteration in which the multiple performances of nearest neighbor processing for an iteration is performed across the multiple execution threads of a single selected core.

30. The computer-implemented method of claim 21, wherein:

at least one of the observed spatial point dataset or the specification of the spatial process model comprises a specification of the region;

the specification of the region comprises at least one of a specification of a dimension of the region, a specification of a shape of the region, a specification of a location of the region, or a specification of a boundary of the region; and the derivation of the multiple quadrats is partially based on the specification of the region.

* * * * *